United States Patent
Nishida

(10) Patent No.: US 10,903,164 B2
(45) Date of Patent: Jan. 26, 2021

(54) BONDED ASSEMBLY INCLUDING A SEMICONDUCTOR-ON-INSULATOR DIE AND METHODS FOR MAKING THE SAME

(71) Applicant: SANDISK TECHNOLOGIES LLC, Addison, TX (US)

(72) Inventor: Akio Nishida, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/884,326

(22) Filed: May 27, 2020

(65) Prior Publication Data

US 2020/0294918 A1    Sep. 17, 2020

Related U.S. Application Data

(62) Division of application No. 16/278,372, filed on Feb. 18, 2019.

(51) Int. Cl.
*H01L 23/528*    (2006.01)
*H01L 27/11573*    (2017.01)
(Continued)

(52) U.S. Cl.
CPC .... *H01L 23/5283* (2013.01); *H01L 21/76251* (2013.01); *H01L 21/76831* (2013.01); *H01L 21/8221* (2013.01); *H01L 23/5226* (2013.01); *H01L 23/5383* (2013.01); *H01L 23/5384* (2013.01); *H01L 23/5386* (2013.01); *H01L 24/09* (2013.01); *H01L 24/16* (2013.01);
(Continued)

(58) Field of Classification Search
CPC ............. H01L 21/8221; H01L 23/5226; H01L 23/5283; H01L 23/5383; H01L 23/5384; H01L 23/5386; H01L 27/1157; H01L 27/11578
USPC ......................................... 257/698, 700, 758
See application file for complete search history.

(56) References Cited

U.S. PATENT DOCUMENTS 5,915,167 A    6/1999    Leedy
6,117,769 A    9/2000    Nogami et al.
(Continued)

OTHER PUBLICATIONS

Endoh et al., "Novel Ultra High Density Memory with a Stacked-Surrounding Gate Transistor (S-SGT) Structured Cell," IEDM Proc. (2001) 33-36.

(Continued)

*Primary Examiner* — Matthew E Warren
(74) *Attorney, Agent, or Firm* — The Marbury Law Group, PLLC

(57) ABSTRACT

A first semiconductor die is provided, which includes a first substrate, first semiconductor devices, first interconnect-level dielectric material layers, first metal interconnect structures, and first bonding pads. A second semiconductor die is provided, which includes a semiconductor-on-insulator (SOI) substrate, second semiconductor devices, second interconnect-level dielectric material layers, second metal interconnect structures, and second bonding pads. The second bonding pads are bonded to the first bonding pads. A bulk substrate layer of the SOI substrate is removed exposing an insulating material layer of the SOI substrate, which may be retained or also removed. An external bonding pad is electrically connected to a node of the second semiconductor devices.

5 Claims, 41 Drawing Sheets

(51) Int. Cl.

| | |
|---|---|
| *H01L 23/538* | (2006.01) |
| *H01L 23/522* | (2006.01) |
| *H01L 27/1157* | (2017.01) |
| *H01L 27/11578* | (2017.01) |
| *H01L 21/822* | (2006.01) |
| *H01L 23/00* | (2006.01) |
| *H01L 21/762* | (2006.01) |
| *H01L 21/768* | (2006.01) |
| *H01L 27/11565* | (2017.01) |
| *H01L 27/11582* | (2017.01) |
| *H01L 25/18* | (2006.01) |
| H01L 27/11526 | (2017.01) |
| H01L 27/11524 | (2017.01) |
| H01L 27/11519 | (2017.01) |
| H01L 27/11556 | (2017.01) |

(52) U.S. Cl.
CPC ............ *H01L 24/45* (2013.01); *H01L 24/73* (2013.01); *H01L 25/18* (2013.01); *H01L 27/1157* (2013.01); *H01L 27/11565* (2013.01); *H01L 27/11573* (2013.01); *H01L 27/11578* (2013.01); *H01L 27/11582* (2013.01); *H01L 27/11519* (2013.01); *H01L 27/11524* (2013.01); *H01L 27/11526* (2013.01); *H01L 27/11556* (2013.01); *H01L 2224/73207* (2013.01)

(56) References Cited

U.S. PATENT DOCUMENTS

| | | | | |
|---|---|---|---|---|
| 8,421,082 | B1* | 4/2013 | Yang | B81B 7/0038 257/69 |
| 8,501,587 | B2* | 8/2013 | Chen | H01L 23/49827 438/459 |
| 9,847,255 | B2 | 12/2017 | Lin et al. | |
| 9,917,030 | B2* | 3/2018 | Ge | H01L 23/481 |
| 2007/0267723 | A1 | 11/2007 | Bernstein et al. | |
| 2011/0248396 | A1 | 10/2011 | Liu et al. | |
| 2013/0294184 | A1 | 11/2013 | Yang et al. | |
| 2014/0063990 | A1 | 3/2014 | Ku et al. | |
| 2016/0020235 | A1 | 1/2016 | Yamashita | |
| 2016/0093591 | A1* | 3/2016 | Lan | H01L 21/8221 257/506 |
| 2016/0099228 | A1 | 4/2016 | Franca-Neto | |
| 2017/0110420 | A1* | 4/2017 | Cheng | H01L 21/76898 |
| 2017/0148765 | A1 | 5/2017 | Yu et al. | |
| 2017/0179026 | A1 | 6/2017 | Toyama et al. | |
| 2017/0194248 | A1 | 7/2017 | Das | |
| 2017/0294392 | A1* | 10/2017 | Li | H01L 21/823437 |
| 2018/0175008 | A1 | 6/2018 | Fong et al. | |
| 2020/0006371 | A1 | 1/2020 | Huo et al. | |
| 2020/0243455 | A1* | 7/2020 | Wang | H01L 21/76841 |

OTHER PUBLICATIONS

Notification of Transmittal of the International Search Report and Written Opinion of the International Search Authority for International Patent Application No. PCT/US2019/063948, dated Mar. 23, 2020, 11 pages.
U.S. Appl. No. 15/873,101, filed Jan. 17, 2018, Sandisk Technologies LLC.
U.S. Appl. No. 15/892,648, filed Feb. 9, 2018, Sandisk Technologies LLC.
U.S. Appl. No. 15/928,340, filed Mar. 22, 2018, Sandisk Technologies LLC.
U.S. Appl. No. 15/928,407, filed Mar. 22, 2018, Sandisk Technologies LLC.
U.S. Appl. No. 15/960,267, filed Apr. 23, 2018, Sandisk Technologies LLC.
U.S. Appl. No. 15/979,885, filed May 15, 2018, Sandisk Technologies LLC.
U.S. Appl. No. 16/231,752, filed Dec. 24, 2018, Sandisk Technologies LLC.
U.S. Appl. No. 16/241,171, filed Jan. 7, 2019, Sandisk Technologies LLC.
U.S. Appl. No. 16/241,221, filed Jan. 7, 2019, Sandisk Technologies LLC.
U.S. Appl. No. 16/242,216, filed Jan. 8, 2019, Sandisk Technologies LLC.
U.S. Appl. No. 16/243,469, filed Jan. 9, 2019, Sandisk Technologies LLC.
U.S. Appl. No. 16/248,923, filed Jan. 16, 2019, Sandisk Technologies LLC.
U.S. Appl. No. 16/251,782, filed Jan. 18, 2019, Sandisk Technologies LLC.
U.S. Appl. No. 16/251,954, filed Jan. 18, 2019, Sandisk Technologies LLC.
U.S. Appl. No. 16/255,413, filed Jan. 23, 2019, Sandisk Technologies LLC.
U.S. Appl. No. 16/261,869, filed Jan. 30, 2019, Sandisk Technologies LLC.
U.S. Appl. No. 16/263,058, filed Jan. 31, 2019, Sandisk Technologies LLC.
U.S. Appl. No. 16/263,086, filed Jan. 31, 2019, Sandisk Technologies LLC.
U.S. Appl. No. 16/269,301, filed Feb. 6, 2019, Sandisk Technologies LLC.
U.S. Appl. No. 16/274,687, filed Feb. 13, 2019, Sandisk Technologies LLC.
U.S. Appl. No. 62/720,327, filed Aug. 21, 2018, Sandisk Technologies LLC.

* cited by examiner

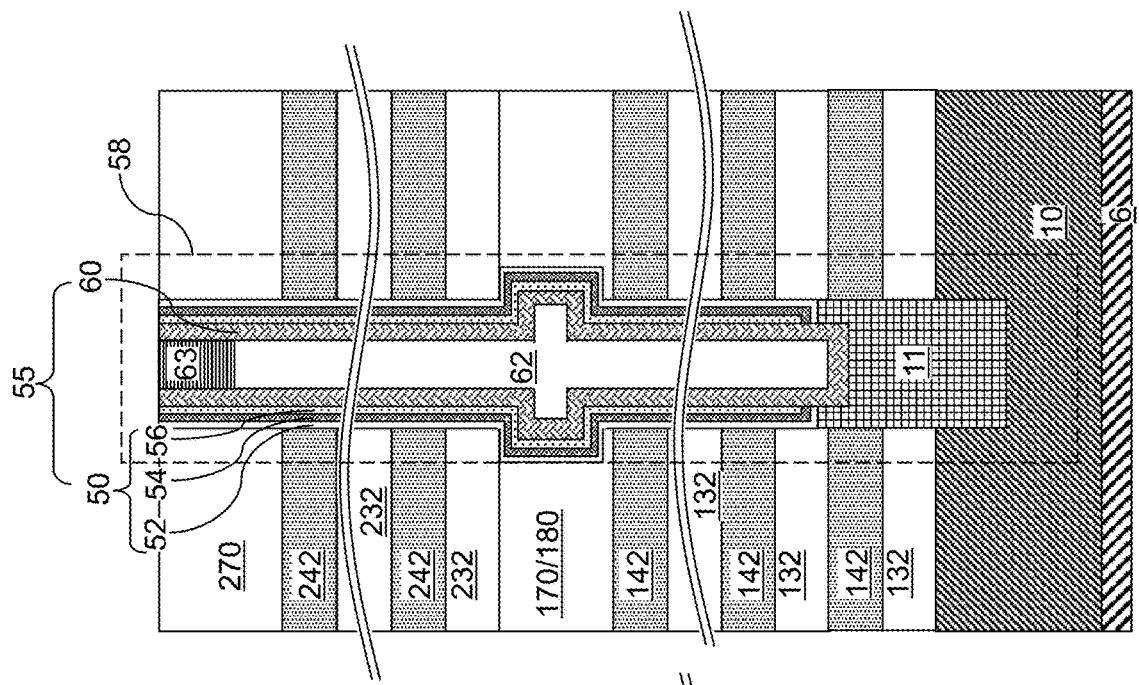
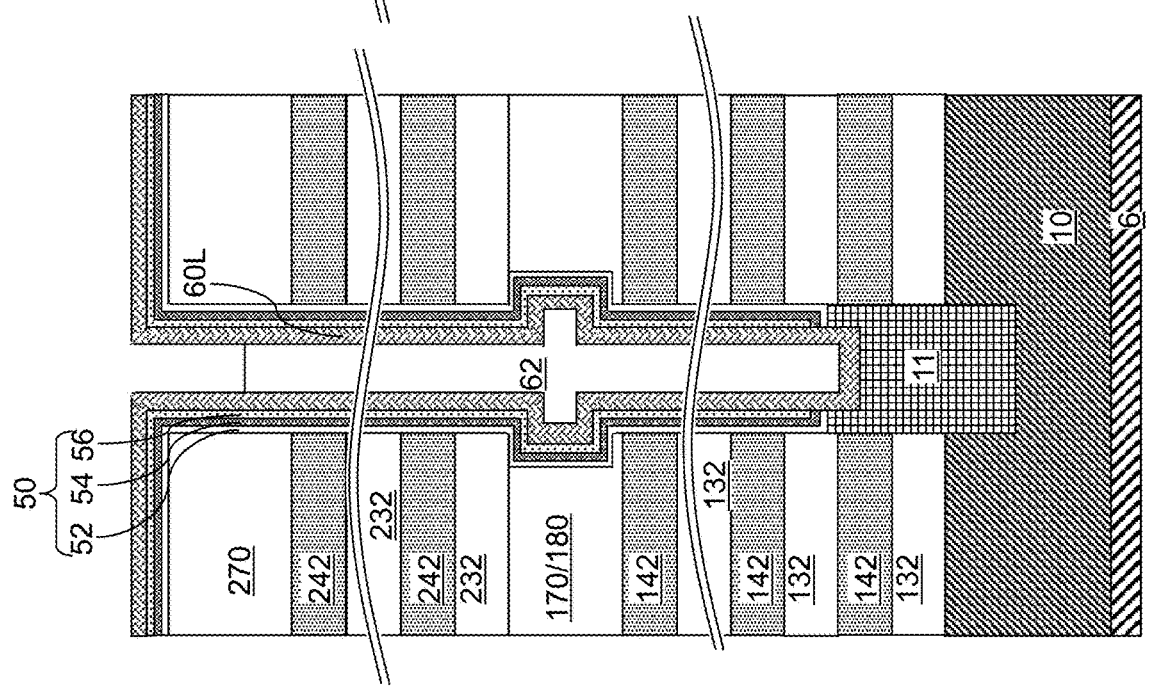
FIG. 9D
FIG. 9C

BONDED ASSEMBLY INCLUDING A SEMICONDUCTOR-ON-INSULATOR DIE AND METHODS FOR MAKING THE SAME

FIELD

The present disclosure relates generally to the field of semiconductor devices, and particular to methods for forming a bonded assembly using a semiconductor-on-insulator die and bonded assemblies formed by the same.

BACKGROUND

A three-dimensional memory device including three-dimensional vertical NAND strings having one bit per cell is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a method of forming a bonded assembly is provided, which comprises: providing a first semiconductor die including a first substrate, first semiconductor devices, first interconnect-level dielectric material layers, first metal interconnect structures embedded in the first interconnect-level dielectric material layers, and first bonding pads located on the first interconnect-level dielectric material layers and connected to a respective node of the first semiconductor devices through a respective subset of the first metal interconnect structures; providing a second semiconductor die including a semiconductor-on-insulator (SOI) substrate, second semiconductor devices located on a semiconductor material layer of the SOI substrate, second interconnect-level dielectric material layers, second metal interconnect structures embedded in the second interconnect-level dielectric material layers, and second bonding pads located on the second interconnect-level dielectric material layers and connected to a respective node of the second semiconductor devices through a respective subset of the second metal interconnect structures; bonding the second bonding pads to the first bonding pads; removing a bulk substrate layer of the SOI substrate, wherein an insulating material layer of the SOI substrate is physically exposed; and forming an external bonding pad electrically connected to a node of the second semiconductor devices. In one embodiment, the second semiconductor devices may be located on an insulating surface of a remaining portion of the second semiconductor die that is spaced from an interface between the first semiconductor die and the remaining portion of the second semiconductor die by the second semiconductor devices.

According to another embodiment of the present disclosure, a bonded assembly is provided, which comprises: a first semiconductor die including a first substrate, first semiconductor devices, first interconnect-level dielectric material layers, first metal interconnect structures embedded in the first interconnect-level dielectric material layers, and first bonding pads located on the first interconnect-level dielectric material layers and connected to a respective node of the first semiconductor devices through a respective subset of the first metal interconnect structures; a second semiconductor die including second semiconductor devices located on a first side of a semiconductor material layer, an insulating material layer located on a second side of the semiconductor material layer, second interconnect-level dielectric material layers located on a first side of the second semiconductor devices, second metal interconnect structures embedded in the second interconnect-level dielectric material layers, and second bonding pads located on the second interconnect-level dielectric material layers, connected to a respective node of the second semiconductor devices through a respective subset of the second metal interconnect structures, and bonded to a respective one of the first bonding pads; a conductive connection via structure extending through the insulating material layer, the semiconductor material layer, and a portion of the second interconnect-level dielectric material layers and contacting an etch-stop metal plate embedded in the second interconnect-level dielectric material layers; and an external bonding pad electrically connected to the conductive connection via structure and located over the insulating material layer.

BRIEF DESCRIPTION OF THE DRAWINGS

FIGS. 9A-9D illustrate sequential vertical cross-sectional views of a memory opening during formation of a memory opening fill structure according to the first embodiment of the present disclosure.

DETAILED DESCRIPTION

Figure 1:
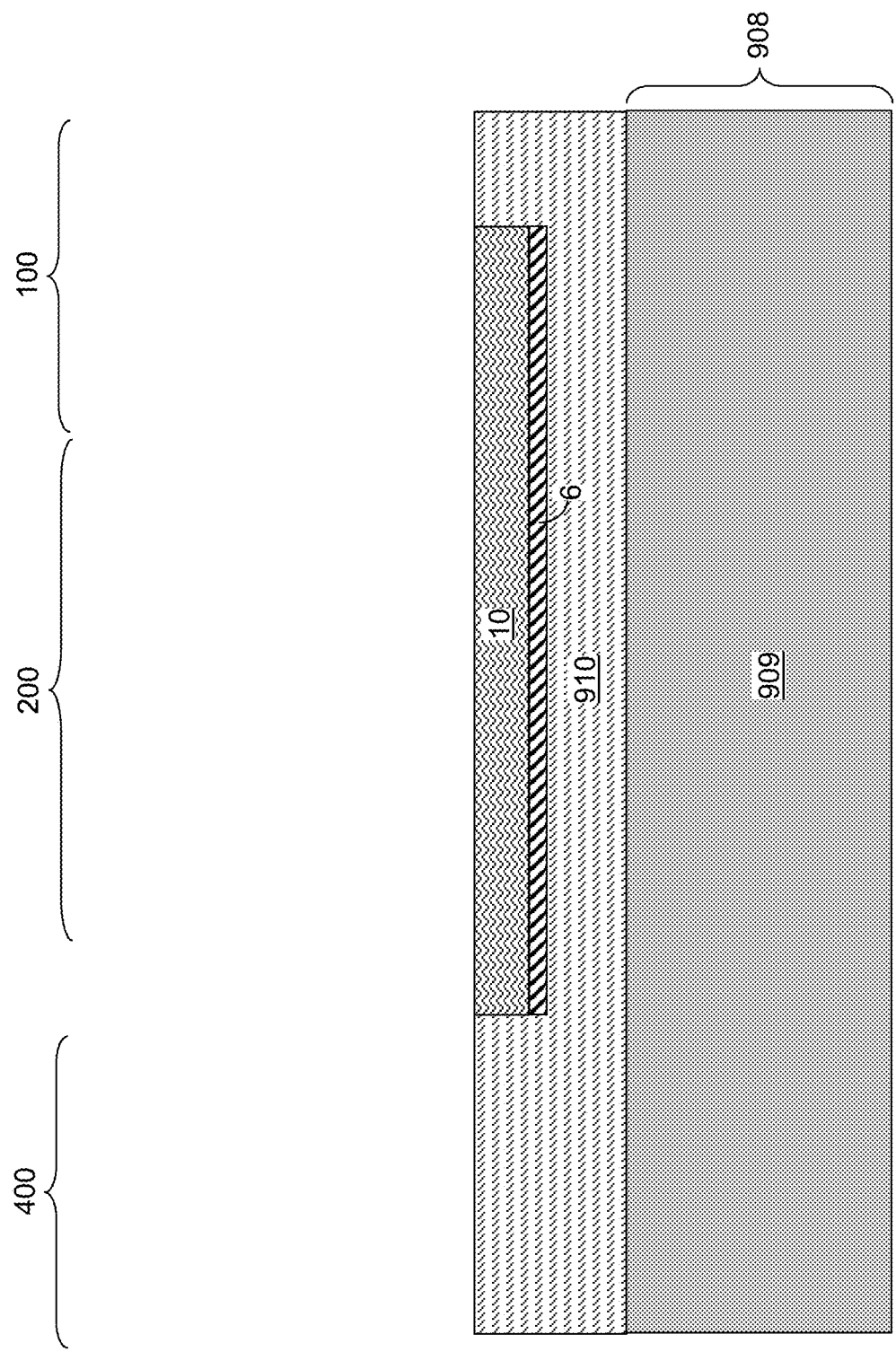
FIG. 1 is a vertical cross-sectional view of an exemplary structure after formation of a source-side dielectric material layer and a doped semiconductor layer on a semiconductor substrate according to a first embodiment of the present disclosure.

A three-dimensional memory device includes a three-dimensional array of memory elements and a peripheral circuitry configured to control operation of the three-dimensional array of memory elements. Incorporation of the peripheral circuitry on a same die as the three-dimensional array of memory elements has the adverse effect of degradation of performance of the CMOS devices in the peripheral circuitry due to high temperature processes used to form the three-dimensional array of memory elements. The performance of a three-dimensional memory device may be enhanced by bonding a memory die to a support die including a peripheral circuitry. The embodiments of the present disclosure provide methods for forming the peripheral circuitry on semiconductor-on-insulator (SOI) substrate, such as a silicon-on-insulator substrate, bonding the support die containing the SOI substrate and the peripheral circuitry to a memory die containing a memory device, and removing the bulk substrate of the SOI substrate to expose the back of the peripheral circuitry for external electrical connections, the various aspects of which are described herein in detail. A scalable method for bonding multiple memory die to a support die is provided. In another embodiment, a CMOS based device, such as a SRAM memory device is formed on the SOI substrate and is bonded to a support die that is formed on an SOI or a non-SOI substrate, followed by removal of the bulk substrate of the SOI substrate.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are used merely to identify similar elements, and different ordinals may be used across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element may be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many external commands as the total number of planes therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIG. 1, a first exemplary structure according to a first embodiment of the present disclosure is illustrated, which includes an in-process memory die. As used herein, a memory die is a semiconductor die including an array of memory elements. As such, an in-process memory ide is a structure that is subsequently modified to form a memory die.

The first exemplary structure includes a first substrate 908, which includes a semiconductor substrate layer 909. The first substrate 908 may comprise a commercially available semiconductor wafer such as a single crystalline silicon wafer. A source-side dielectric material layer 910 is formed over the semiconductor substrate layer 909. The source-side dielectric material layer 910 includes a dielectric material such as silicon oxide. The maximum thickness of the source-side dielectric material layer 910 may be in a range from 200 nm to 3,000 nm, although lesser and greater thicknesses may also be used.

An optional metallic plate layer 6 and a source semiconductor layer 10 may be may be formed in the source-side dielectric material layer 910. The optional metallic plate layer 6, if present, provides a high conductivity conduction path for electrical current that flows into, along, and/or out of, the source semiconductor layer 10. The optional metallic plate layer 6 includes a conductive material such as a metal or a heavily doped semiconductor material. The optional metallic plate layer 6, for example, may include a tungsten layer having a thickness in a range from 3 nm to 100 nm, although lesser and greater thicknesses may also be used. A metal nitride layer (not shown) may be provided as a diffusion barrier layer on top of the metallic plate layer 6. The metallic plate layer 6 may function as a component of a source line in a completed die. The thickness of the metallic plate layer 6 may be in a range from 20 nm to 200 nm, although lesser and greater thicknesses may also be used.

The source semiconductor layer 10 is a doped semiconductor layer having a doping of the opposite conductivity type of the conductivity type of vertical semiconductor channels to be subsequently formed. For example, if vertical semiconductor channels to be subsequently formed have a doping of a first conductivity type, the source semiconductor layer 10 may have a doping of a second conductivity type that is the opposite of the first conductivity type. For example, if the first conductivity type is p-type, the second conductivity type is n-type, and vice versa. The atomic concentration of second conductivity type dopants in the source semiconductor layer 10 may be in a range from $5.0 \times 10^{19}/cm^3$ to $2.0 \times 10^{21}/cm^3$, although lesser and greater atomic concentrations may also be used. The thickness of the source semiconductor layer 10 may be in a range from 100 nm to 600 nm, although lesser and greater thicknesses may also be used.

The source semiconductor layer 10 and the metallic plate layer 6 may be patterned such that the source semiconductor layer 10 and the metallic plate layer 6 extend over at least a portion of a memory array region 100 in which memory stack structures are to be subsequently formed and over a staircase region 200 in which stepped surfaces of electrically conductive layers embodying word lines are to be subsequently formed. A via interconnection region 400 may be provided around the memory array region 100 and the staircase region 200. In one embodiment, the top surface of the source semiconductor layer 10 may be coplanar with the top surface of the source-side dielectric material layer 910.

Figure 2:
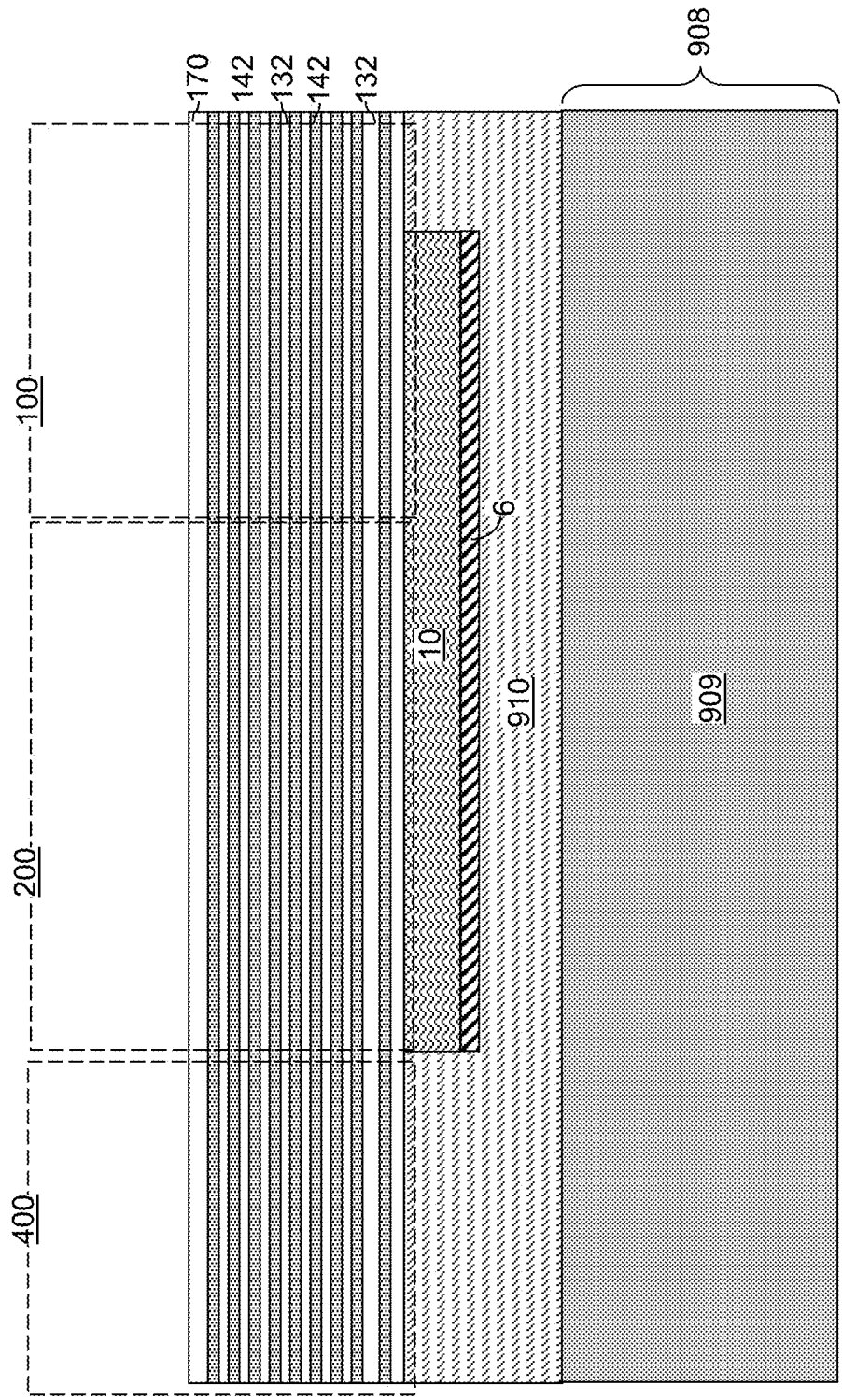
FIG. 2 is a vertical cross-sectional view of the exemplary structure after formation of a first-tier alternating stack of first insulating layers and first spacer material layers according to the first embodiment of the present disclosure.

Referring to FIG. 2, an alternating stack of first material layers and second material layers is subsequently formed. Each first material layer may include a first material, and each second material layer may include a second material that is different from the first material. In case at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the source semiconductor layer 10. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material. Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The first sacrificial material layers 142 may comprise an insulating material, a semiconductor material, or a conductive material. The second material of the first sacrificial material layers 142 may be subsequently replaced with electrically conductive electrodes which may function, for example, as control gate electrodes of a vertical NAND device. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 is subsequently formed over the first alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
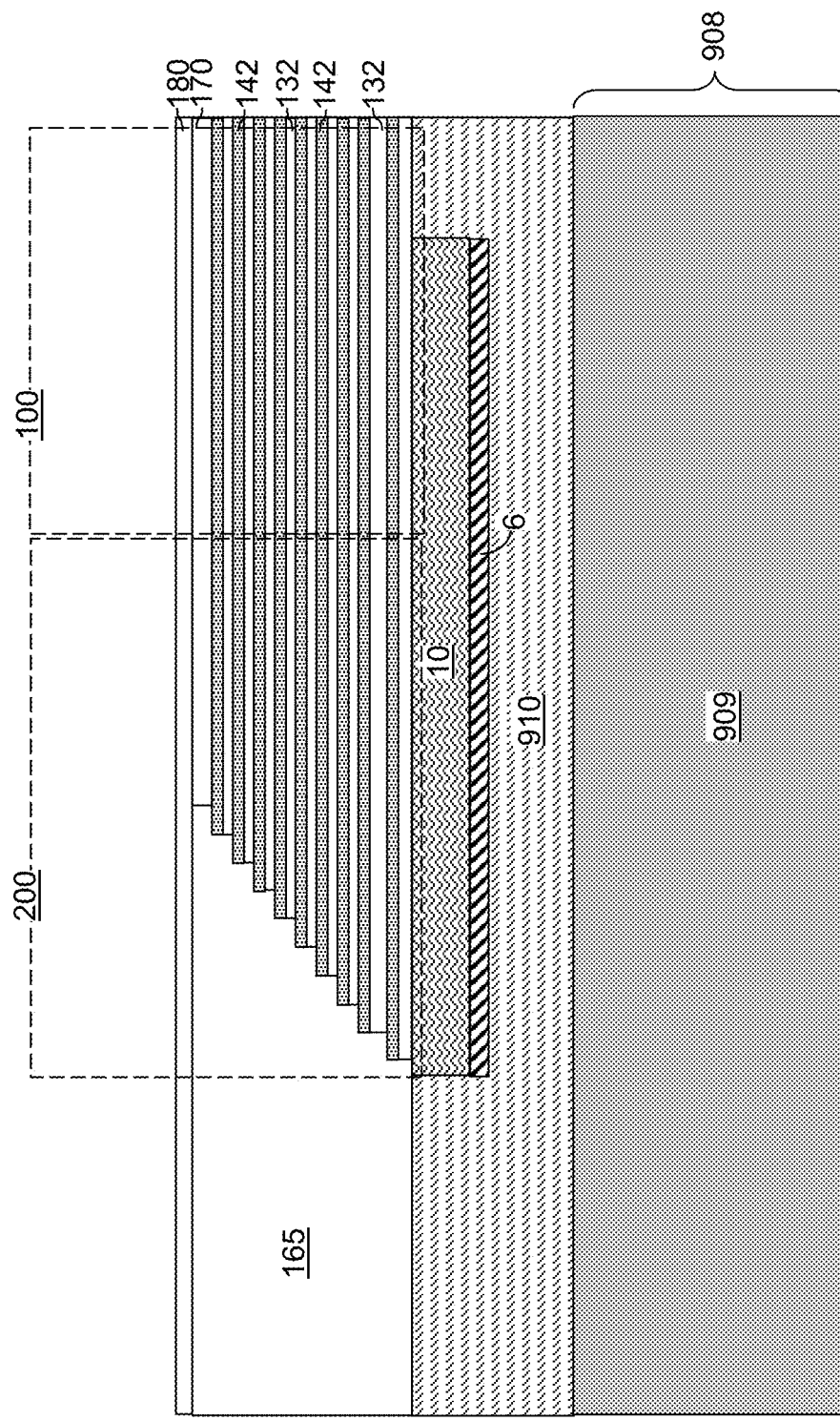
FIG. 3 is a vertical cross-sectional view of the exemplary structure after patterning a first-tier staircase region, a first stepped dielectric material portion, and an inter-tier dielectric layer according to the first embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which first stepped surfaces are formed, and a second stepped area in which additional stepped surfaces are to be subsequently formed in a second-tier structure (to be subsequently formed over a first-tier structure) and/or additional tier structures. The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first stepped dielectric material portion 165. As used herein, a "stepped" element refers to an element that has stepped surfaces and a horizontal cross-sectional area that increases monotonically as a function of a vertical distance from a top surface of a substrate on which the element is present. The first-tier alternating stack (132, 142) and the first stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
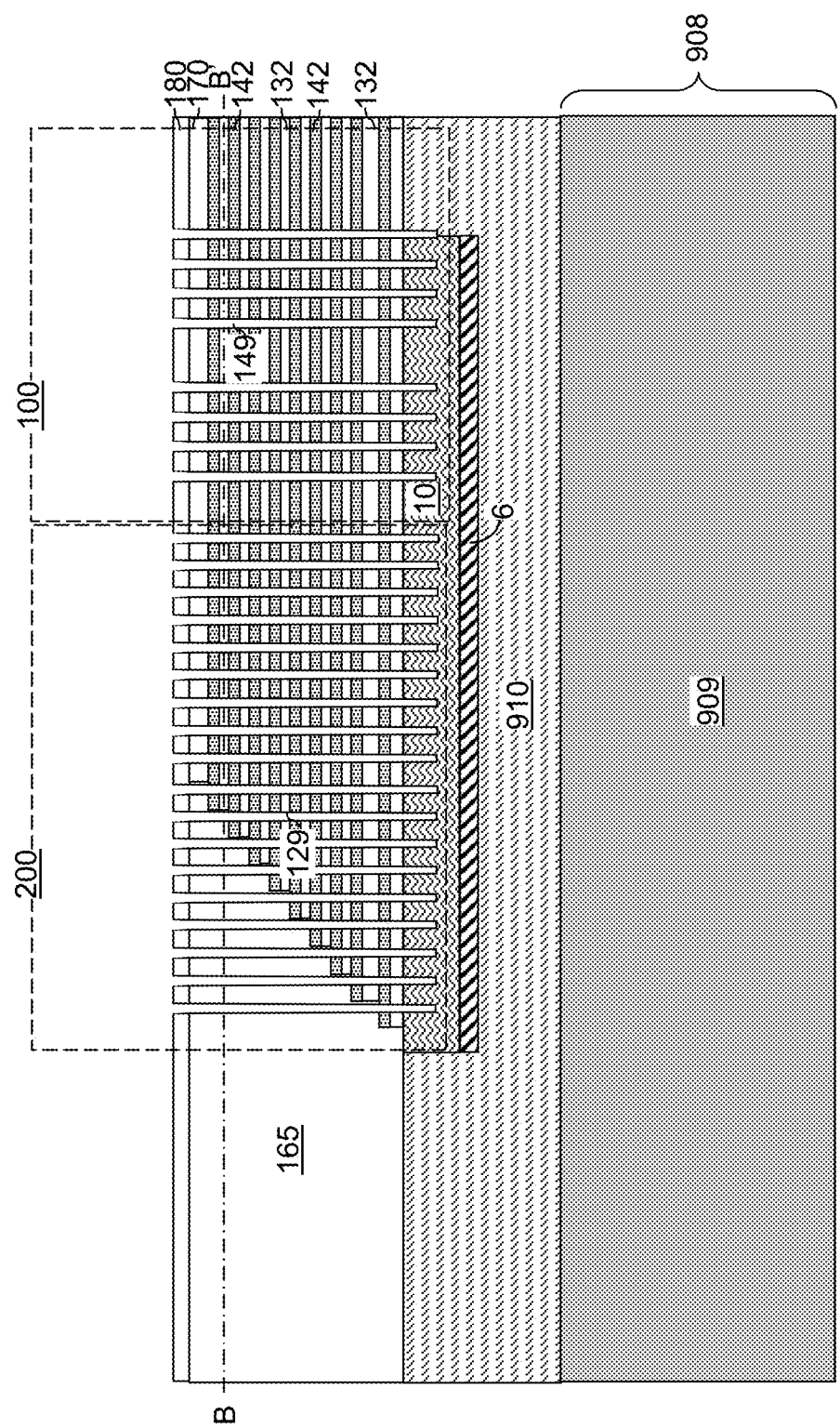
FIG. 4A is a vertical cross-sectional view of the exemplary structure after formation of first-tier memory openings and first-tier support openings according to the first embodiment of the present disclosure.
Figure 4B:
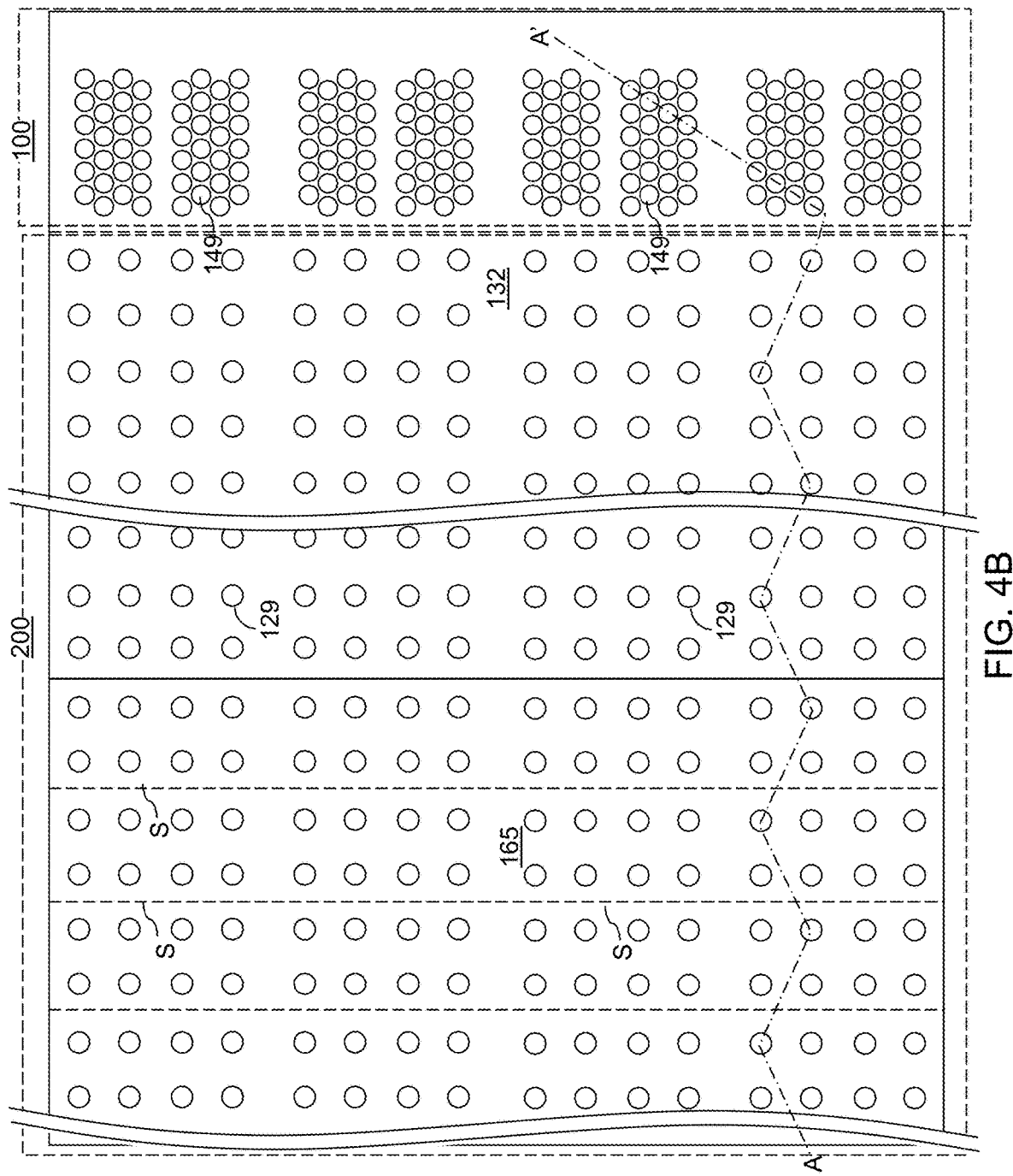
FIG. 4B is a horizontal cross-sectional view of the exemplary structure of FIG. 4A. The hinged vertical plane A-A' corresponds to the plane of the vertical cross-sectional view of FIG. 4A.

Referring to FIGS. 4A and 4B, various first-tier openings (149, 129) may be formed through the inter-tier dielectric layer 180 and the first-tier structure (132, 142, 170, 165) and into the source semiconductor layer 10. A photoresist layer (not shown) may be applied over the inter-tier dielectric layer 180, and may be lithographically patterned to form various openings therethrough. The pattern of openings in the photoresist layer may be transferred through the inter-tier dielectric layer 180 and the first-tier structure (132, 142, 170, 165) and into the source semiconductor layer 10 by a first anisotropic etch process to form the various first-tier openings (149, 129) concurrently, i.e., during the first isotropic etch process. The various first-tier openings (149, 129) may include first-tier memory openings 149 and first-tier support openings 129. Locations of steps S in the first alternating stack (132, 142) are illustrated as dotted lines in FIG. 4B.

The first-tier memory openings 149 are openings that are formed in the memory array region 100 through each layer within the first alternating stack (132, 142) and are subsequently used to form memory stack structures therein. The first-tier memory openings 149 may be formed in clusters of first-tier memory openings 149 that are laterally spaced apart along the second horizontal direction hd2. Each cluster of first-tier memory openings 149 may be formed as a two-dimensional array of first-tier memory openings 149.

The first-tier support openings 129 are openings that are formed in the staircase region 200. A subset of the first-tier support openings 129 that is formed through the first stepped dielectric material portion 165 may be formed through a respective horizontal surface of the first stepped surfaces.

In one embodiment, the first anisotropic etch process may include an initial step in which the materials of the first-tier alternating stack (132, 142) are etched concurrently with the material of the first stepped dielectric material portion 165. The chemistry of the initial etch step may alternate to optimize etching of the first and second materials in the first-tier alternating stack (132, 142) while providing a comparable average etch rate to the material of the first stepped dielectric material portion 165. The first anisotropic etch process may use, for example, a series of reactive ion etch processes or a single reaction etch process (e.g., $CF_4$/$O_2$/Ar etch). The sidewalls of the various first-tier openings (149, 129) may be substantially vertical, or may be tapered. In one embodiment, the terminal portion of the anisotropic etch process may include an overetch step that etches into an upper portion of the source semiconductor layer 10. The photoresist layer may be subsequently removed, for example, by ashing.

Optionally, the portions of the first-tier memory openings 149 and the first-tier support openings 129 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

Figure 5:
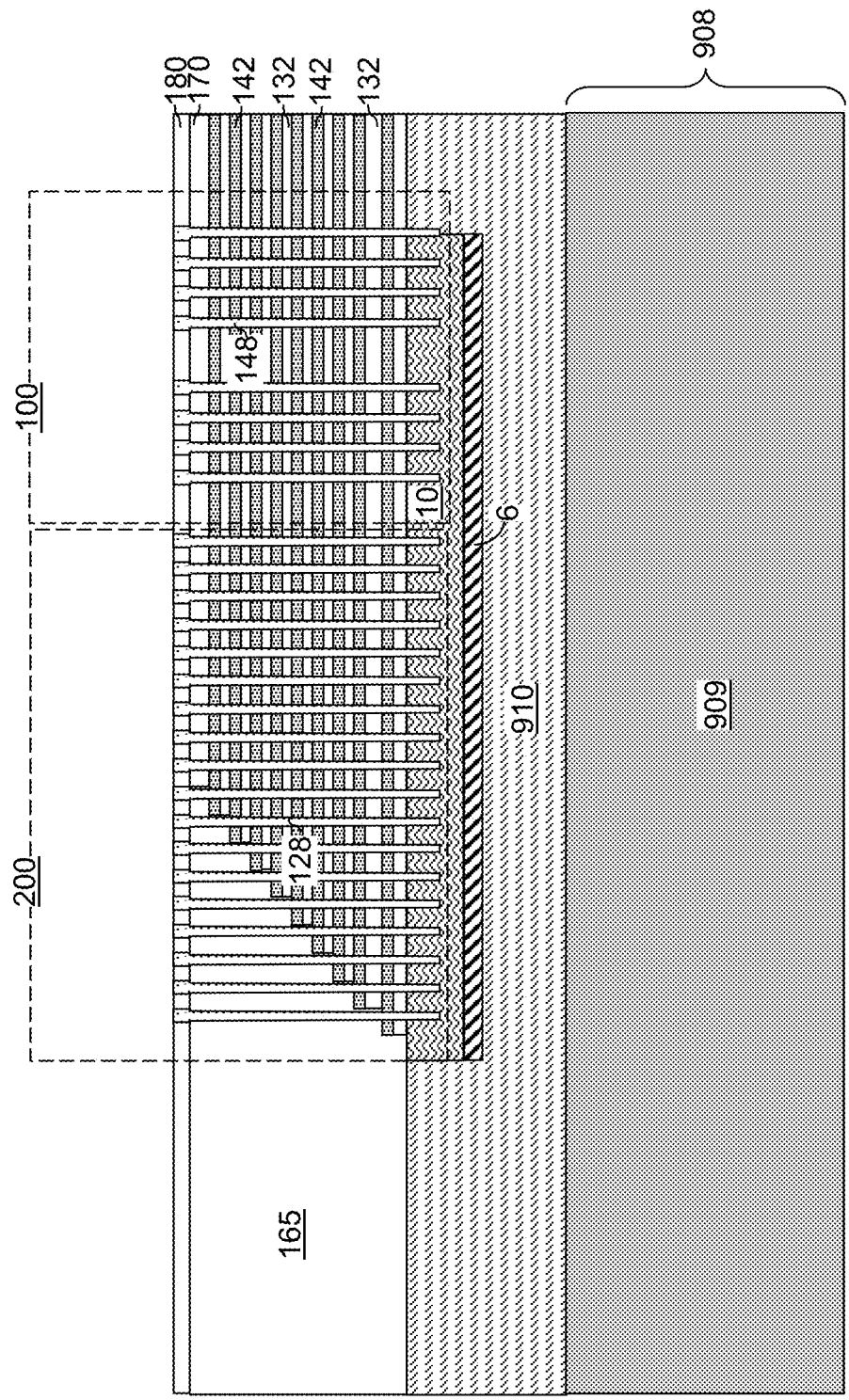
FIG. 5 is a vertical cross-sectional view of the exemplary structure after formation of various sacrificial fill structures according to the first embodiment of the present disclosure.

Referring to FIG. 5, sacrificial first-tier opening fill portions (148, 128) may be formed in the various first-tier openings (149, 129). For example, a sacrificial first-tier fill material is deposited concurrently deposited in each of the first-tier openings (149, 129). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetra-ethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first alternating stack (132, 142) (such as from above the top surface of the inter-tier dielectric layer 180). The top surfaces of the sacrificial first-tier opening fill portions (148, 128) may be coplanar with the top surface of the inter-tier dielectric layer 180. Each of the sacrificial first-tier opening fill portions (148, 128) may, or may not, include cavities therein.

Figure 6:
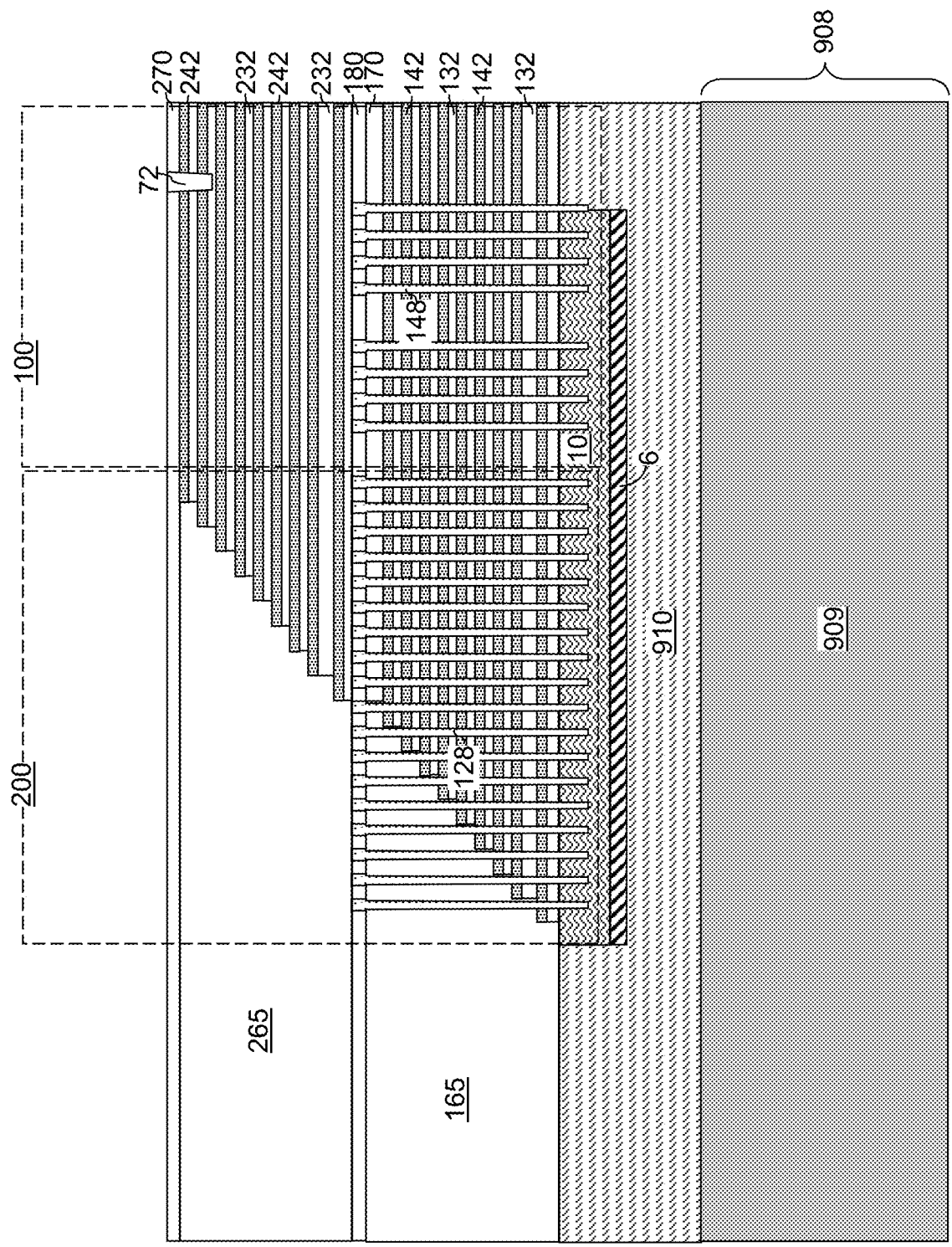
FIG. 6 is a vertical cross-sectional view of the exemplary structure after formation of a second-tier alternating stack of second insulating layers and second spacer material layers, second stepped surfaces, and a second stepped dielectric material portion according to the first embodiment of the present disclosure.

Referring to FIG. 6, a second-tier structure may be formed over the first-tier structure (132, 142, 170, 148). The second-tier structure may include an additional alternating stack of insulating layers and spacer material layers, which may be sacrificial material layers. For example, a second alternating stack (232, 242) of material layers may be subsequently formed on the top surface of the first alternating stack (132, 142). The second alternating stack (232, 242) may include an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. The second sacrificial material layers 242 may comprise an insulating material, a semiconductor material, or a conductive material. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second stepped dielectric material portion 265 may be formed over the second stepped surfaces in the staircase region 200.

A second insulating cap layer 270 may be subsequently formed over the second alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the source semiconductor layer 10, and at least one stepped dielectric material portion (165, 265) may be formed over the staircase regions on the at least one alternating stack (132, 142, 232, 242).

Optionally, drain-select-level isolation structures 72 may be formed through a subset of layers in an upper portion of the second-tier alternating stack (232, 242). The second sacrificial material layers 242 that are cut by the drain-select-level isolation structures 72 correspond to the levels in which drain-select-level electrically conductive layers are subsequently formed. The drain-select-level isolation structures 72 include a dielectric material such as silicon oxide. The drain-select-level isolation structures 72 may laterally extend along a first horizontal direction hd1, and may be laterally spaced apart along a second horizontal direction hd2 that is perpendicular to the first horizontal direction hd1. The combination of the second alternating stack (232, 242), the second stepped dielectric material portion 265, the second insulating cap layer 270, and the optional drain-select-level isolation structures 72 collectively constitute a second-tier structure (232, 242, 265, 270, 72).

Figure 7A:
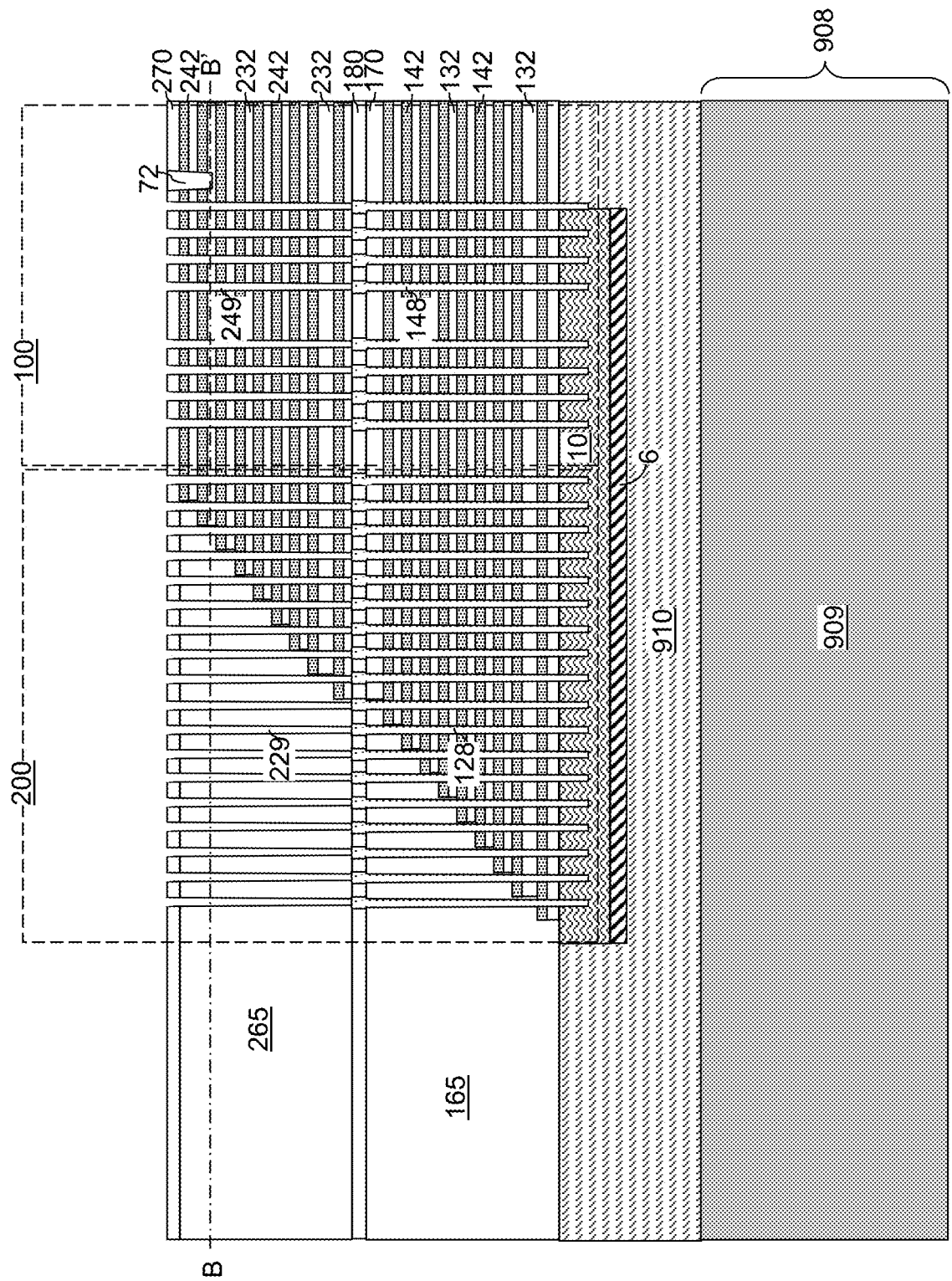
FIG. 7A is a vertical cross-sectional view of the exemplary structure after formation of second-tier memory openings and second-tier support openings according to the first embodiment of the present disclosure.
Figure 7B:
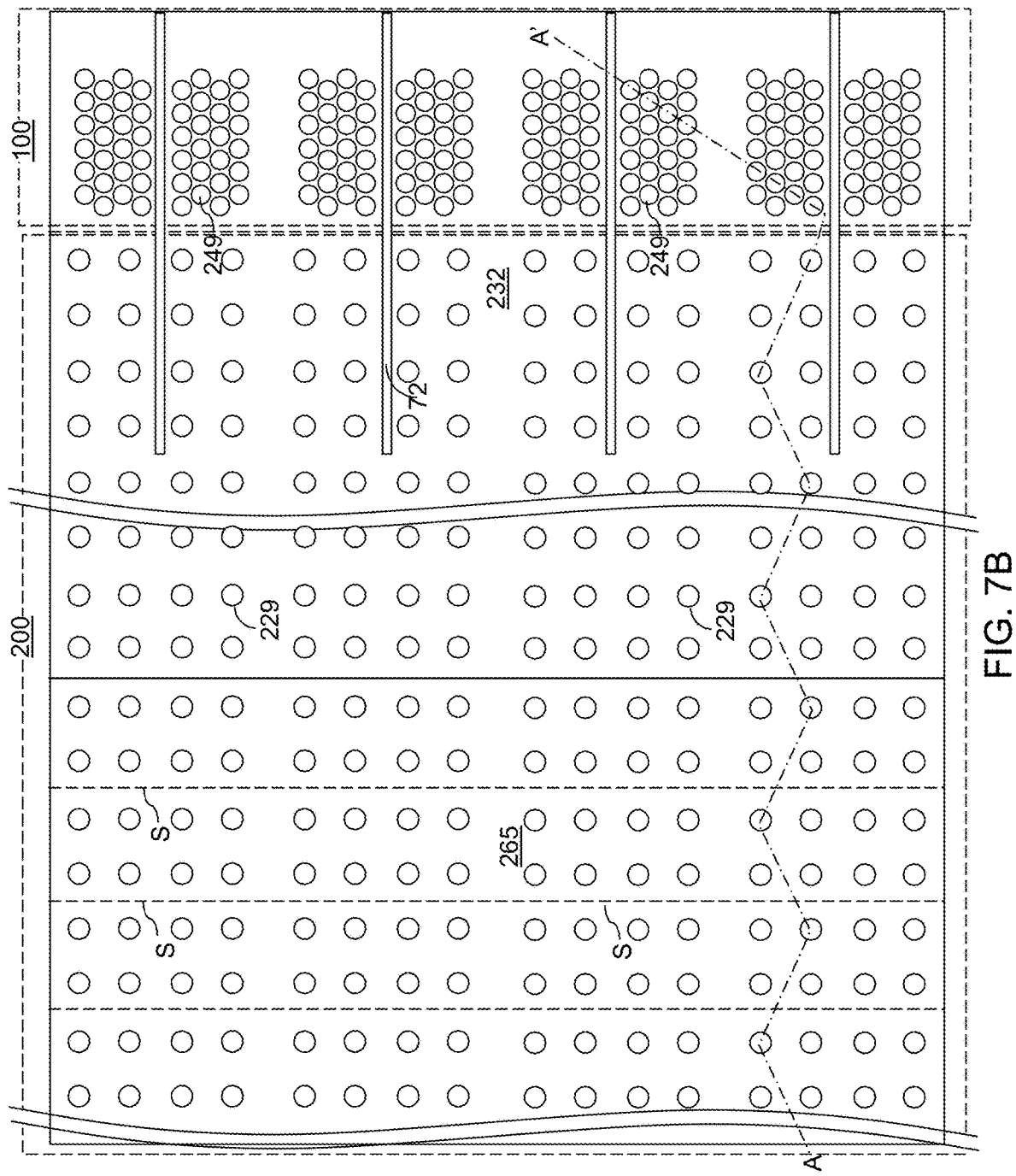
FIG. 7B is a horizontal cross-sectional of the exemplary structure along the horizontal plane B-B' of FIG. 7A. The hinged vertical plane A-A' corresponds to the plane of the vertical cross-sectional view of FIG. 7A.

Referring to FIGS. 7A and 7B, various second-tier openings (249, 229) may be formed through the second-tier structure (232, 242, 265, 270, 72). A photoresist layer (not shown) may be applied over the second insulating cap layer 270, and may be lithographically patterned to form various openings therethrough. The pattern of the openings may be the same as the pattern of the various first-tier openings (149, 129), which is the same as the sacrificial first-tier opening fill portions (148, 128). Thus, the lithographic mask used to pattern the first-tier openings (149, 129) may be used to pattern the photoresist layer.

The pattern of openings in the photoresist layer may be transferred through the second-tier structure (232, 242, 265, 270, 72) by a second anisotropic etch process to form various second-tier openings (249, 229) concurrently, i.e., during the second anisotropic etch process. The various second-tier openings (249, 229) may include second-tier memory openings 249 and second-tier support openings 229.

The second-tier memory openings 249 are formed directly on a top surface of a respective one of the sacrificial first-tier memory opening fill portions 148. The second-tier support openings 229 are formed directly on a top surface of a respective one of the sacrificial first-tier support opening fill portions 128. Further, each second-tier support openings 229 may be formed through a horizontal surface within the second stepped surfaces, which include the interfacial surfaces between the second alternating stack (232, 242) and the second stepped dielectric material portion 265. Locations of steps S in the first-tier alternating stack (132, 142) and the second-tier alternating stack (232, 242) are illustrated as dotted lines in FIG. 7B.

The second anisotropic etch process may include an etch step in which the materials of the second-tier alternating stack (232, 242) are etched concurrently with the material of the second stepped dielectric material portion 265. The chemistry of the etch step may alternate to optimize etching of the materials in the second-tier alternating stack (232, 242) while providing a comparable average etch rate to the material of the second stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229) may be substantially vertical, or may be tapered. A bottom periphery of each second-tier opening (249, 229) may be laterally offset, and/or may be located entirely within, a periphery of a top surface of an underlying sacrificial first-tier opening fill portion (148, 128). The photoresist layer may be subsequently removed, for example, by ashing.

Figure 8:
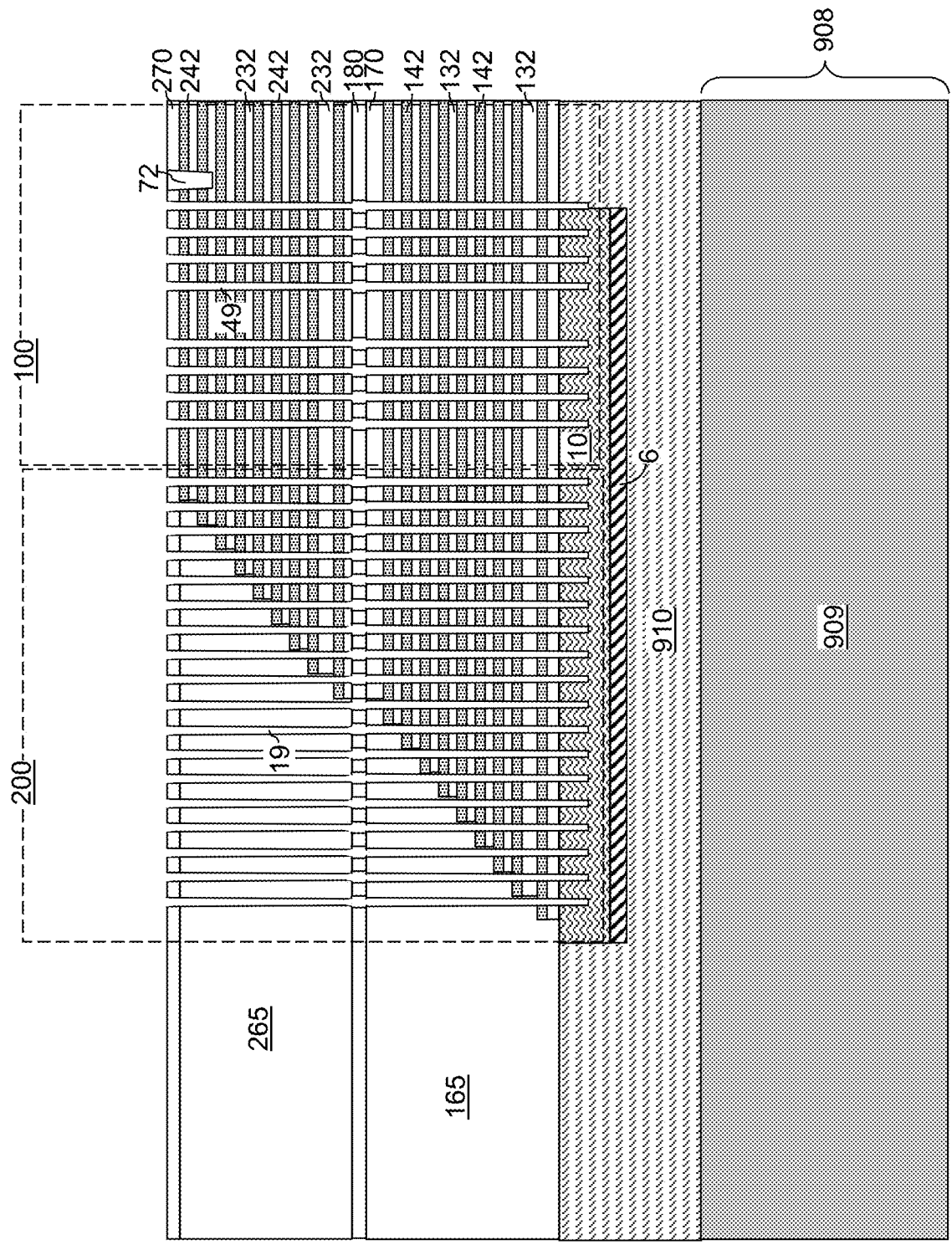
FIG. 8 is a vertical cross-sectional view of the exemplary structure after formation of inter-tier memory openings and inter-tier support openings according to the first embodiment of the present disclosure.

Referring to FIG. 8, the sacrificial first-tier fill material of the sacrificial first-tier opening fill portions (148, 128) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, is formed in each combination of a second-tier support openings 229 and a volume from which a sacrificial first-tier support opening fill portion 128 is removed.

FIGS. 9A-9D provide sequential cross-sectional views of a memory opening 49 during formation of a memory opening fill structure. The same structural change occurs in each of the memory openings 49 and the support openings 19.

Figures 9A, 9B:
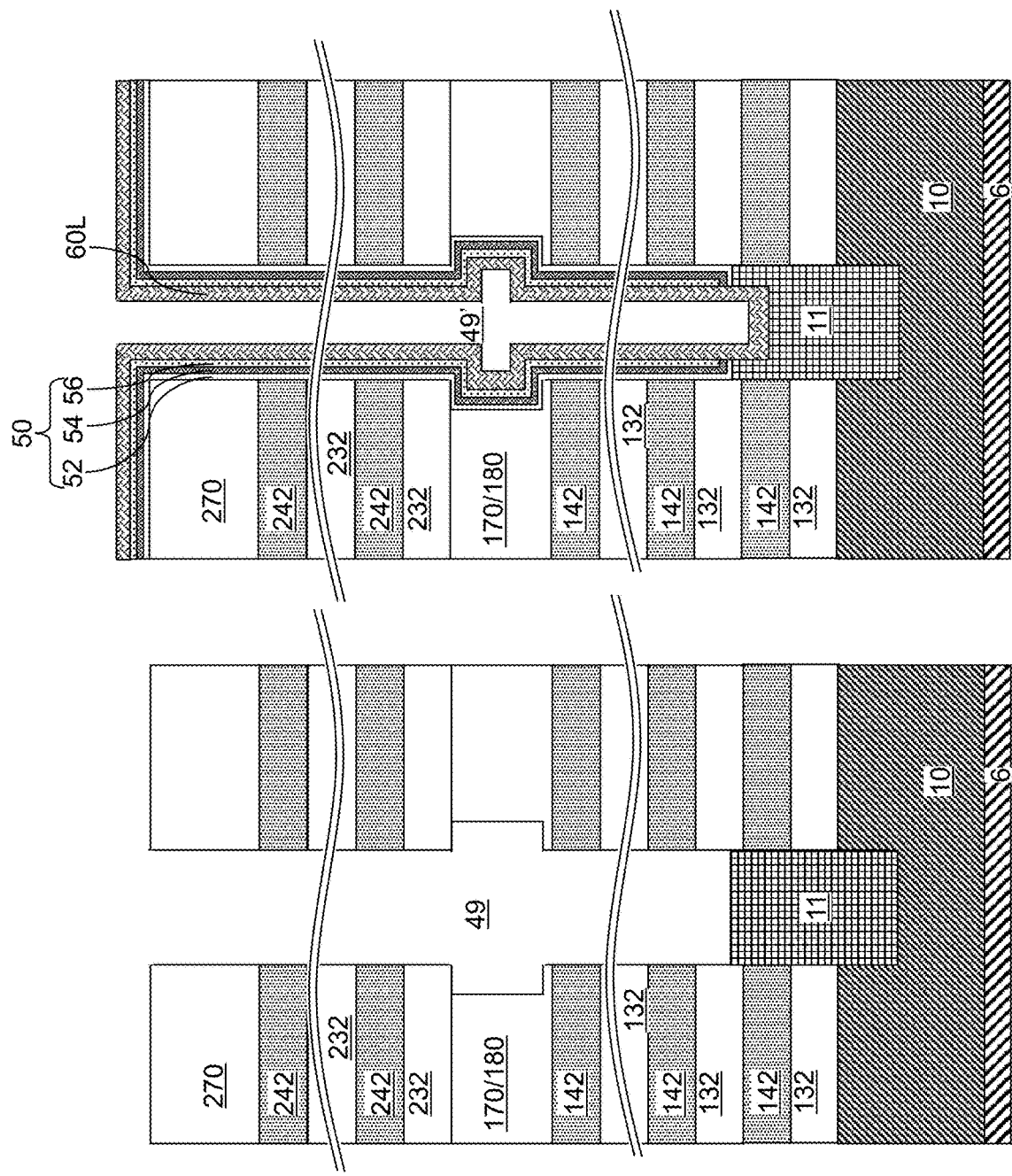

Referring to FIG. 9A, a pedestal channel portion 11 may be formed by a selective semiconductor material deposition process at the bottom of each memory opening 49 and at the bottom of each support opening 19. A doped semiconductor material having a doping of a first conductivity type may be selectively grown from the physically exposed surfaces of the source semiconductor layer 10, while growth of the doped semiconductor material from dielectric surfaces is suppressed during the selective semiconductor material deposition process. A semiconductor precursor gas, a dopant gas including dopants atoms of the first conductivity type, and an etchant may be flowed into a process chamber including the exemplary structure concurrently or alternately. A periphery of a top surface each pedestal channel portion 11 may contact a sidewall of a first insulating layer 132 that overlies, and contacts, a bottommost first sacrificial material layer 142. The atomic concentration of first conductivity type dopants in the pedestal channel portions 11 may be in a range from $1.0 \times 10^{14}/cm^3$ to $1.0 \times 10^{18}/cm^3$, although lesser and greater dopant atomic concentrations may also be used. A p-n junction may be formed at each interface between the source semiconductor layer 10 and the pedestal channel portions 11.

Referring to FIG. 9B, a stack of layers including a blocking dielectric layer 52, a charge storage layer 54, a tunneling dielectric layer 56, and a semiconductor channel material layer 60L may be sequentially deposited in the memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may having a uniform doping. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{15}/cm^3$ to $1.0\times10^{19}/cm^3$, such as from $1.0\times10^{16}/cm^3$ to $1.0\times10^{18}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L).

Referring to FIG. 9C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 9D, a doped semiconductor material may be deposited in cavities overlying the dielectric cores 62. The doped semiconductor material has a doping of the opposite conductivity type of the doping of the semiconductor channel material layer 60L. Thus, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the n-doped semiconductor material constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. The source semiconductor layer 10, the first-tier structure (132, 142, 170, 165), the second-tier structure (232, 242, 270, 265, 72), the inter-tier dielectric layer 180, and the memory opening fill structures 58 collectively constitute a memory-level assembly.

Figure 10:
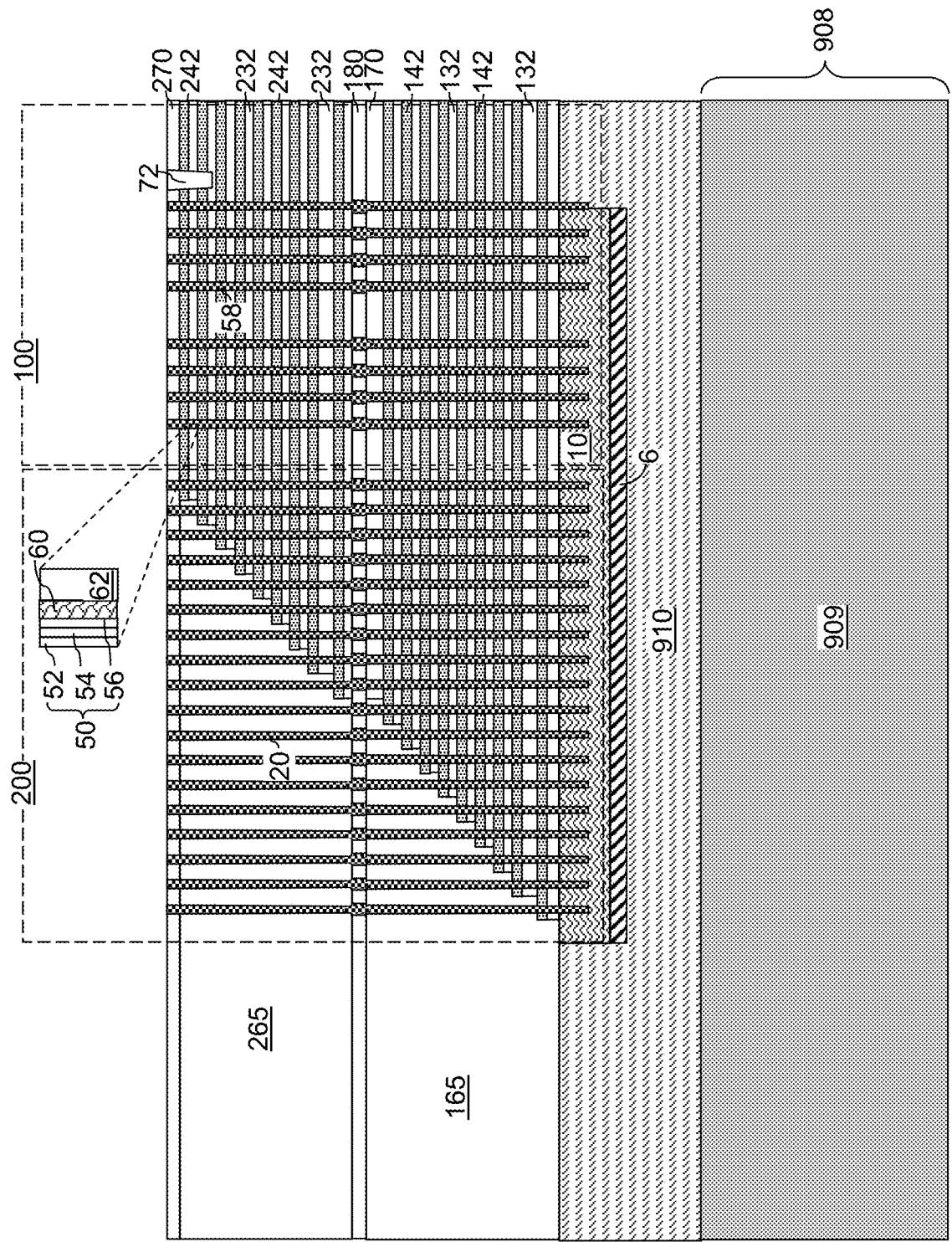
FIG. 10 is a vertical cross-sectional view of the exemplary structure after formation of memory opening fill structures and support pillar structures according to the first embodiment of the present disclosure.

Referring to FIG. 10, the exemplary structure is illustrated after formation of the memory opening fill structures 58. Support pillar structures 20 are formed in the support openings 19 concurrently with formation of the memory opening fill structures 58. Each support pillar structure 20 may have a same set of components as a memory opening fill structure 58.

Figure 11A:
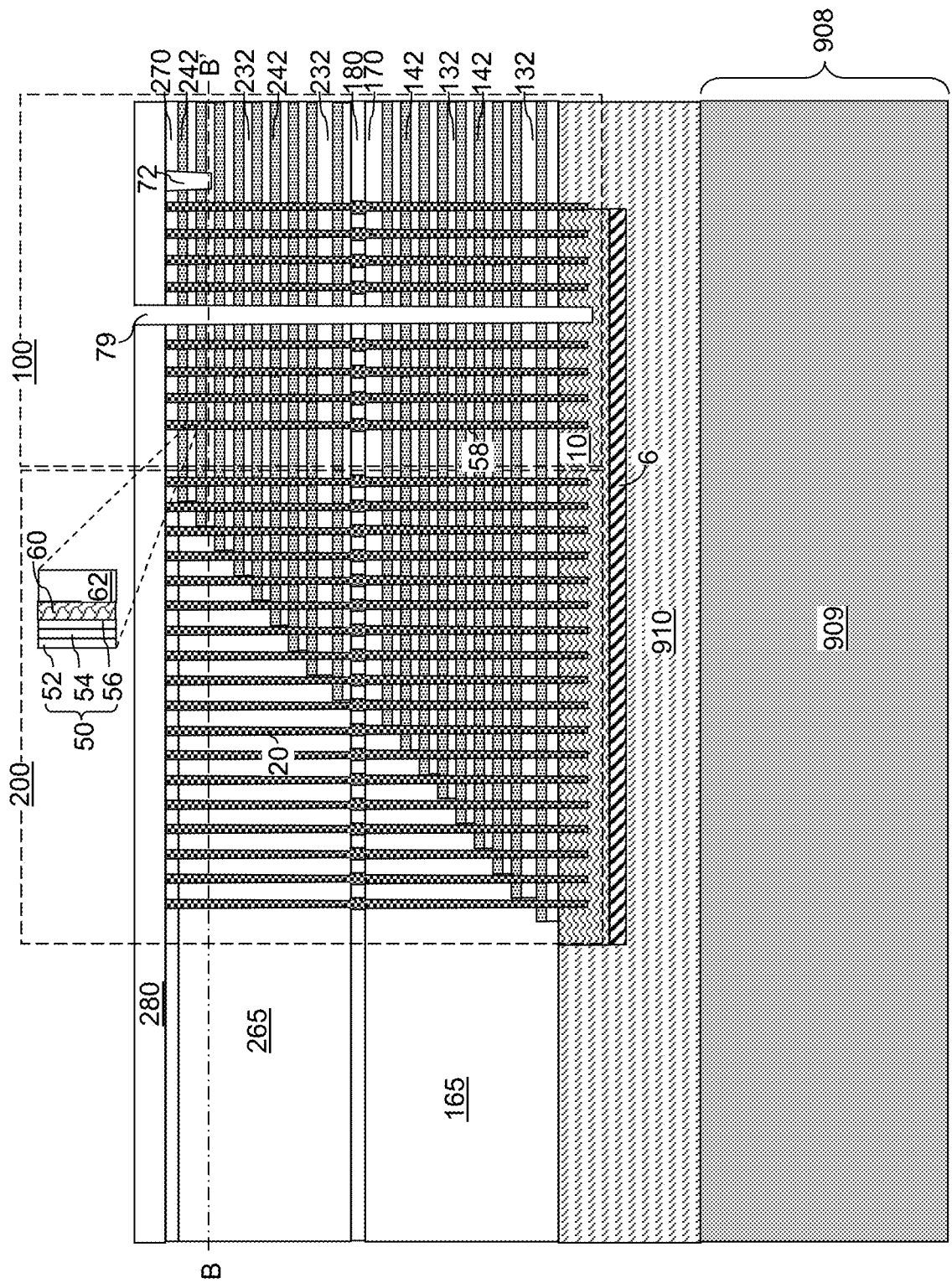
FIG. 11A is a vertical cross-sectional view of the exemplary structure after formation of a first contact-level dielectric layer and backside trenches according to the first embodiment of the present disclosure.
Figure 11B:
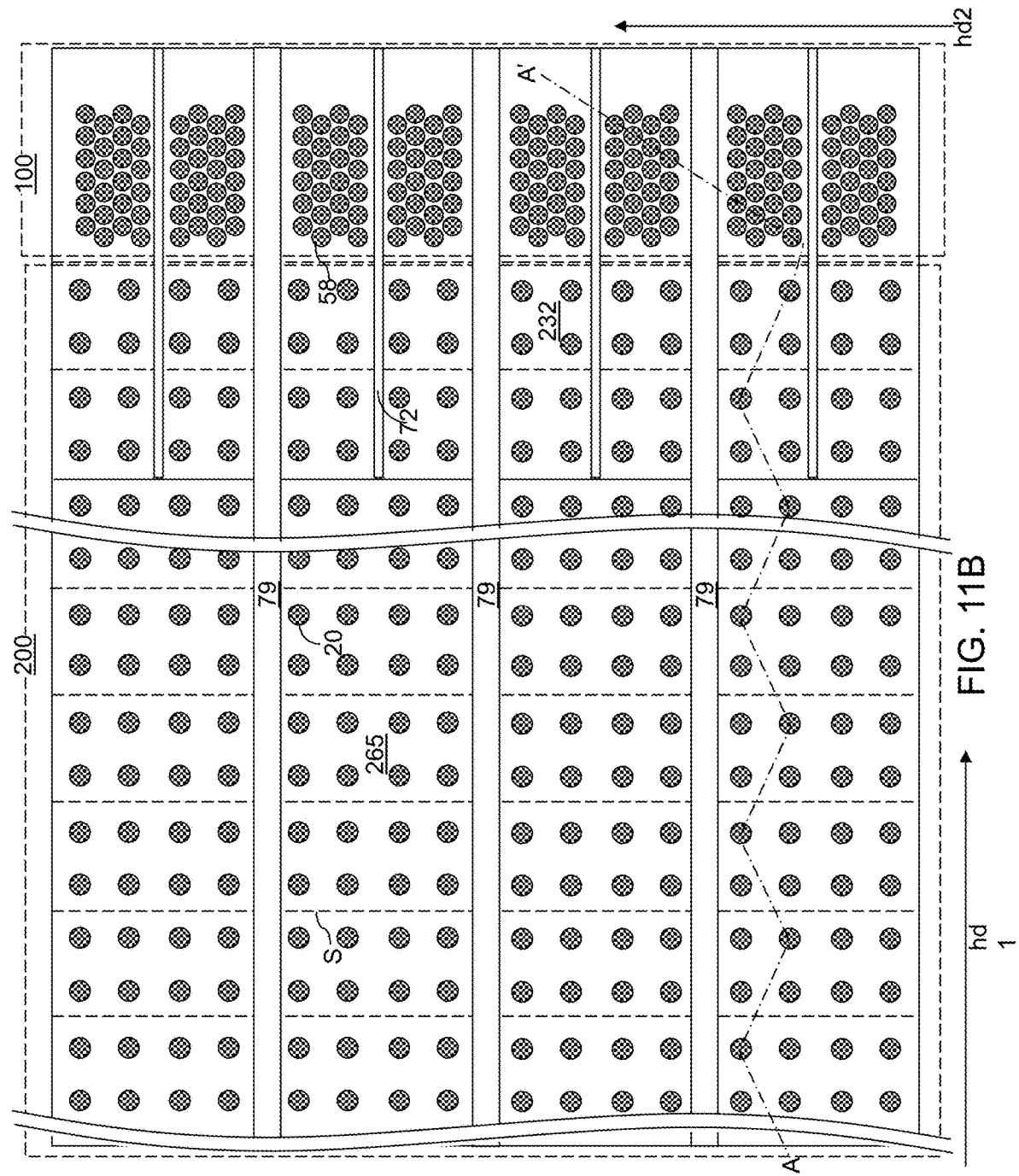
FIG. 11B is a horizontal cross-sectional of the exemplary structure along the horizontal plane B-B' of FIG. 11A. The hinged vertical plane A-A' corresponds to the plane of the vertical cross-sectional view of FIG. 11A.

Referring to FIGS. 11A and 11B, a first contact-level dielectric layer 280 may be formed over the second-tier structure (232, 242, 270, 265, 72). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280 and may be lithographically patterned to form elongated openings that extend along the first horizontal direction hd1 between clusters of memory opening fill structures 58. Backside trenches 79 may be formed by transferring the pattern in the photoresist layer through the first contact-level dielectric layer 280, the second-tier structure (232, 242, 270, 265, 72), and the first-tier structure (132, 142, 170, 165), and into the source semiconductor layer 10. Portions of the first contact-level dielectric layer 280, the second-tier structure (232, 242, 270, 265, 72), the first-tier structure (132, 142, 170, 165), and the source semiconductor layer 10 that underlie the openings in the photoresist layer may be removed to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79. While it is desirable for the backside trenches 79 to be formed with completely straight sidewalls, the backside trenches 79 are often formed with local width variations with non-straight surfaces due to various effects including local variations of process parameters (such as local variations in gas flow, pressure, electrical field, etc.) and charge density variations within the exemplary structure due to local layout variations of conductive components within the exemplary structure.

Figure 12:
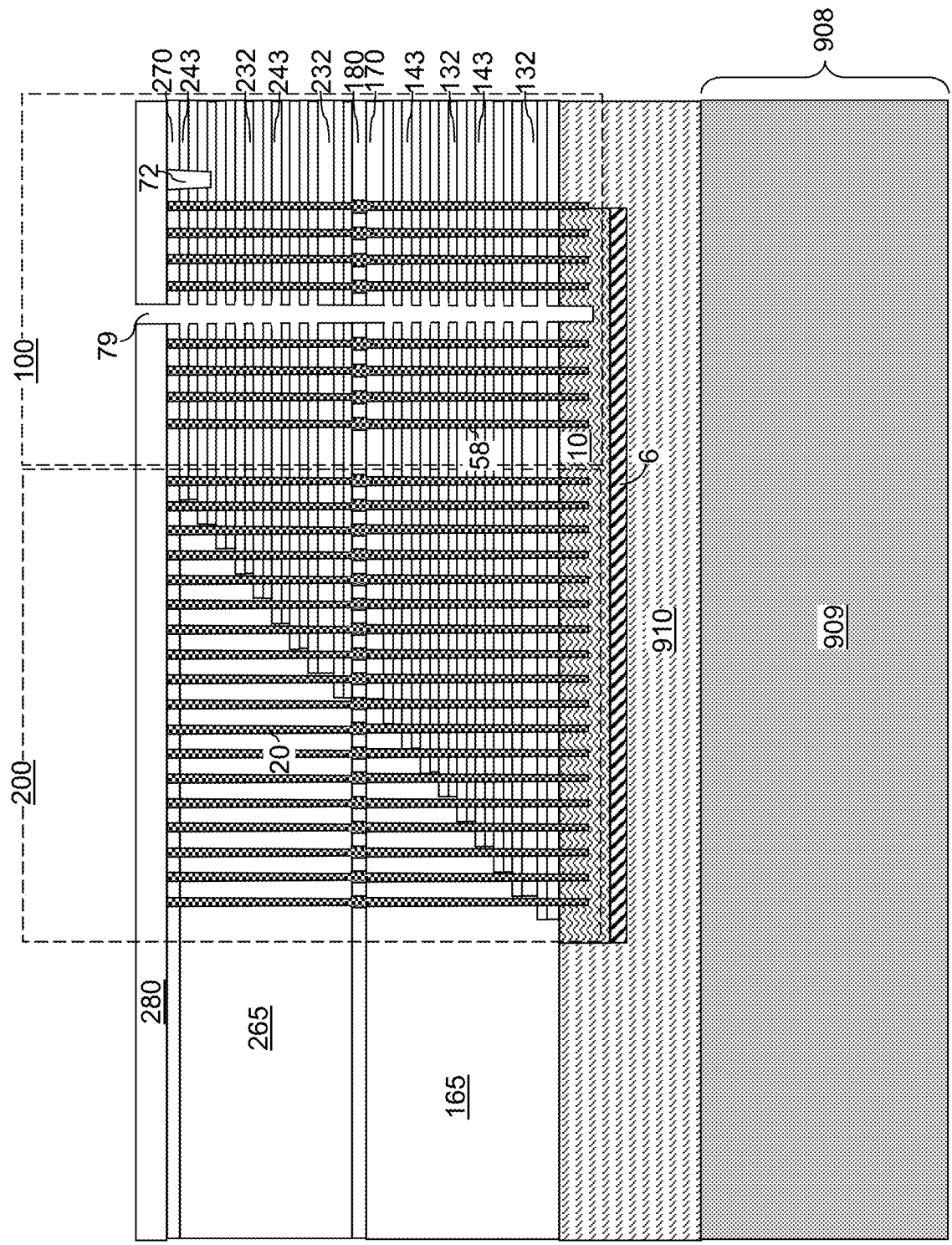
FIG. 12 is a vertical cross-sectional view of the exemplary structure after formation of backside recesses according to the first embodiment of the present disclosure.

Referring to FIG. 12, the sacrificial material layers (142, 242) are may be removed selective to the insulating layers (132, 232), the first and second insulating cap layers (170, 270), the first contact-level dielectric layer 280, and the source semiconductor layer 10. For example, an etchant that selectively etches the materials of the sacrificial material layers (142, 242) with respect to the materials of the insulating layers (132, 232), the first and second insulating cap layers (170, 270), the stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the first and second insulating cap layers (170, 270), the stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the semiconductor substrate layer 909. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Figure 13A:
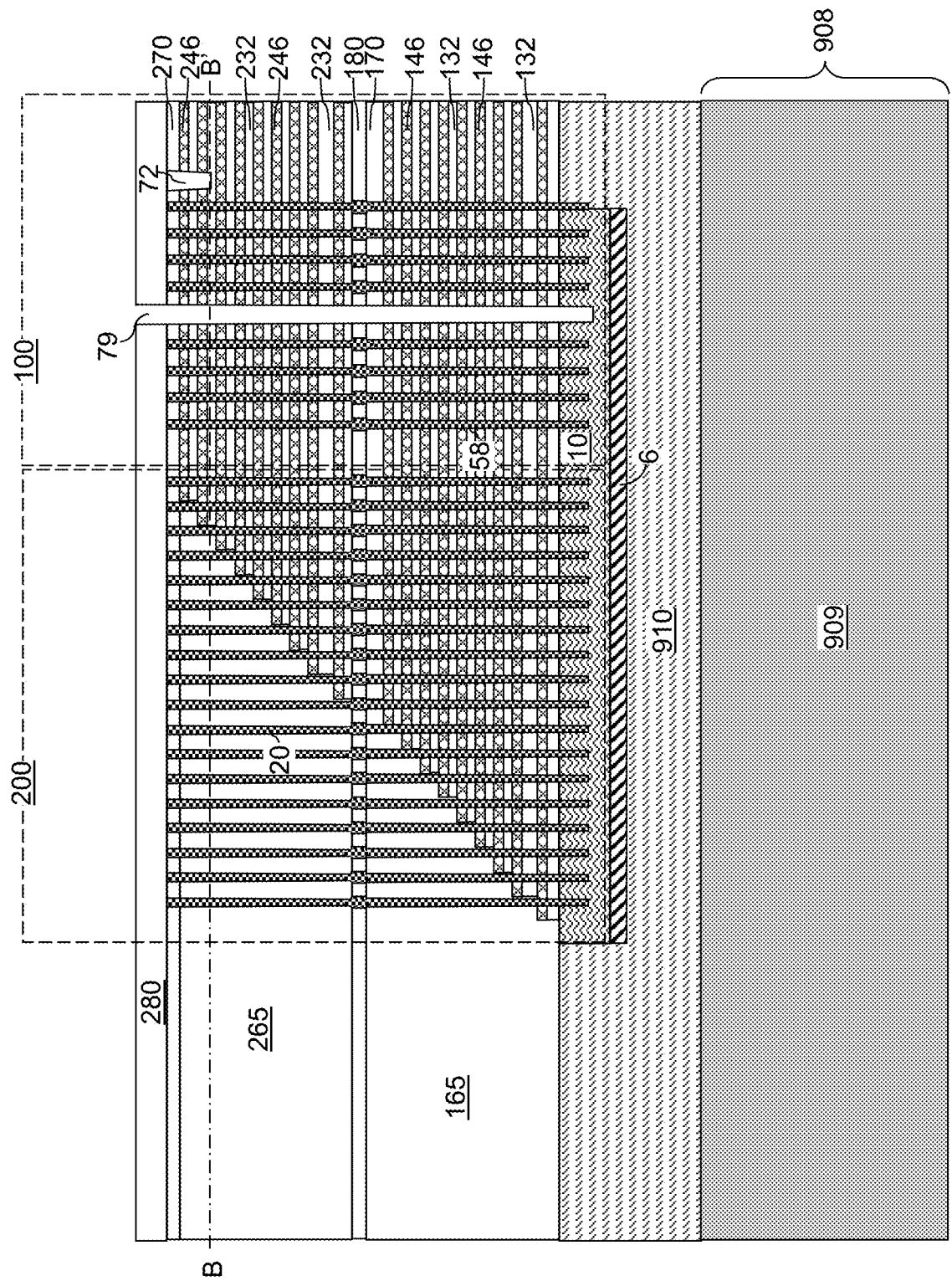
FIG. 13A is a vertical cross-sectional view of the exemplary structure after formation of electrically conductive layers according to the first embodiment of the present disclosure.
Figure 13B:
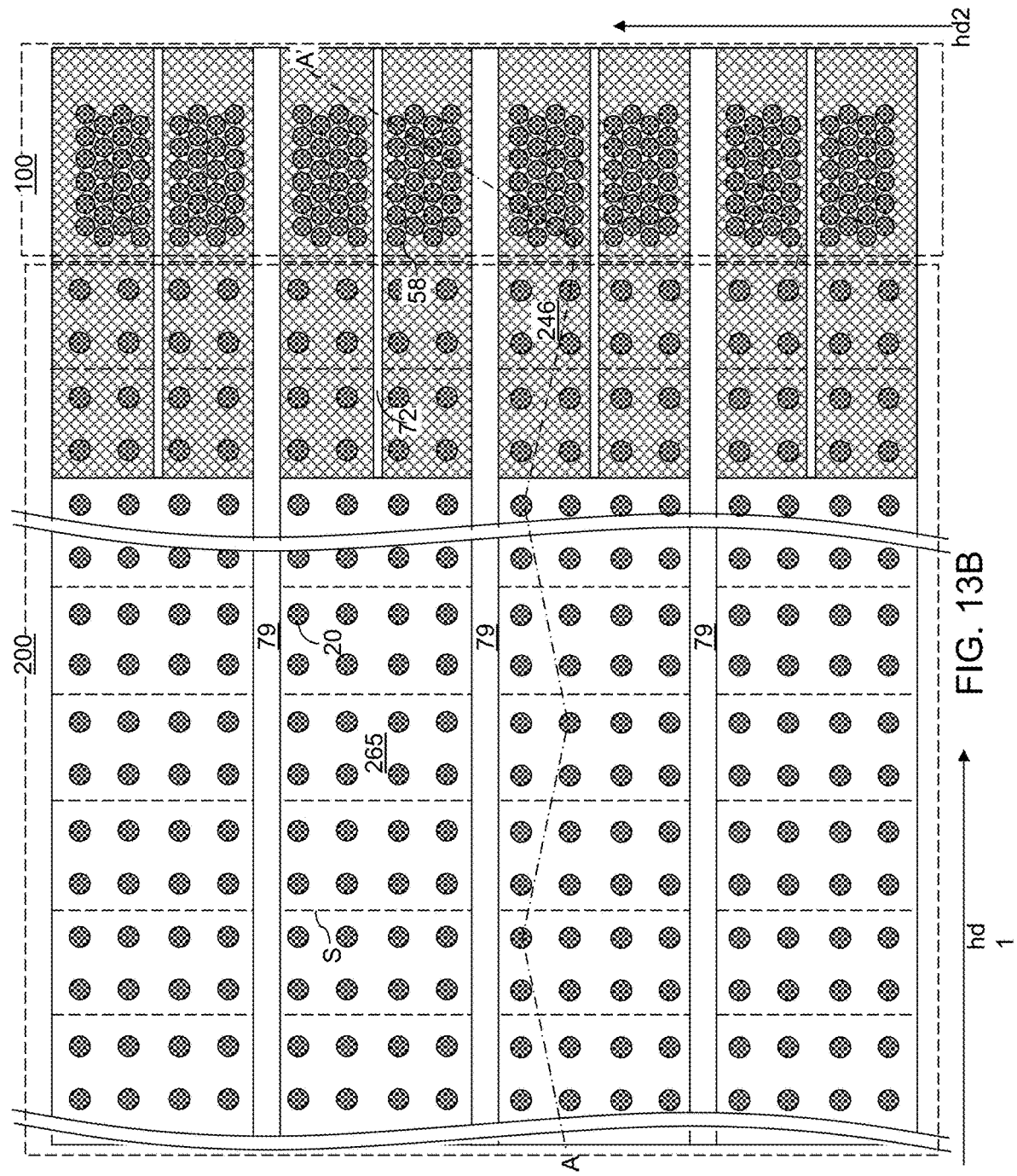
FIG. 13B is a horizontal cross-sectional of the exemplary structure along the horizontal plane B-B' of FIG. 13A. The hinged vertical plane A-A' corresponds to the plane of the vertical cross-sectional view of FIG. 13A.

Referring to FIGS. 13A and 13B, an oxidation process may be performed to oxidize physically exposed portions of the pedestal channel portions 11. Tubular insulating spacers (not expressly illustrated) may be formed around each pedestal channel portion 11. A backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive material layers 146 and the second electrically conductive layers may be physically exposed to a respective backside trench 79. The backside trenches may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each electrically conductive layer (146, 246) may have a lesser area than any underlying electrically conductive layer (146, 246) because of the first and second stepped surfaces. Each electrically conductive layer (146, 246) may have a greater area than any overlying electrically conductive layer (146, 246) because of the first and second stepped surfaces.

In some embodiment, drain-select-level isolation structures 72 may be provided at topmost levels of the second electrically conductive layers 246. A subset of the second electrically conductive layers 246 located at the levels of the drain-select-level isolation structures 72 constitutes drain select gate electrodes. A subset of the electrically conductive layer (146, 246) located underneath the drain select gate electrodes may function as combinations of a control gate and a word line located at the same level. The control gate electrodes within each electrically conductive layer (146, 246) are the control gate electrodes for a vertical memory device including the memory stack structure 55.

Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying via interconnection region 400 may comprise word line switch devices configured to control a bias voltage to respective word lines. The memory-level assembly is located over the semiconductor substrate layer 909.

The memory-level assembly includes at least one alternating stack (132, 146, 232, 246) and memory stack structures 55 vertically extending through the at least one alternating stack (132, 146, 232, 246).

Figure 14A:
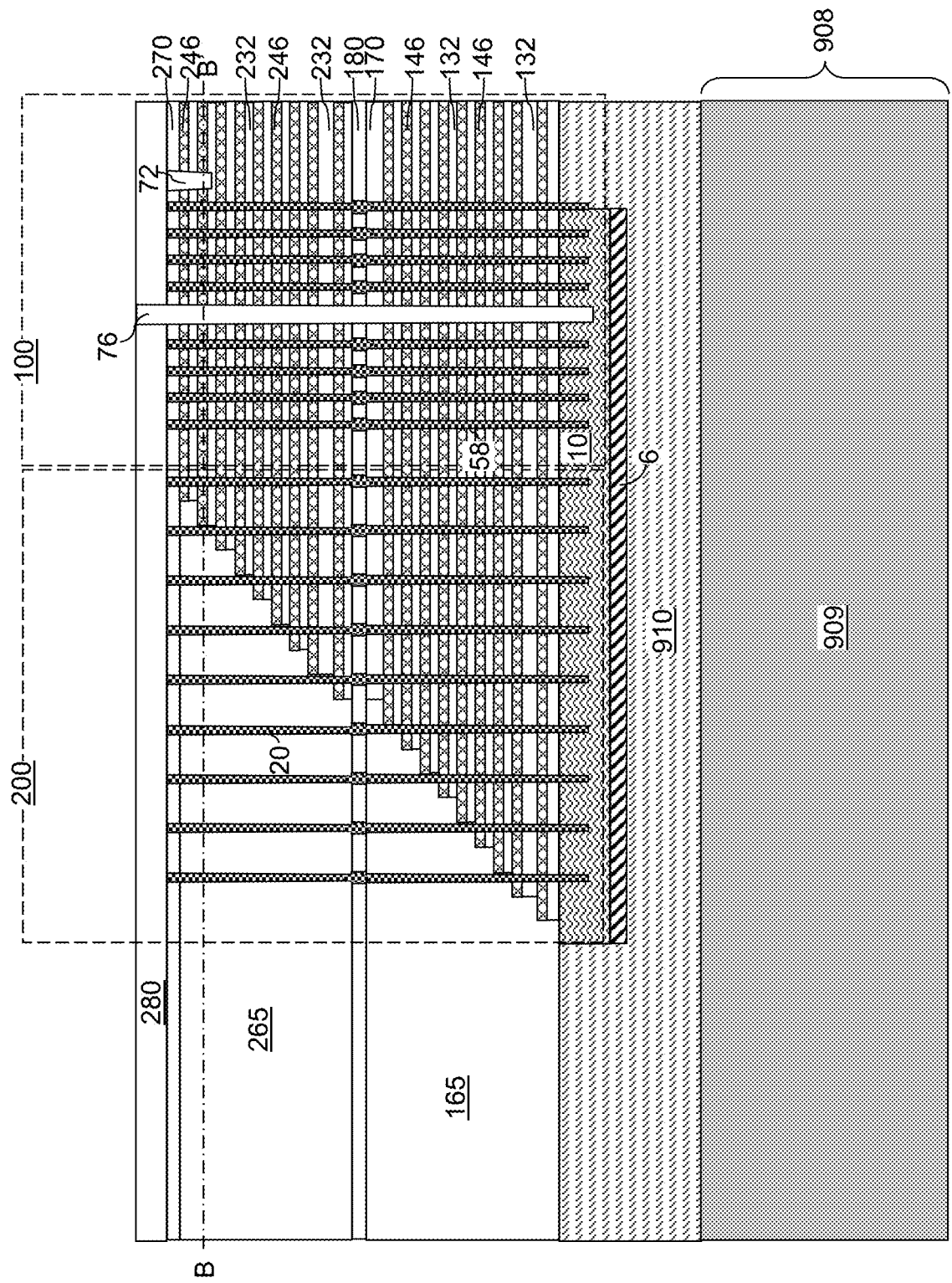
FIG. 14A is a vertical cross-sectional view of the exemplary structure after formation of backside trench fill structures in the backside trenches according to the first embodiment of the present disclosure.
Figure 14B:
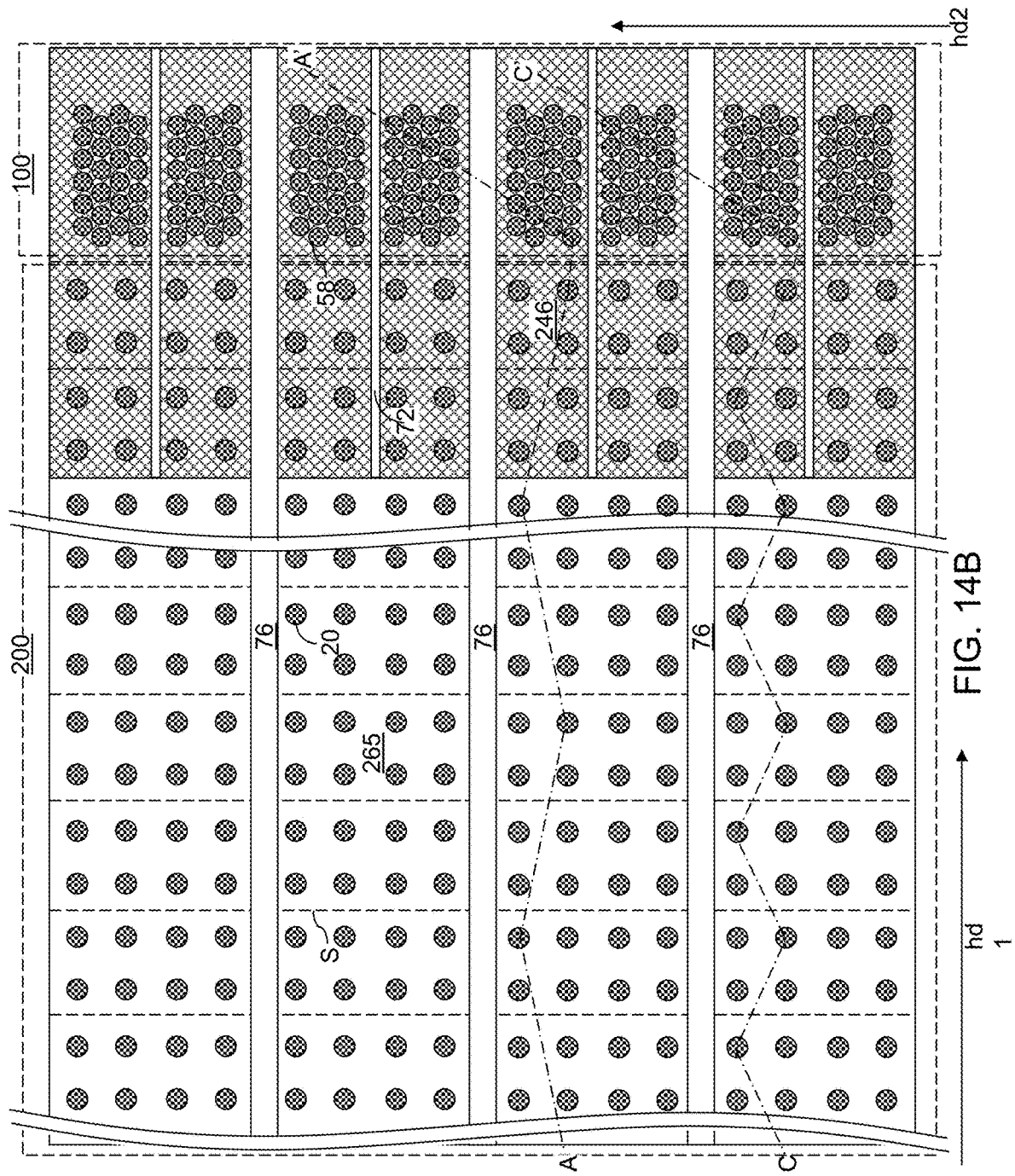
FIG. 14B is a horizontal cross-sectional of the exemplary structure along the horizontal plane B-B' of FIG. 14A. The hinged vertical plane A-A' corresponds to the plane of the vertical cross-sectional view of FIG. 14A.
Figure 14C:
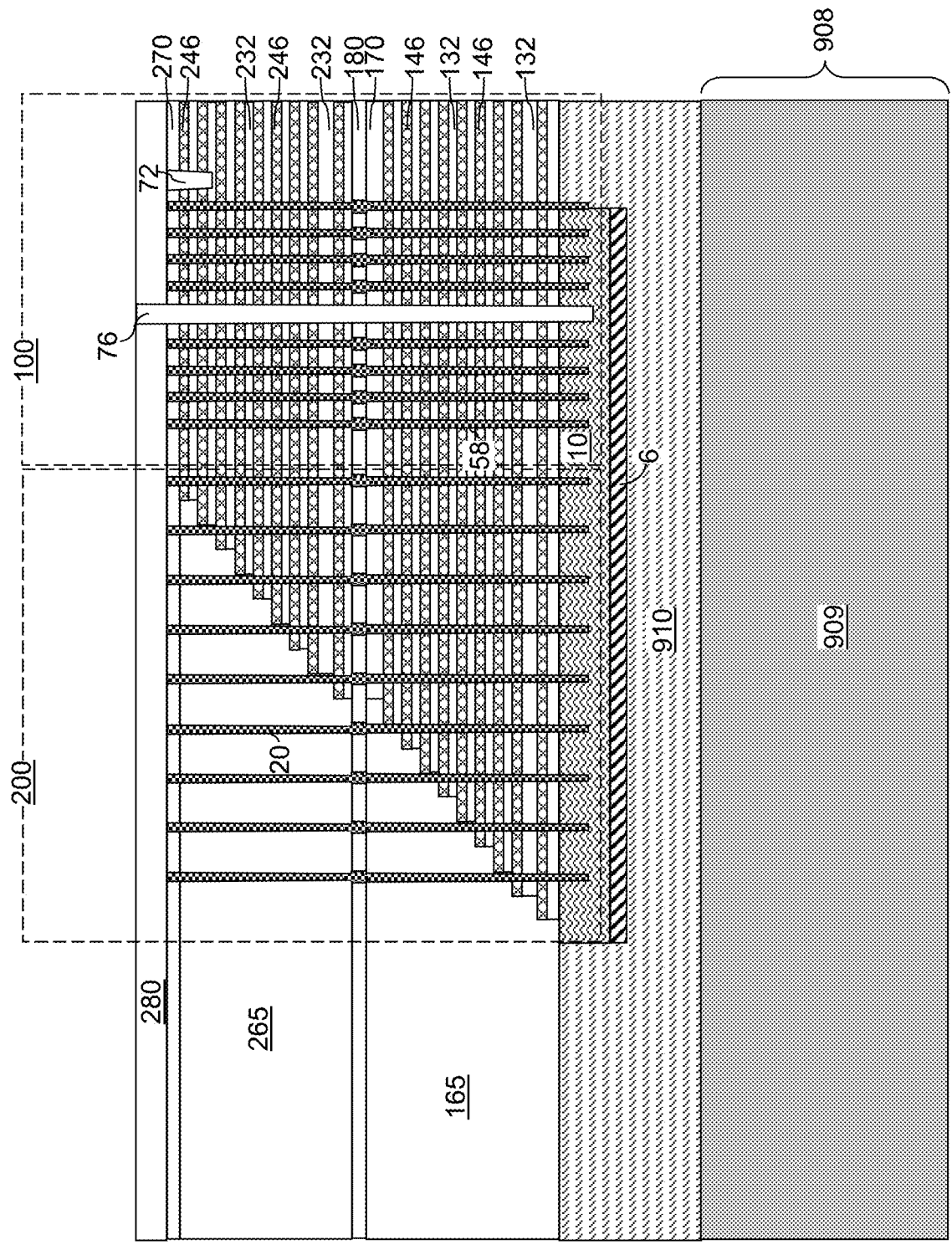
FIG. 14C is a vertical cross-sectional view of the exemplary structure along the vertical plane C-C' of FIG. 14B.

Referring to FIGS. 14A-14C, a backside trench fill structure 76 may be formed within each backside trench 79. Each backside trench fill structure 76 may consist of at least one dielectric fill material such as silicon oxide, silicon nitride, and/or a dielectric metal oxide material. Alternatively, the backside trench fill structure 76 may include a laterally-insulated source contact via structure that includes a conductive via structure contacting the source semiconductor layer 10 and a dielectric spacer that laterally surrounds the conductive via structure.

Figure 15A:
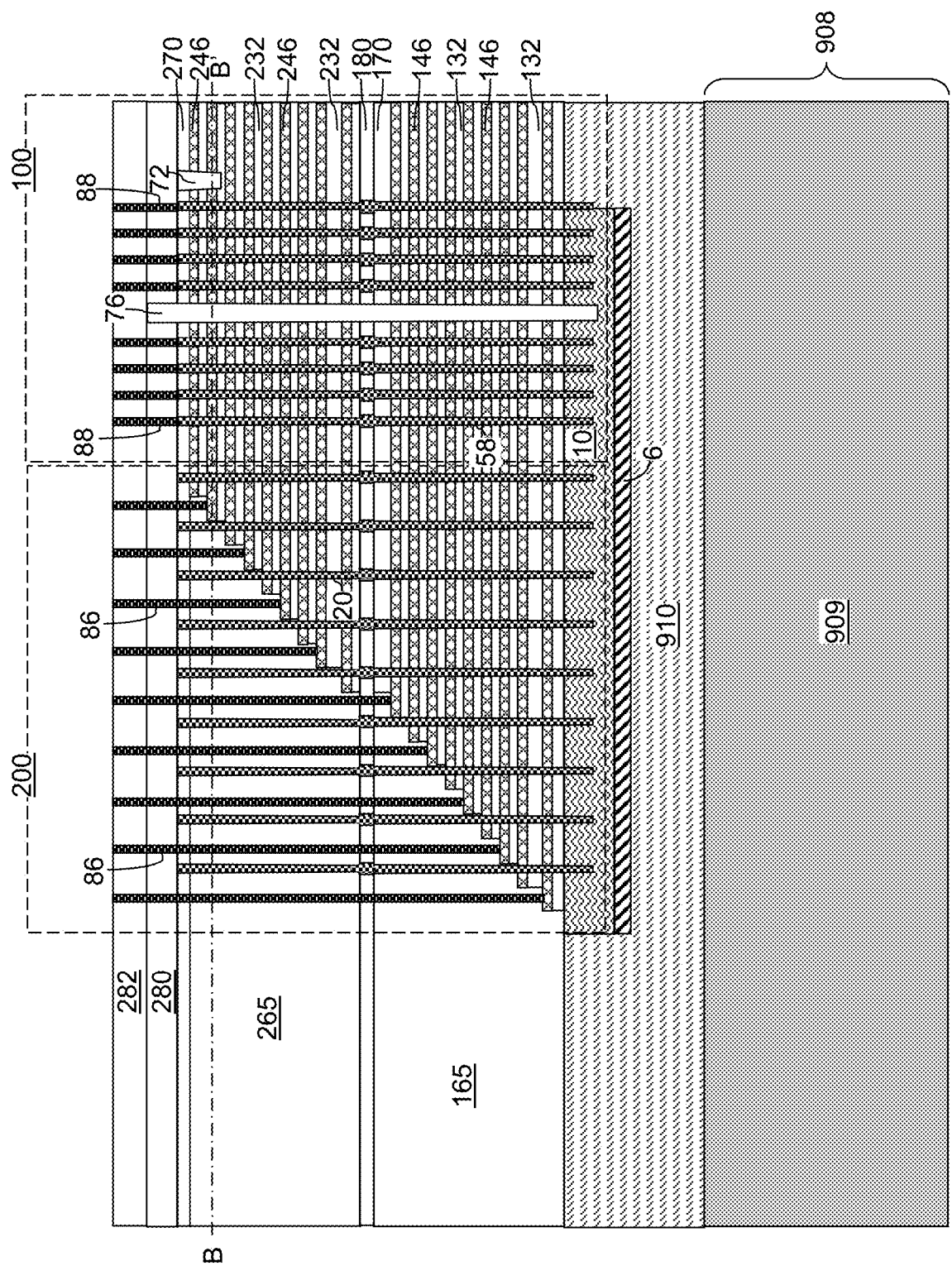
FIG. 15A is a vertical cross-sectional view of the exemplary structure after formation of a second contact-level dielectric layer and various contact via structures according to the first embodiment of the present disclosure.
Figure 15B:
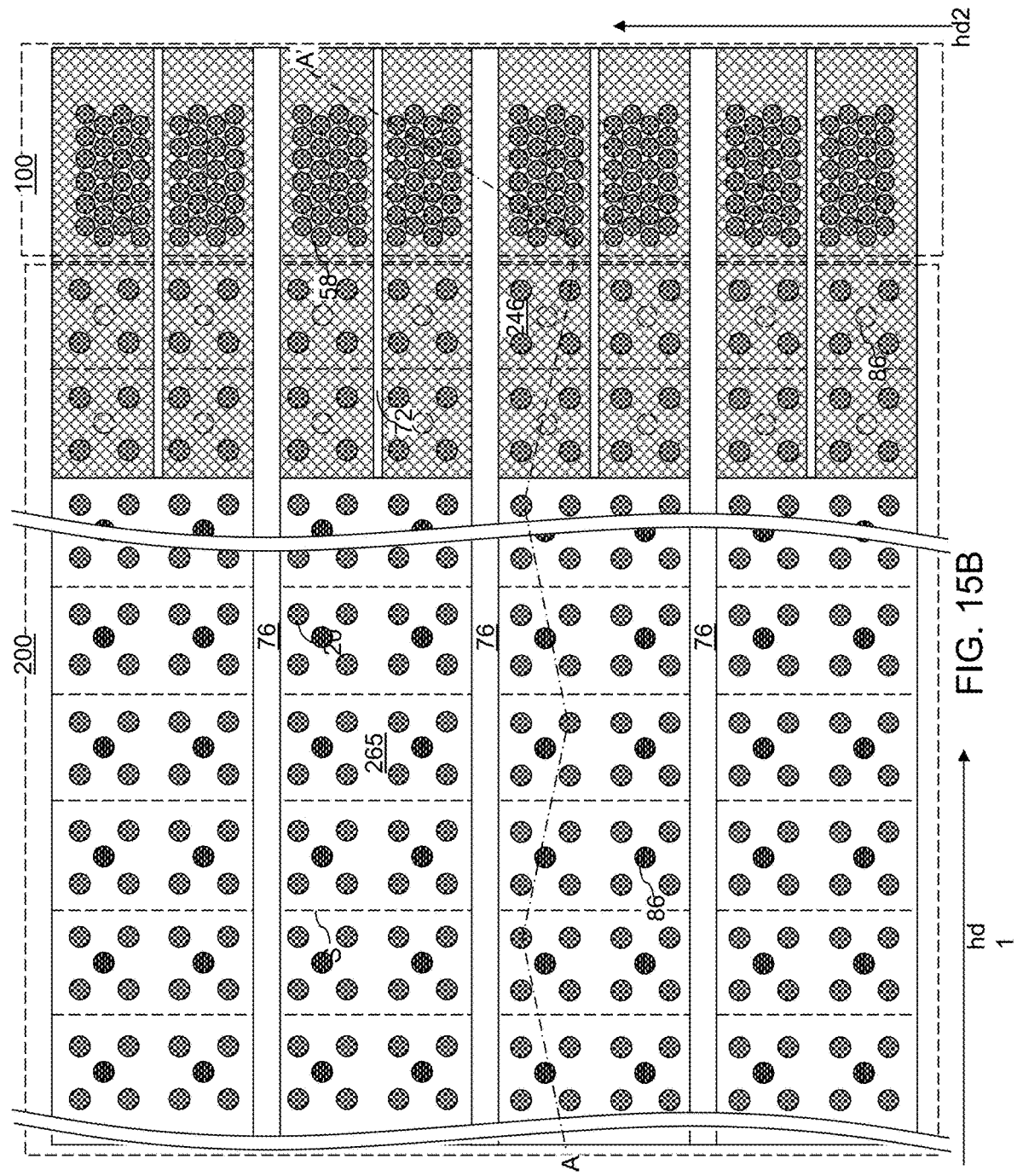
FIG. 15B is a horizontal cross-sectional view of the exemplary structure along the vertical plane B-B' of FIG. 15A. The hinged vertical plane A-A' corresponds to the plane of the vertical cross-sectional view of FIG. 15A.

Referring to FIGS. 15A and 15B, a second contact-level dielectric layer 282 may be formed over the first contact-level dielectric layer 280. The second contact-level dielectric layer 282 includes a dielectric material such as silicon oxide, and may have a thickness in a range from 100 nm to 600 nm, although lesser and greater thicknesses may also be used.

A photoresist layer (not shown) may be applied over the second contact-level dielectric layer 282, and may be lithographically patterned to form various contact via openings. For example, openings for forming drain contact via structures 88 may be formed in the memory array region 100, and openings for forming staircase region contact via structures 86 may be formed in the staircase region 200. An anisotropic etch process is performed to transfer the pattern in the photoresist layer through the second and first contact-level dielectric layers (282, 280) and underlying dielectric material portions. The drain regions 63 and the electrically conductive layers (146, 246) may be used as etch stop structures. Drain contact via cavities may be formed over each drain region 63, and staircase-region contact via cavities may be formed over each electrically conductive layer (146, 246) at the stepped surfaces underlying the first and second stepped dielectric material portions (165, 265). The photoresist layer may be subsequently removed, for example, by ashing.

Drain contact via structures 88 are formed in the drain contact via cavities and on a top surface of a respective one of the drain regions 63. Staircase-region contact via structures 86 are formed in the staircase-region contact via cavities and on a top surface of a respective one of the electrically conductive layers (146, 246). The staircase-region contact via structures 86 may include drain select level contact via structures that contact a subset of the second electrically conductive layers 246 that function as drain select level gate electrodes. Further, the staircase-region contact via structures 86 may include word line contact via structures that contact electrically conductive layers (146, 246) that underlie the drain select level gate electrodes and function as word lines for the memory stack structures 55.

Figure 16:
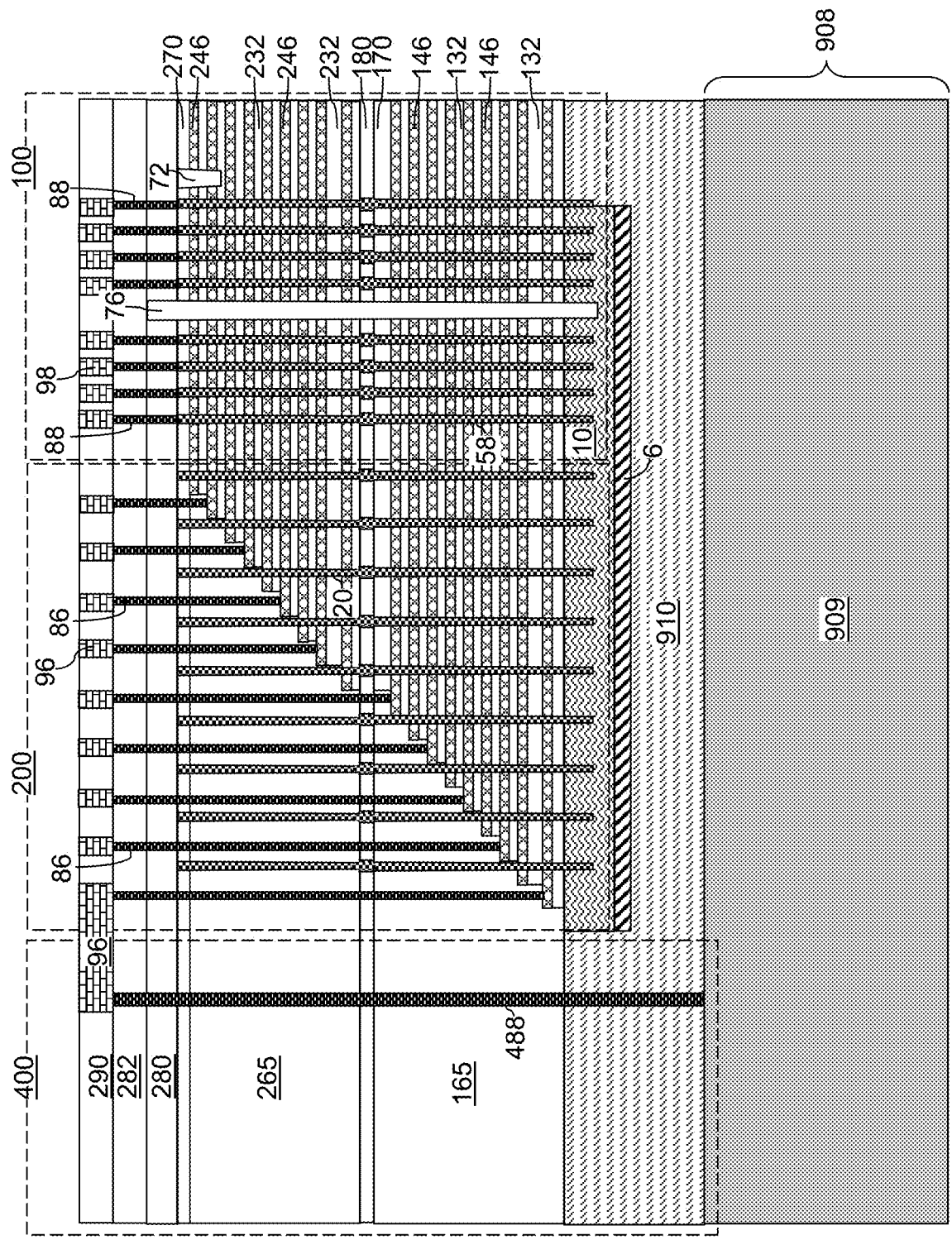
FIG. 16 is a vertical cross-sectional view of the exemplary structure after formation of metal line structures according to the first embodiment of the present disclosure.

Referring to FIG. 16, through-memory-level via cavities may be formed through the second and first contact-level dielectric layers (282, 280), the second and first stepped dielectric material portions (265, 165), and the source-side dielectric material layer 910 to top surfaces of the semiconductor substrate layer 909 in the via interconnection region 400. At least one conductive material may be deposited in the through-memory-level via cavities. Excess portions of the at least one conductive material may be removed from above the horizontal plane including the top surface of the second contact-level dielectric layer 282. Each remaining portion of the at least one conductive material in a through-memory-level via cavity constitutes a through-memory-level via structure 488.

At least one additional dielectric layer may be formed over the contact-level dielectric layers (280, 282), and additional metal interconnect structures (herein referred to as upper-level metal interconnect structures) may be formed in the at least one additional dielectric layer. For example, the at least one additional dielectric layer may include a line-level dielectric layer 290 that is formed over the contact-level dielectric layers (280, 282). The upper-level metal interconnect structures may include bit lines 98 contacting a respective one of the drain contact via structures 88, and interconnection line structures 96 contacting, and/or electrically connected to, at least one of the staircase-region contact via structures 86 and/or the through-memory-level via structures 488.

In one embodiment, the three-dimensional memory device comprises a monolithic three-dimensional NAND memory device, the electrically conductive strips (146, 246) comprise, or are electrically connected to, a respective word line of the monolithic three-dimensional NAND memory device, the substrate 908 comprises a silicon substrate, the monolithic three-dimensional NAND memory device comprises an array of monolithic three-dimensional NAND strings over the silicon substrate, and at least one memory cell in a first device level of the array of monolithic three-dimensional NAND strings is located over another memory cell in a second device level of the array of monolithic three-dimensional NAND strings. The silicon substrate may contain an integrated circuit comprising a driver circuit for the memory device located thereon, the electrically conductive strips (146, 246) comprise a plurality of control gate electrodes having a strip shape extending substantially parallel to the top surface of the substrate 908, the plurality of control gate electrodes comprise at least a first control gate electrode located in the first device level and a second control gate electrode located in the second device level. The array of monolithic three-dimensional NAND strings comprises a plurality of semiconductor channels 60, wherein at least one end portion of each of the plurality of semiconductor channels 60 extends substantially perpendicular to a top surface of the substrate 908, and one of the plurality of semiconductor channels including the vertical semiconductor channel 60. The array of monolithic three-dimensional NAND strings comprises a plurality of charge storage elements (comprising portions of the memory films 50), each charge storage element located adjacent to a respective one of the plurality of semiconductor channels 60.

Figure 17:
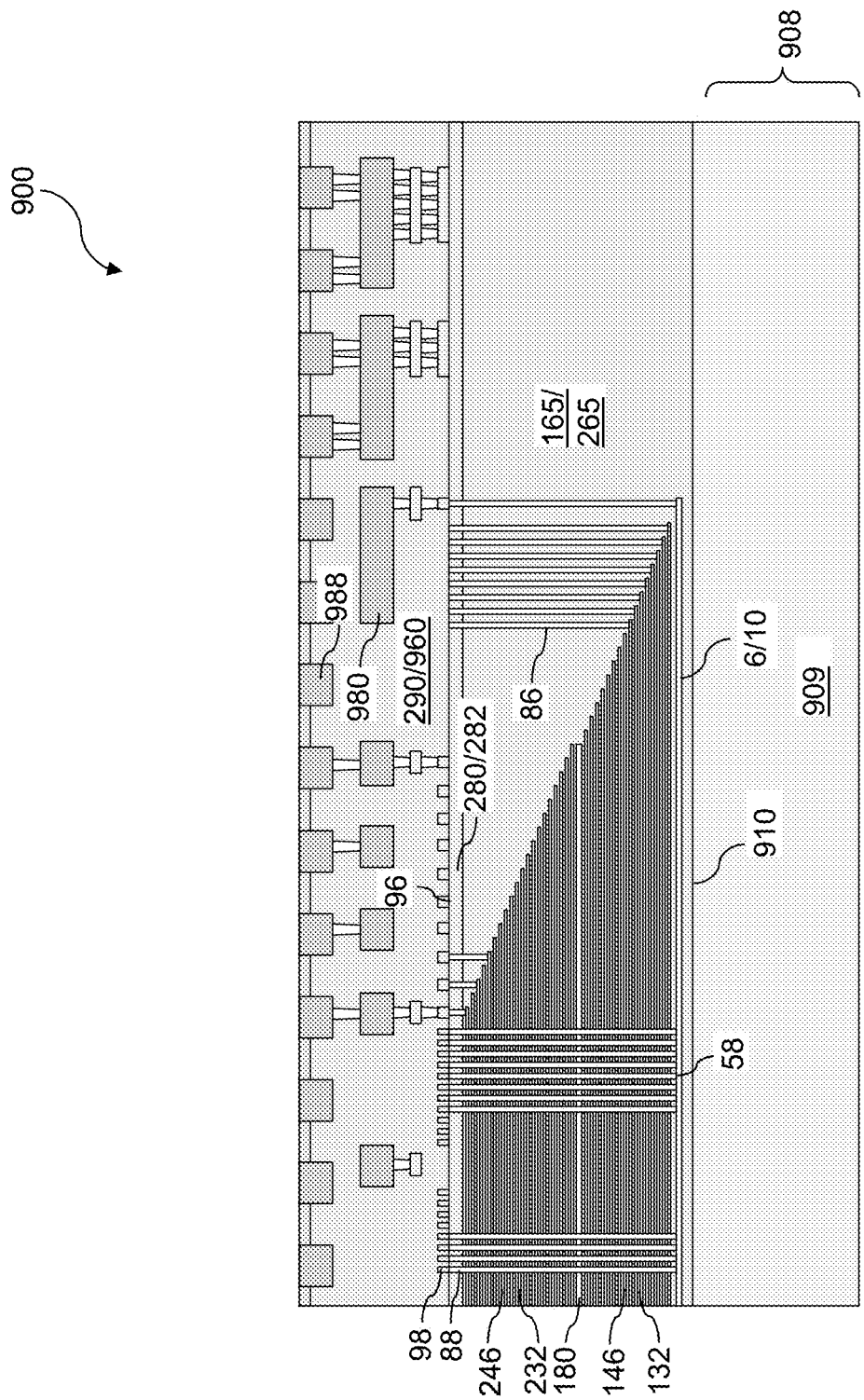
FIG. 17 is a vertical cross-sectional view of the exemplary structure that includes a first semiconductor die after formation of additional interconnect-level dielectric material layers and first bonding pads according to the first embodiment of the present disclosure.

Referring to FIG. 17, interconnect-level dielectric material layers 980 may be deposited over the line-level dielectric layer 290. Various additional memory-die metal interconnect structures 980 may be formed in the interconnect-level dielectric material layers 960. Generally, the various metal interconnect structures (88, 86, 98, 96, 980) may be formed in the combination of the first contact-level dielectric layer 280, the second contact-level dielectric layer 282, the line-level dielectric layer 290, and the interconnect-level dielectric material layers 960 with appropriate shifting of metal interconnect levels. The thickness of the interconnect-level dielectric material layers 960 may be in a range from 300 nm to 3,000 nm, although lesser and greater thicknesses may also be used.

Pad cavities are formed in the upper portion of the additional memory-die metal interconnect structures 980 such that a respective one of the memory-die metal interconnect structures 980 is exposed at the bottom of each pad cavity. In one embodiment, the pad cavities may be arranged as a one-dimensional array or as a two-dimensional array, and may have a respective polygonal, circular, elliptical, or generally-curvilinear shape.

A conductive material may be deposited in the pad cavities to form various first bonding pads 988, which are also referred to as memory-die bonding pads. The first bonding pads 988 may include source-network first bonding pads electrically connected to the source semiconductor layer 10, word-line-connection first bonding pads that are electrically connected to a respective one of the electrically conductive layers (146, 246) that function word lines, and bit-line-connection first bonding pads that are electrically connected to the bit lines 98. The exemplary structure comprises a memory die 900, which are also referred to as a first semiconductor die.

A plurality of memory dies 900 may be provided. Each of the memory dies 900 may include an alternating stack of insulating layers (132, 232) and word lines comprising a subset of the electrically conductive layers (146, 246). The alternating stack {(132, 146), (232, 246)} has stepped surfaces in which a subset of the electrically conductive layers (146, 246) has a lateral extent that increases with a distance from a bonding surface of the memory die 900 including the first bonding pads 988. Memory stack structures 55 vertically extend through the alternating stack {(132, 146), (232, 246)}. Each of the memory stack structures 55 include a respective vertical semiconductor channel 60 and a respective set of vertically stacked memory elements located at levels of the electrically conductive layers (146, 246). Each set of vertically stacked memory elements may include portions of a charge storage layer 54 located at the levels of the electrically conductive layers (146, 246). Word line contact via structures (which are a subset of staircase-region contact via structures 86 that contact a subset of the electrically conductive layers 146 that function as word lines) may contact a respective one of the word lines. Each of the word line contact via structures vertically extend from a respective one of the word lines toward the bonding surface of the memory die 900.

Generally, a first semiconductor die (such as a memory die 900) is provided, which includes a first substrate 908, first semiconductor devices (such as three-dimensional array of memory devices), first interconnect-level dielectric material layers (such as the interconnect-level dielectric material layers 960), first metal interconnect structures (such as the memory-die metal interconnect structures 980) embedded in the first interconnect-level dielectric material layers, and first bonding pads 988 located on the first interconnect-level dielectric material layers and connected to a respective node of the first semiconductor devices through a respective subset of the first metal interconnect structures.

In on embodiment, the first semiconductor die comprises a memory die 900. The memory die can include an alternating stack of insulating layers (132, 232) and electrically conductive layers (146, 246) that extend parallel to a topmost surface of the interconnect-level dielectric material layers 960, and memory stack structures 55 vertically extending through the alternating stack {(132, 146), (232, 246)}. Each of the memory stack structures 55 comprises a respective vertical stack of memory elements (which can be embodied as portions of charge storage layers 54 located at the levels of the electrically conductive layers (146, 246) and a respective vertical semiconductor channel 60. The memory die can include drain regions 63 connected to a first end of a respective one of the vertical semiconductor channels 60, and a source region (such as a source semiconductor layer 10) connected to a second end of the vertical semiconductor channels 60.

Figure 18A:
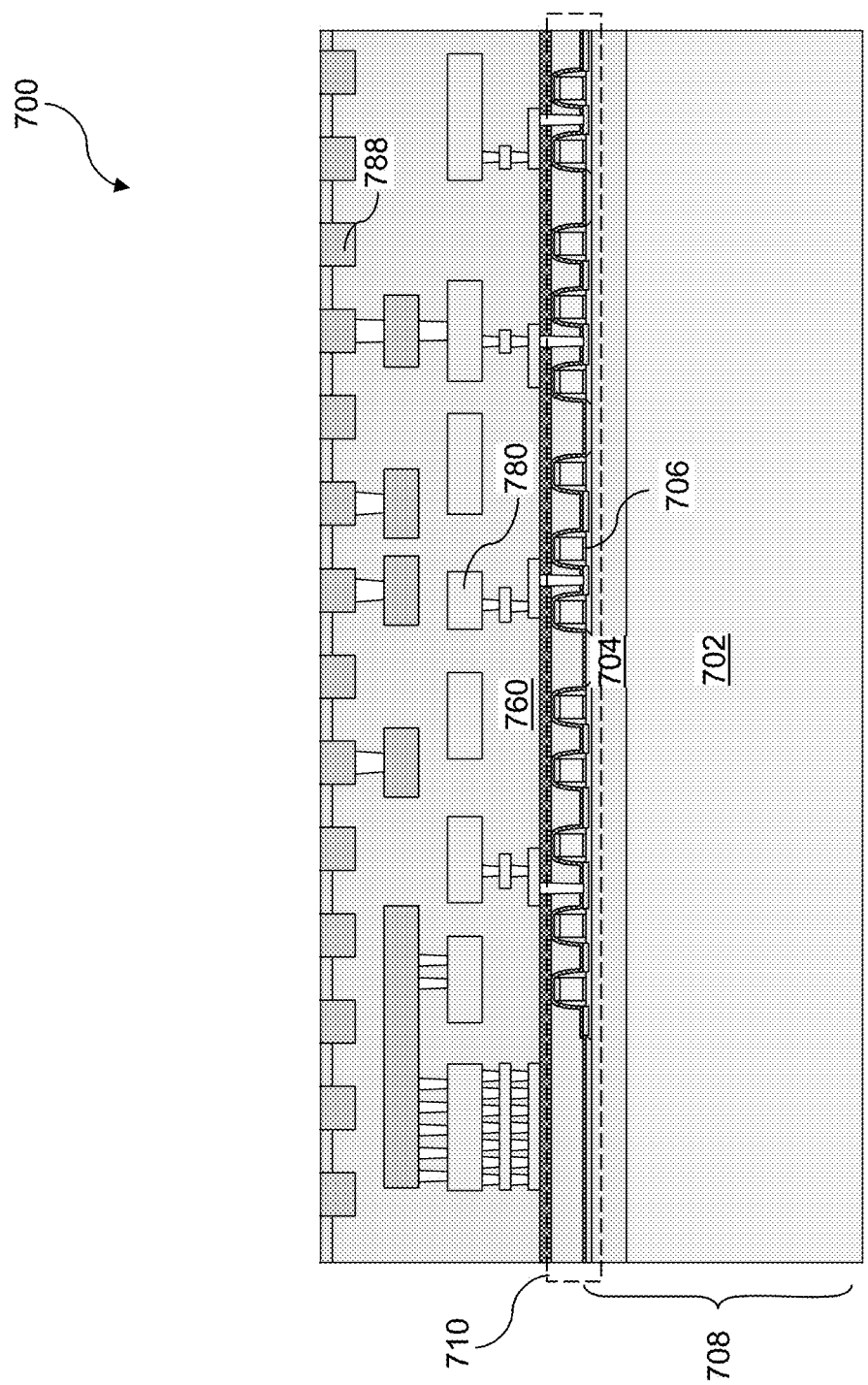
FIG. 18A is a vertical cross-sectional view of a second semiconductor die including a semiconductor-on-insulator (SOI) substrate according to the first embodiment of the present disclosure.
Figure 18B:
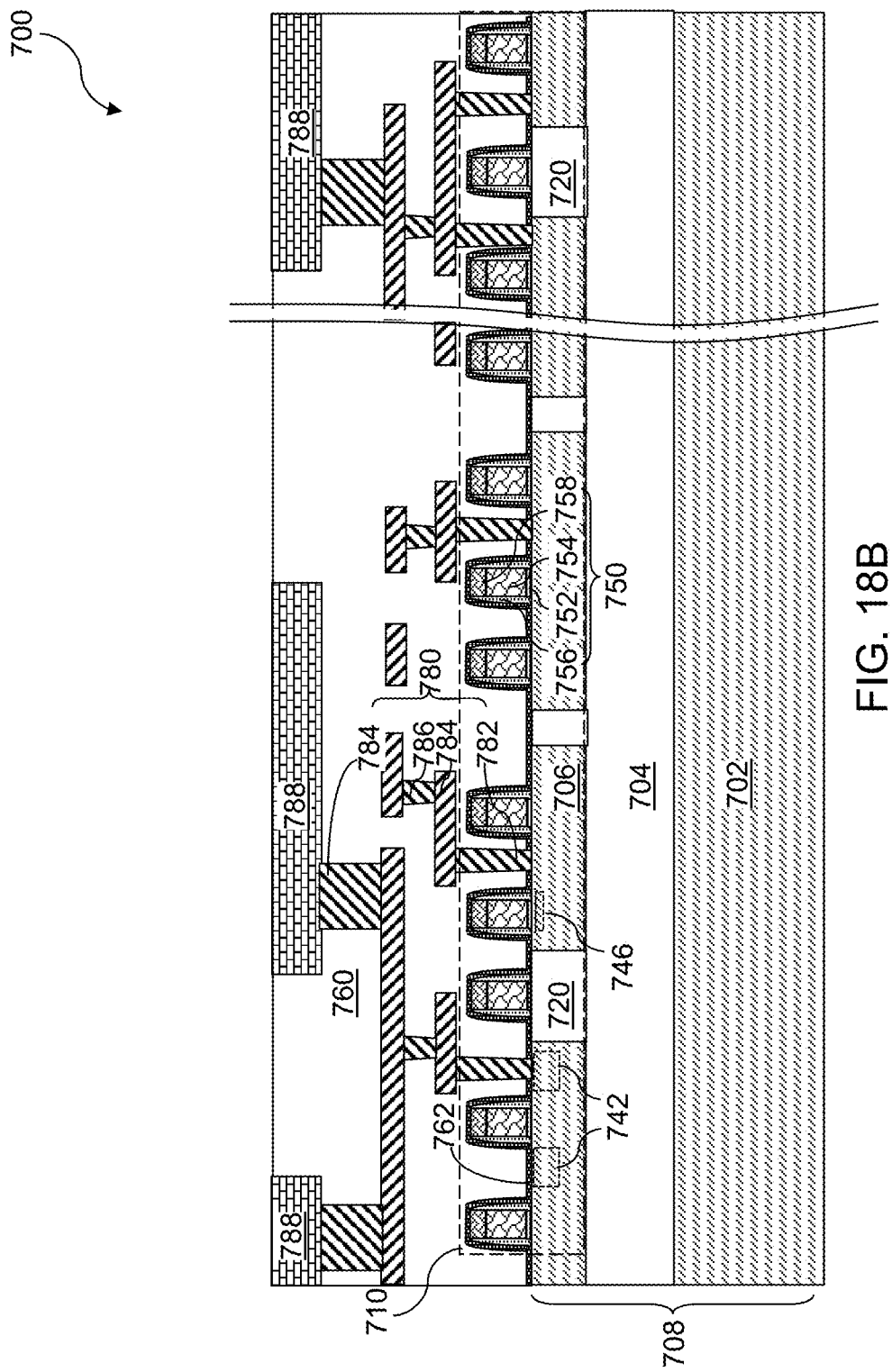
FIG. 18B is another vertical cross-sectional view of the second semiconductor die of FIG. 18A.

Referring to FIGS. 18A and 18B, schematic vertical cross-sectional views of a logic die 700 including a semiconductor-on-insulator (SOI) substrate 708 are illustrated. The SOI substrate 708 includes a layer stack of a bulk substrate layer 702, an insulating material layer 704, and a semiconductor material layer 706. In one embodiment, the logic die 700 comprises a logic die that includes a circuit containing complementary metal-oxide-semiconductor (CMOS) devices.

The bulk substrate layer 702 can include any substrate material that can be subsequently removed. In one embodiment, the bulk substrate layer 702 can include a single crystalline silicon substrate, and may have a thickness in a range from 30 microns to 1 mm, although lesser and greater thicknesses can also be used. The insulating material layer 704 of the SOI substrate 708 can include thermal silicon oxide consisting essentially of silicon atoms and oxygen atoms and free of carbon atoms. The thickness of the insulating material layer 704 can be in a range from 50 nm to 600 nm, such as from 100 nm to 300 nm, although lesser and greater thicknesses can also be used. In one embodiment, the semiconductor material layer 706 of the SOI substrate 708 can include a single crystalline silicon layer having a thickness in a range from 15 nm to 300 nm, although greater and lesser thicknesses can also be used.

The logic die 700 can include various semiconductor devices 710 formed on the semiconductor material layer 706. In one embodiment, the semiconductor devices 710 include a peripheral circuitry for operation of the three-dimensional memory arrays in the memory die 900. The peripheral circuitry may include a word line driver that drives word lines of the three-dimensional memory array (comprising the electrically conductive layers (146, 246)) within the memory die 900, a bit line driver that drives the bit lines 98 in the memory die 900, a word line decoder circuit that decodes the addresses for the electrically conductive layers (146, 246), a bit line decoder circuit that decodes the addresses for the bit lines 98, a sense amplifier circuit that senses the states of memory elements within the memory stack structures 55 in the memory die 900, a source power supply circuit that provides power to the source semiconductor layer 10 in the memory die 900, a data buffer and/or latch, or any other semiconductor circuit that may be used to operate the array of memory stack structures 55 in the memory die 900.

Shallow trench isolation structures 720 may be provided through the semiconductor material layer 706 to provide electrical isolation among the various semiconductor devices 710. The various semiconductor devices 710 may include field effect transistors, which include respective transistor active regions 742 (i.e., source regions and drain regions), a channel 746, and a gate structure 750. The field effect transistors may be arranged in a CMOS configuration. Each gate structure 750 may include, for example, a gate dielectric 752, a gate electrode 754, a dielectric gate spacer 756 and a gate cap dielectric 758. For example, the semiconductor devices 710 may include word line drivers for electrically biasing word lines of the memory die 900, which comprise the electrically conductive layers (146, 246), and source power supply field effect transistors that generate power to be supplied to the source semiconductor layer in the memory die 900

Dielectric material layers are formed over the semiconductor devices 710, which are herein referred to as support-die dielectric material layers 760. Optionally, a dielectric liner 762 (such as a silicon nitride liner) may be formed to apply mechanical stress to the various field effect transistors and/or to prevent diffusion of hydrogen or impurities from the support-die dielectric material layers 760 into the semiconductor devices 710. Support-die metal interconnect structures 780 are formed within the support-die dielectric material layers 760. The support-die metal interconnect structures 780 may include various device contact via structures 782 (e.g., source and drain electrodes which contact the respective source and drain nodes of the device or gate electrode contacts), interconnect-level metal line structures 784, interconnect-level metal via structures 786, and second bonding pads 788, which may be support-die bonding pads. The second bonding pads 788 are configured to mate with the first bonding pads 988 of a memory die 900, or to source-side bonding pads to be subsequently formed on a memory die 900, to provide electrically conductive paths between the memory die 900 and the logic die 700.

In one embodiment, the semiconductor devices 710 of the logic die 700 may include complementary metal-oxide-semiconductor (CMOS) devices. In one embodiment, the peripheral circuitry may include a peripheral circuitry configured to drive multiple memory dies 900.

Generally, a logic die 700 is provided, which includes a semiconductor-on-insulator (SOI) substrate 708, second semiconductor devices (such as the semiconductor devices 710) located on a semiconductor material layer 706 of the SOI substrate 708, second interconnect-level dielectric material layers (such as the support-die dielectric material layers 760), second metal interconnect structures (such as the support-die metal interconnect structures 780) embedded in the second interconnect-level dielectric material layers, and second bonding pads 788 located on the second interconnect-level dielectric material layers and connected to a respective node of the second semiconductor devices through a respective subset of the second metal interconnect structures.

Figure 19:
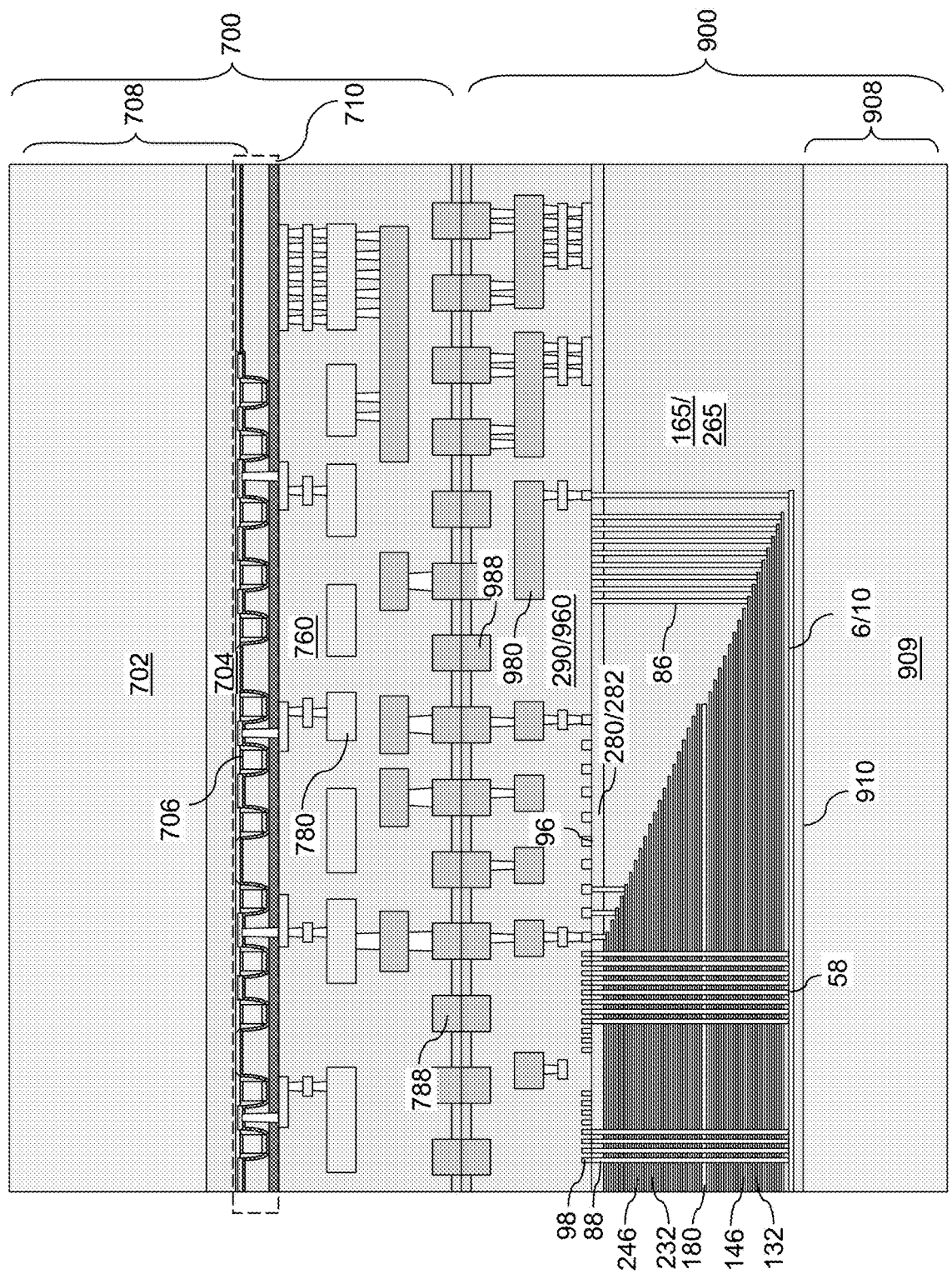
FIG. 19 is a vertical cross-sectional view of a first exemplary bonded assembly after bonding the first semiconductor die with the second semiconductor die according to the first embodiment of the present disclosure.

Referring to FIG. 19, a first exemplary bonded assembly according to an embodiment of the present disclosure is illustrated, which may be formed by bonding the first bonding pads 988 of the memory die 900 to the second bonding pads 788 of a logic die 700. Metal-to-metal bonding may be used to bond the memory die 900 to the logic die 700. The memory die 900 and the logic die 700 can be disposed such that the first bonding pads 988 contact a respective one of the second binding pads 788, and metal-to-metal bonding can be induced between contacting pairs of the second bonding pads 788 and the first bonding pads 988 by performing an anneal process at an elevated temperature. For example, copper-to-copper bonding may be used in case the first bonding pads 988 and the second bonding pads 788 include copper portions.

Figure 20:
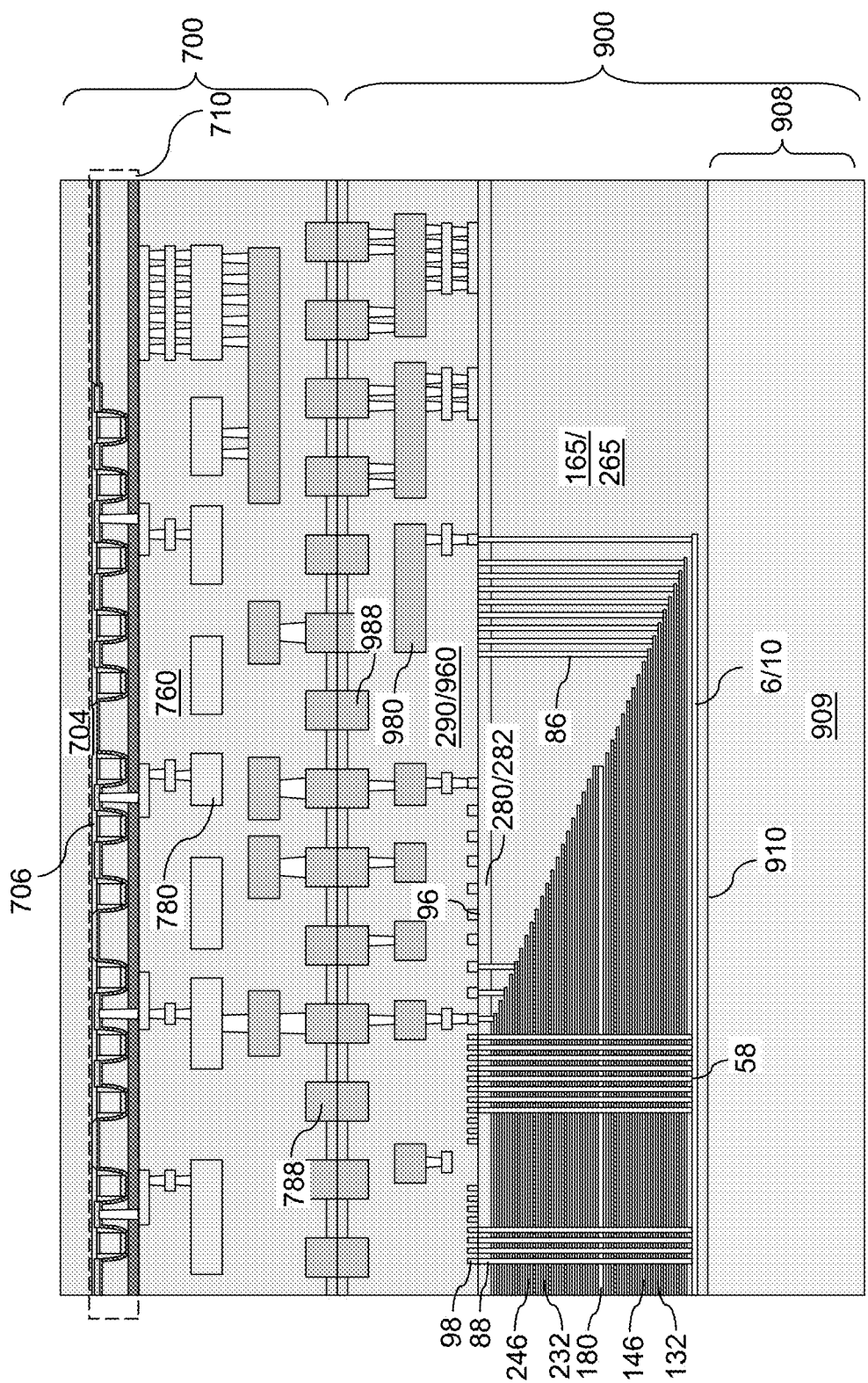
FIG. 20 is a vertical cross-sectional view of the first exemplary bonded assembly after removal of a bulk substrate layer of the SOI substrate according to the first embodiment of the present disclosure.

Referring to FIG. 20, the bulk substrate layer 702 of the SOI substrate 708 may be removed from the first exemplary bonded assembly (700, 900). At least one process selected from grinding, chemical mechanical polishing (CMP), anisotropic etch of a material of the bulk substrate layer, or isotropic etch of the material of the bulks substrate layer 702 may be used to remove the bulk substrate layer 702. In an illustrative example, a combination of a grinding process and a touch-up wet etch process may be used to remove the bulk substrate layer 702 of the SOI substrate 708. The grinding process may remove a predominant portion of the bulk substrate layer 702, and the touch-up wet etch process may apply a chemical that removes the material of the bulk substrate layer 702 selective to the material of the insulating material layer 704 of the SOI substrate 708. For example, if the bulk substrate layer 702 includes silicon, a wet etch process using a KOH solution may be used to remove the bulk substrate layer 702 selective to the material of the insulating material layer 704. The insulating material layer 704 of the SOI substrate 708 can be physically exposed upon removal of the bulk substrate layer 702.

Figure 21:
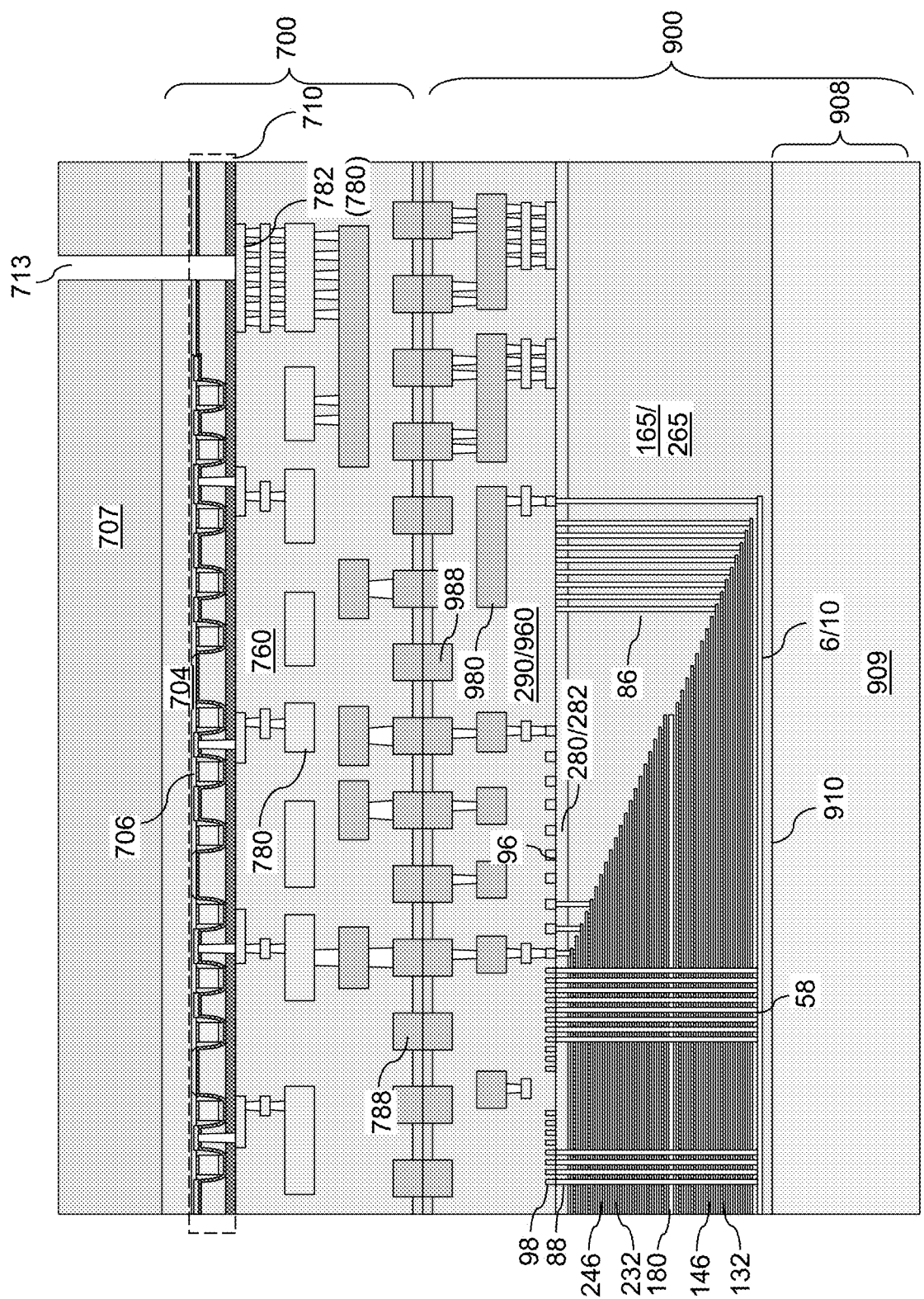
FIG. 21 is a vertical cross-sectional view of the first exemplary bonded assembly after formation of a connection via cavity according to the first embodiment of the present disclosure.

Referring to FIG. 21, a photoresist layer 707 can be applied over the insulating material layer 704, and can be lithographically patterned to form a pattern of openings therein. The openings in the photoresist layer 707 are formed in areas in which connection via cavities are to be subsequently formed. In one embodiment, the openings in the photoresist layer 707 can be formed in areas that overlie a respective one of the support-die metal interconnect structures 780 is located.

An anisotropic etch process can be performed to transfer the pattern of openings in the photoresist layer 707 through the insulating material layer 704, the semiconductor material layer 706, and a respective portion of the support-die dielectric material layers 760 located between the semiconductor material layer 706 and a respective one of the support-die metal interconnect structures 780. Connection via cavities 713 are formed through the insulating material layer 704 and the semiconductor material layer 706 of the SOI substrate 708, and through portions of the support-die dielectric material layers 760 that extend to a respective physically exposed surface of the support-die metal interconnect structures 780. In one embodiment, the second metal interconnect structures of the logic die 700 can include an etch-stop metal plate 782 embedded in the second interconnect-level dielectric material layers (such as the support-die dielectric material layers 760). A surface of the etch-stop metal pad structure 782 can be physically exposed upon formation of a connection via cavity 713. Each etch-stop metal pad structure 782 can be a component of the support-die metal interconnect structures 780. In one embodiment, the etch-stop metal pad structures 782 may include tungsten or aluminum. The photoresist layer 707 can be subsequently removed, for example, by ashing.

Figure 22:
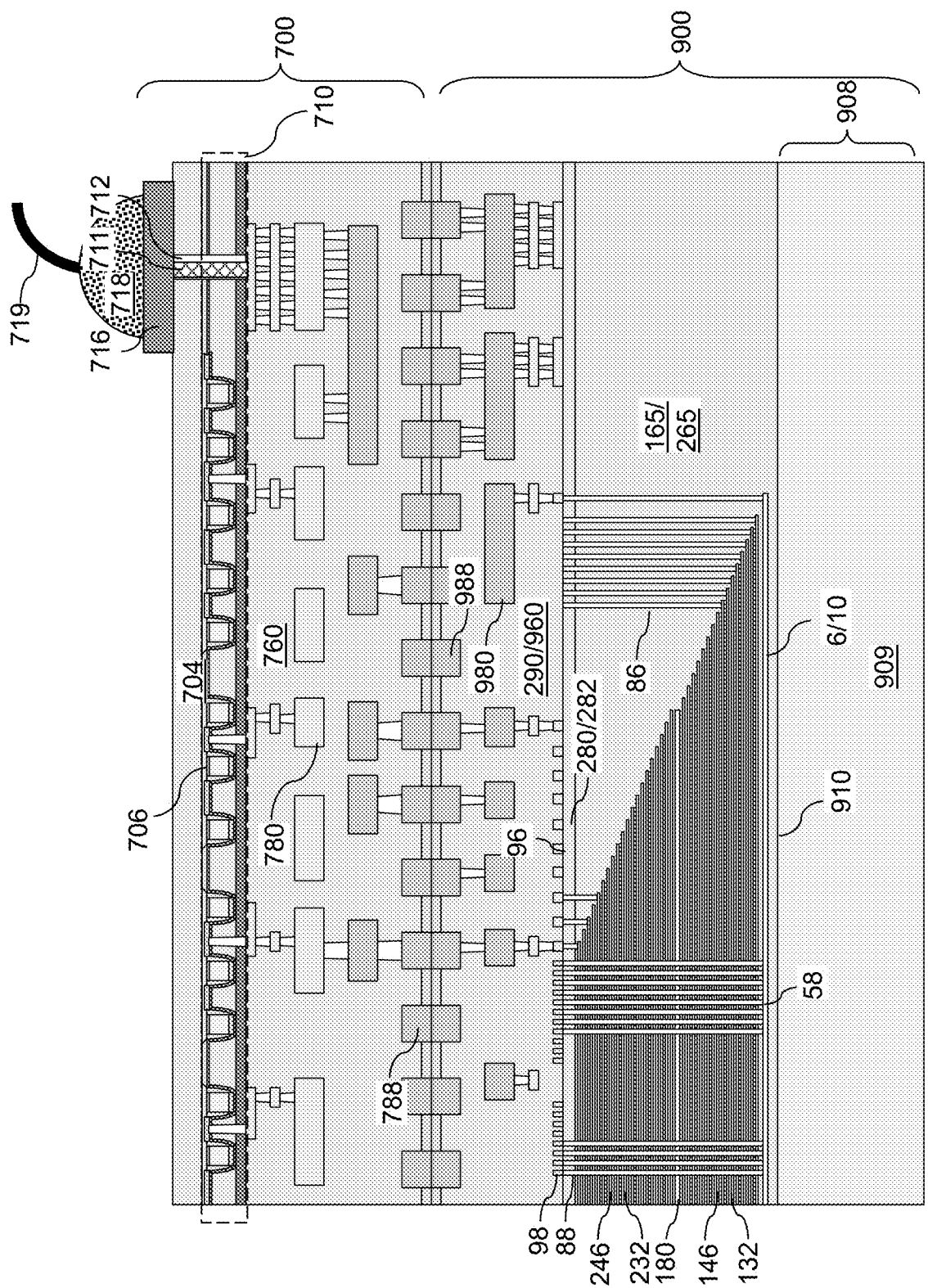
FIG. 22 is a vertical cross-sectional view of the first exemplary bonded assembly after formation of a conductive connection via structure, an external bonding pad, a solder ball, and a bonding wire according to the first embodiment of the present disclosure.

Referring to FIG. 22, a conformal insulating spacer material layer including an insulating material, such as silicon oxide, can be conformally deposited in the connection via cavities and over the insulating material layer 704. An anisotropic etch process is performed to remove horizontal portion of the conformal insulating spacer material layer from above the top surface of the insulating material layer 704 and at the bottom of each connection via cavity. Each remaining tubular portion of the conformal insulating spacer material layer in the connection via cavities constitutes a tubular insulating spacer 711. The tubular insulating spacers 711 are formed at the peripheries of the connection via cavities. At least one conductive material (such as at least one metallic material) can be deposited in the unfilled volumes of the connection via cavities. Excess portions of the at least one conductive material can be removed from above the top surface of the insulating material layer 704. Each remaining portion of the at least one conductive material in the connection via cavities constitutes a conductive connection via structure 712. The conductive connection via structures 712 extends through the insulating material layer 704, the semiconductor material layer 706, and a portion of the second interconnect-level dielectric material layers (such as the support-die dielectric material layers 760).

A bonding material can be deposited over the conductive connection via structures 712, and can be patterned into external bonding pads 716. Generally, the external bonding pads 716 are formed over the insulating material layer 704, and are electrically connected to the conductive connection via structures 712. In one embodiment, the external bonding pads 716 can be formed directly on a respective one of the conductive connection via structures 712 and directly on a surface of the insulating material layer 704. A solder ball 718 can be attached to each external bonding pad 716. A bonding wire 719 can be attached to each solder ball 718.

Figure 23:
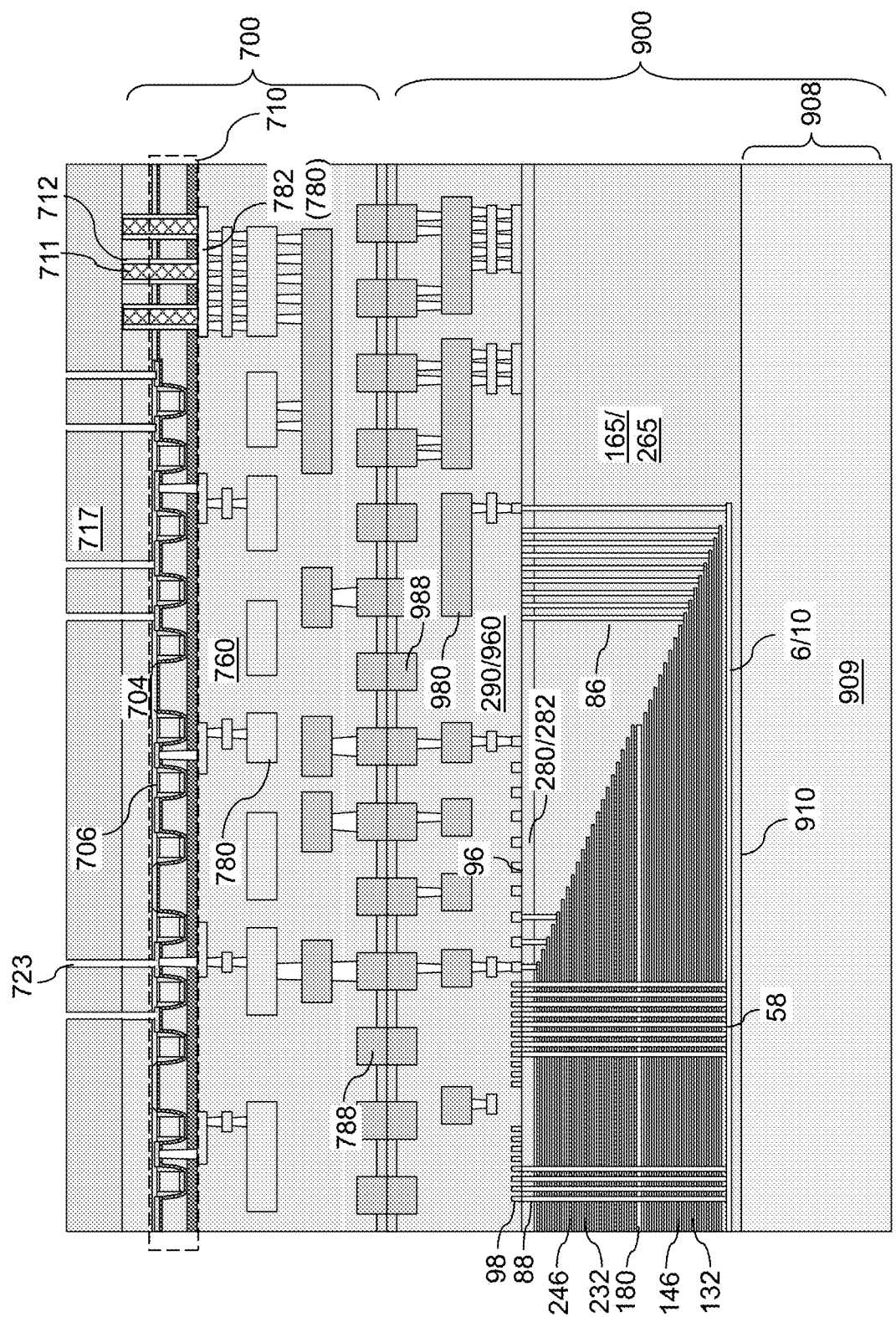
FIG. 23 is a vertical cross-sectional view of a second exemplary bonded assembly after formation of contact via cavities according to a second embodiment of the present disclosure.

Referring to FIG. 23, a second exemplary bonded assembly according to a second embodiment of the present disclosure is illustrated, which can be derived from the first exemplary bonded assembly of FIG. 21. The photoresist layer 707 can be subsequently removed. Tubular insulating spacers 711 and conductive connection via structures 712 can be formed in the same manner as in the first embodiment.

An additional photoresist layer 717 can be applied over the insulating material layer 704, and can be lithographically patterned to form various openings therethrough. The openings in the photoresist layer 717 are formed in areas in which various contact via cavities are to be subsequently formed. For example, the openings in the photoresist layer 717 can overlie a respective node of second semiconductor devices located in, or directly on, the semiconductor material layer 706.

An anisotropic etch process can be performed to transfer the pattern of the openings in the photoresist layer 717 through the insulating material layer 704 and at least partly through the semiconductor material layer 706 to form contact via cavities 723. A node of the second semiconductor devices can be physically exposed at the bottom of each contact via cavity 723. In one embodiment, the second semiconductor devices comprise complementary metal-oxide-semiconductor (CMOS) devices, and nodes of the second semiconductor devices that are physically exposed to the contact via cavities 723 comprise source regions and drain regions of the CMOS devices. The physically exposed nodes of the second semiconductor device may be located within, or directly on, the semiconductor material layer 706. The additional photoresist layer 717 can be subsequently removed, for example, by ashing.

Figure 24:
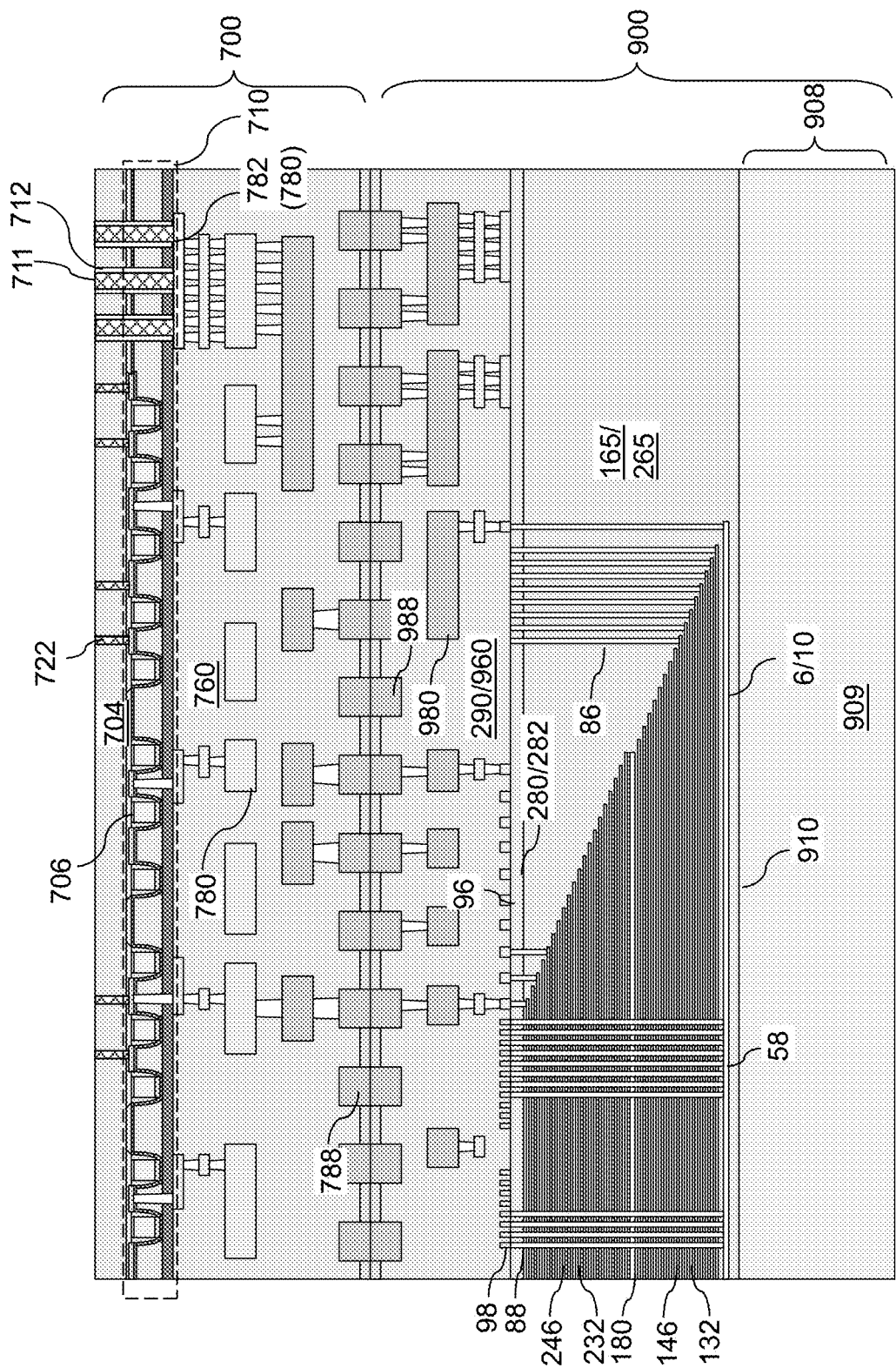
FIG. 24 is a vertical cross-sectional view of a second exemplary bonded assembly after formation contact via structures according to the second embodiment of the present disclosure.

Referring to FIG. 24, at least one conductive material can be deposited in the contact via cavities 723. Excess portions of the at least one conductive material can be removed from above the horizontal plane including a distal surface (i.e., a surface that is farther away from the semiconductor material layer 706) of the insulating material layer 704 by a planarization process. The planarization process can use a recess etch or chemical mechanical planarization. Remaining portions of the at least one conductive material in the contact via cavities 723 constitute contact via structures 722. Each contact via structure 722 is formed within a respective one of the contact via cavities 723. Each contact via structure 722 can contact a respective one of the second semiconductor devices located within the semiconductor material layer 706, and can contact a sidewall of the insulating material layer 704.

Figure 25:
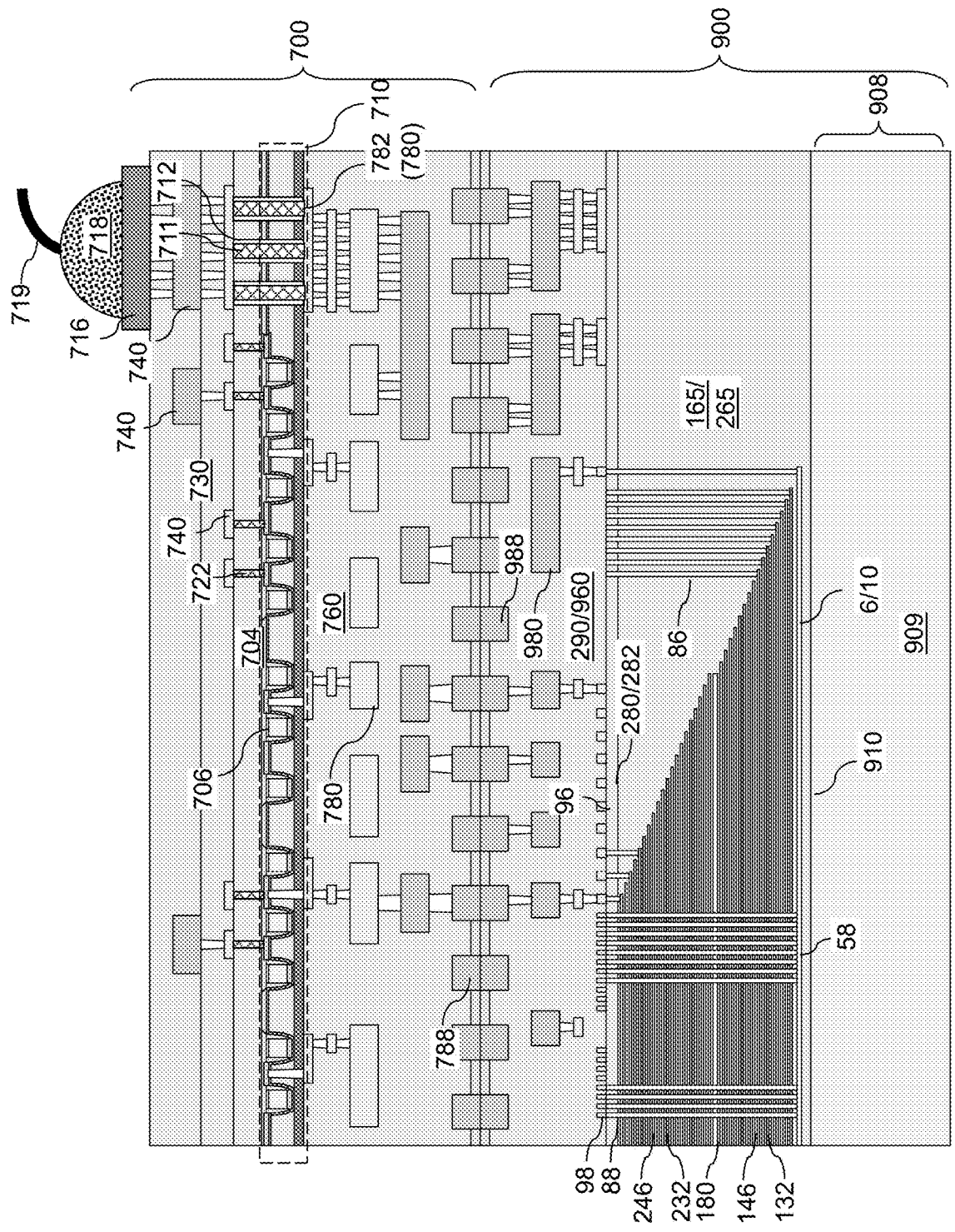
FIG. 25 is a vertical cross-sectional view of the second exemplary bonded assembly after formation at least one backside insulating layer, backside metal interconnect structures, an external bonding pad, a solder ball, and a bonding wire according to the second embodiment of the present disclosure.

Referring to FIG. 25, at least one backside insulating layer 730 and backside metal interconnect structures 740 can be formed over the insulating material layer 704, the contact via structures 722, and the conductive connection via structures 712. The at least one backside insulating layer 730 includes a single insulating layer or a plurality of insulating layers. Each of the at least one backside insulating layer 730 includes a dielectric material such as silicon oxide and/or silicon nitride. In one embodiment, the at least one backside insulating layer 730 includes a plurality of backside insulating layers. In this case, the backside metal interconnect structures 740 can comprise metal via structures and metal line structures. In one embodiment, the plurality of backside insulating layers comprise a plurality of line-level insulating layers alternating with a plurality of via-level insulating layers. The backside metal interconnect structures 740 are embedded in the at least one backside insulating layer 730. The backside metal interconnect structures 740 can be formed level by level by depositing and patterning a backside insulating layer with a line trench pattern or a via cavity pattern, forming one level of backside metal interconnect structures by depositing a conductive material in the patterned cavities in the backside insulating layer, depositing and patterning an additional backside insulating layer with a via cavity pattern or a line trench pattern, forming an additional level of backside metal interconnect structures by depositing a conductive material in the patterned cavities in the additional backside insulating layer, and so on. The backside metal interconnect structures 740 can include multiple levels of metal line structures and multiple levels of metal via structures that are vertically spaced from the semiconductor material layer 706 by different vertical separation distances. In one embodiment, the backside metal interconnect structures 740 can include at least two different levels of metal line structures and at least two levels of metal via structures.

A bonding material can be deposited over the conductive connection via structures 712, and can be patterned into external bonding pads 716. The external bonding pads 716 are formed over the insulating material layer 704, and are electrically connected to the conductive connection via structures 712 through a respective subset of the backside metal interconnect structures 740. In one embodiment, the external bonding pads 716 can be formed directly on a respective one of the backside metal interconnect structures 740 and directly on a surface of the at least one backside insulating layer 730. A solder ball 718 can be attached to each external bonding pad 716. A bonding wire 719 can be attached to each solder ball 718.

Figure 26:
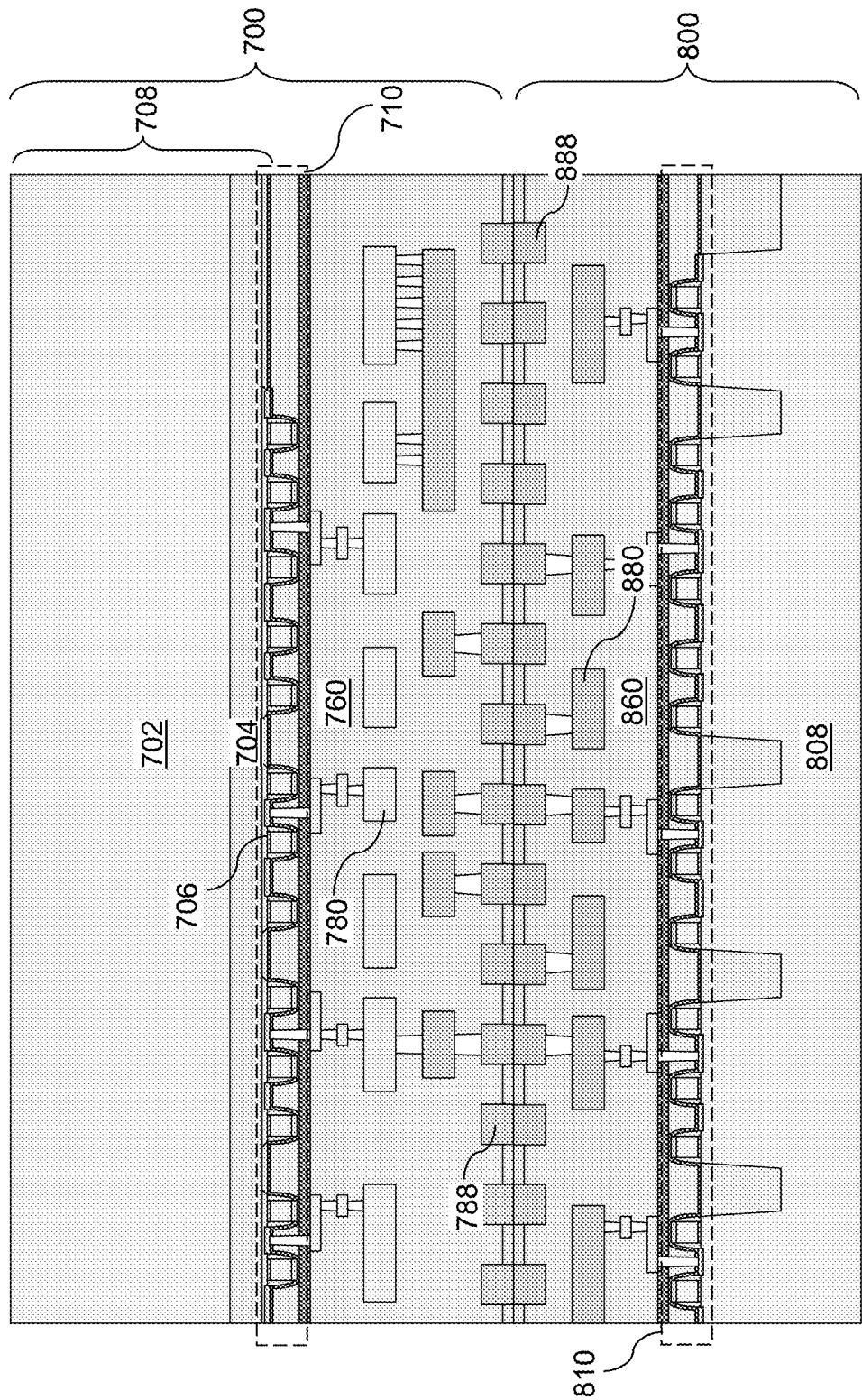
FIG. 26 is a vertical cross-sectional view of a third exemplary bonded assembly after bonding a first semiconductor die including CMOS devices and a second semiconductor die according to a third embodiment of the present disclosure.

Referring to FIG. 26, a third exemplary method of forming a bonded assembly according to a third embodiment of the present disclosure is disclosed. A first semiconductor die 800 including CMOS devices is provided, which includes a first substrate 808 that includes a semiconductor substrate, first semiconductor devices 810 located on the first substrate 808, first interconnect-level dielectric material layers 860 overlying the first semiconductor devices 810, first metal interconnect structures 880 embedded in the first interconnect-level dielectric material layers 860, and first bonding pads 888 located on the first interconnect-level dielectric material layers 860 and connected to a respective node of the first semiconductor devices 810 through a respective subset of the first metal interconnect structures 860. In one embodiment, the first semiconductor die 800 can include CMOS-based memory devices such as static random access memory (SRAM) devices. In another embodiment, the first semiconductor die 800 comprises a first logic die that includes a circuit containing complementary metal-oxide-semiconductor (CMOS) devices.

A logic die 700 can be provided, which can have the same structural components as the logic die 700 illustrated in FIGS. 18A and 18B. The functionality of the logic die 700 can be modified to provide a peripheral circuitry that supports operation of the first semiconductor devices 810 in the first semiconductor die 800.

The third exemplary bonded assembly can be formed by bonding the first bonding pads 888 of the first semiconductor die 800 to the second bonding pads 788 of a logic die 700. Metal-to-metal bonding may be used to bond the first semiconductor die 800 to the logic die 700. The first semiconductor die 800 and the logic die 700 can be disposed such that the first bonding pads 888 contact a respective one of the second binding pads 788, and metal-to-metal bonding can be induced between contacting pairs of the second bonding pads 788 and the first bonding pads 888 by performing an anneal process at an elevated temperature. For example, copper-to-copper bonding may be used in case the first bonding pads 888 and the second bonding pads 788 include copper portions.

Figure 27:
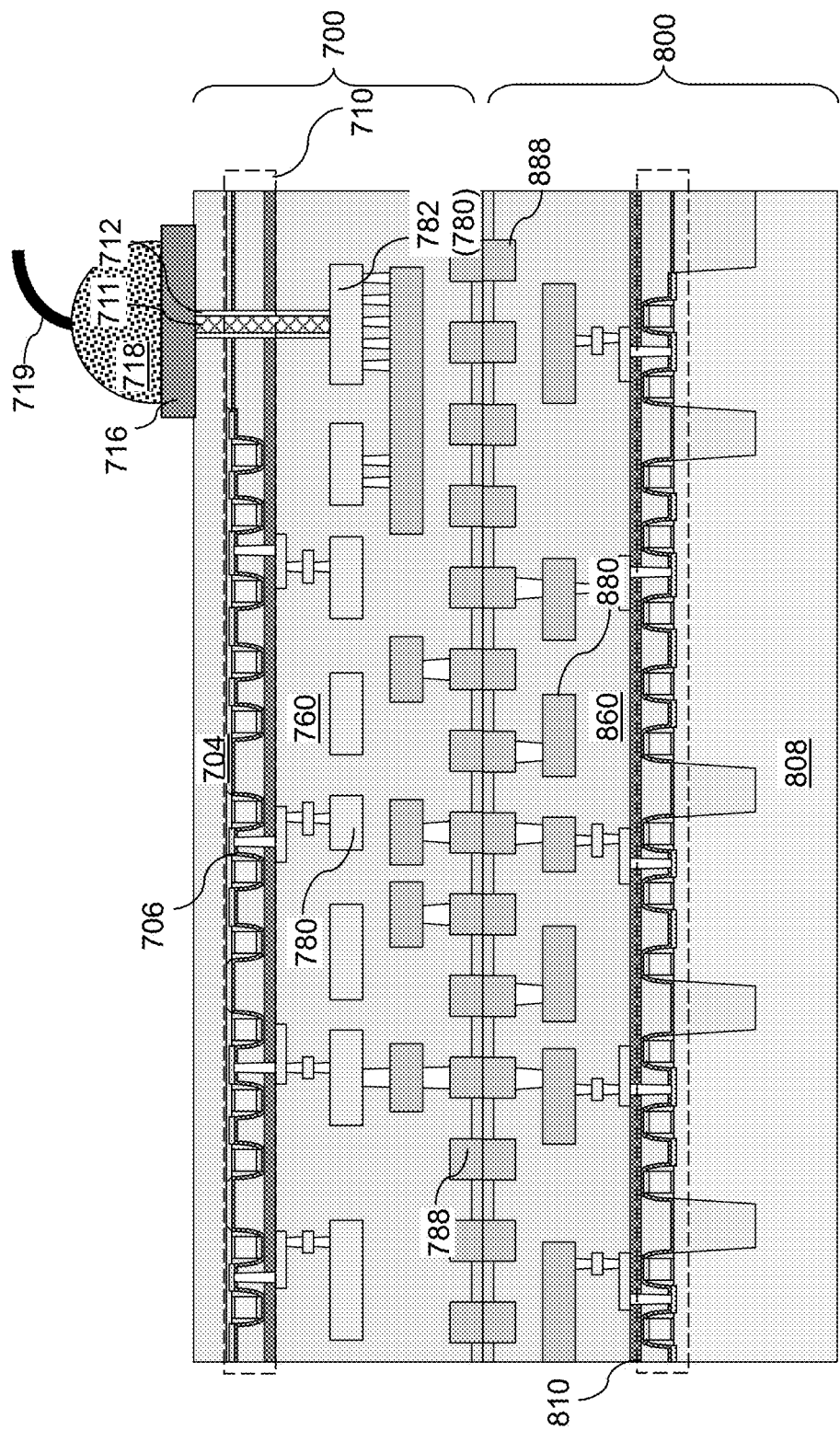
FIG. 27 is a vertical cross-sectional view of the third exemplary bonded assembly after formation of a conductive connection via structure, an external bonding pad, a solder ball, and a bonding wire according to the third embodiment of the present disclosure.

Referring to FIG. 27, the processing steps of FIG. 20 can be performed to remove the bulk substrate layer 702 and to physically expose a distal surface of the insulating material layer 704. The processing steps of FIG. 21 can be performed to form connection via cavities 713 extending to a respective one of the support-die metal interconnect structures 780. The processing steps of FIG. 22 can be subsequently performed to form tubular insulating spacers 711, conductive connection via structures 712, external bonding pads 716, solder balls 718, and bonding wires 719.

Figure 28:
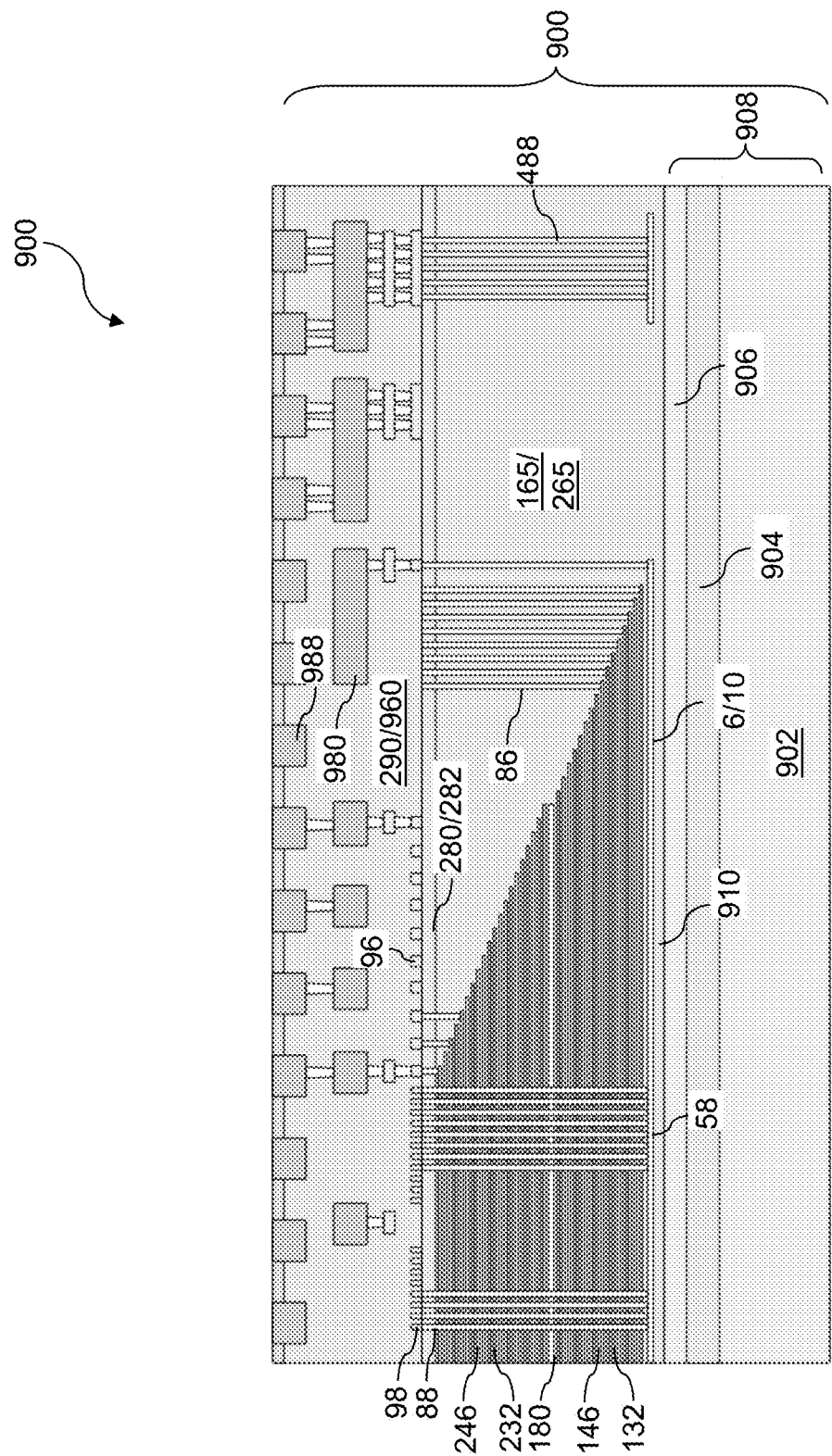
FIG. 28 is a vertical cross-sectional view of a memory die employing an SOI substrate according to a fourth embodiment of the present disclosure.

Referring to FIG. 28, a memory die 900 according to a fourth embodiment of the present disclosure is illustrated, which can be derived from the memory die 900 illustrated in FIG. 17 by employing an SOI substrate as the first substrate 908 of the memory die 900. Specifically, the first substrate 908 can include a layer stack of a bulk substrate layer (e.g., silicon wafer) 902, an insulating material layer (e.g., silicon oxide layer) 904, and a semiconductor material layer (e.g., silicon layer) 906. The source-side dielectric material layer 910 and the three-dimensional memory array of the memory die 900 can be formed over the top surface of the semiconductor material layer 906 as described above.

Figure 29:
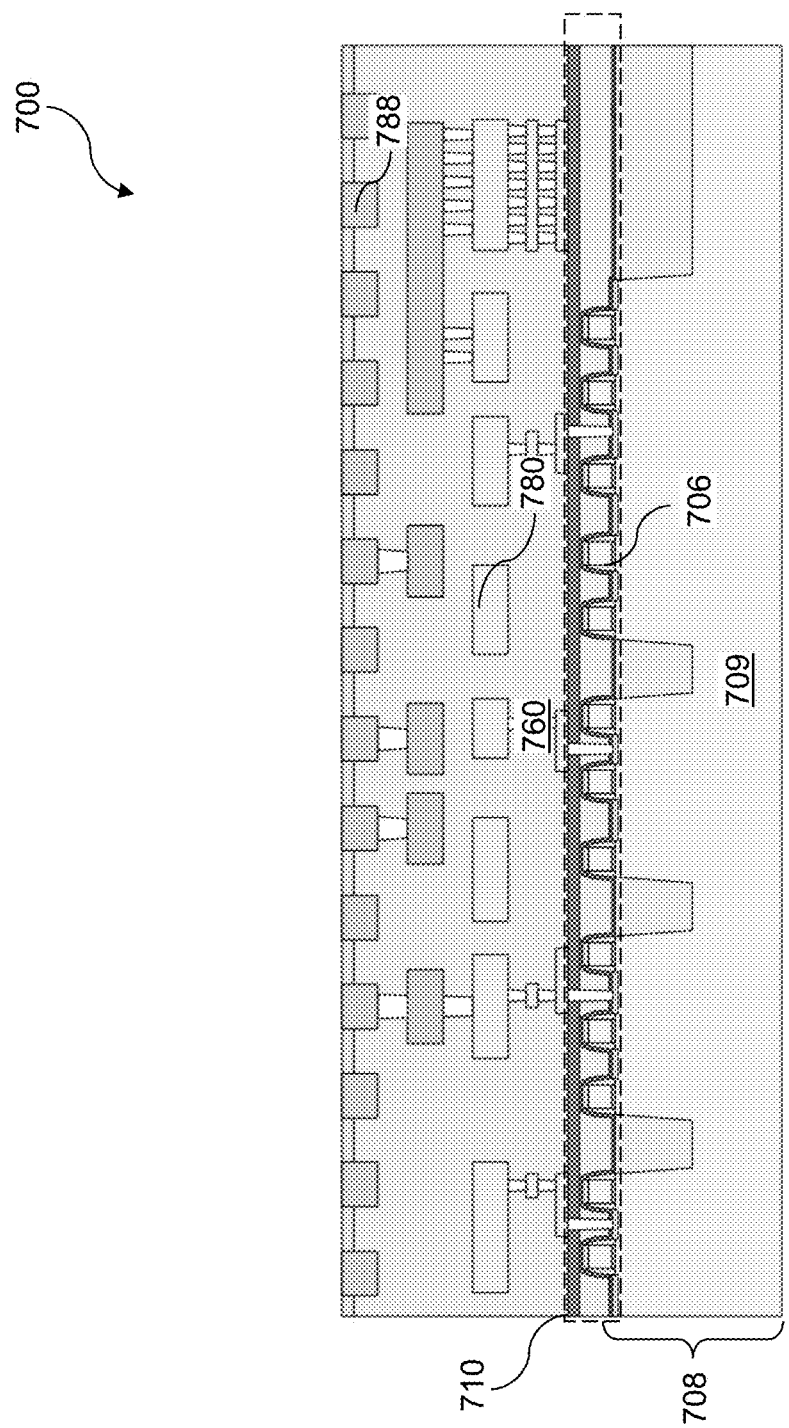
FIG. 29 is a vertical cross-sectional view of a support die employing a bulk substrate according to a fourth embodiment of the present disclosure.

Referring to FIG. 29, a logic die 700 according to the fourth embodiment of the present disclosure is illustrated, which can be derived from the logic die 700 illustrated in FIGS. 18A and 18B by employing a semiconductor substrate layer (e.g., silicon wafer) 709 in lieu of an SOI substrate including a layer stack of a bulk substrate layer 702, an insulating material layer 704, and a semiconductor material layer 706 illustrated in FIGS. 18A and 18B. The semiconductor devices 710 including the peripheral circuitry for operating the three-dimensional memory array of the memory die 900 can be formed on a top surface of the semiconductor substrate layer 709 as described above.

Figure 30:
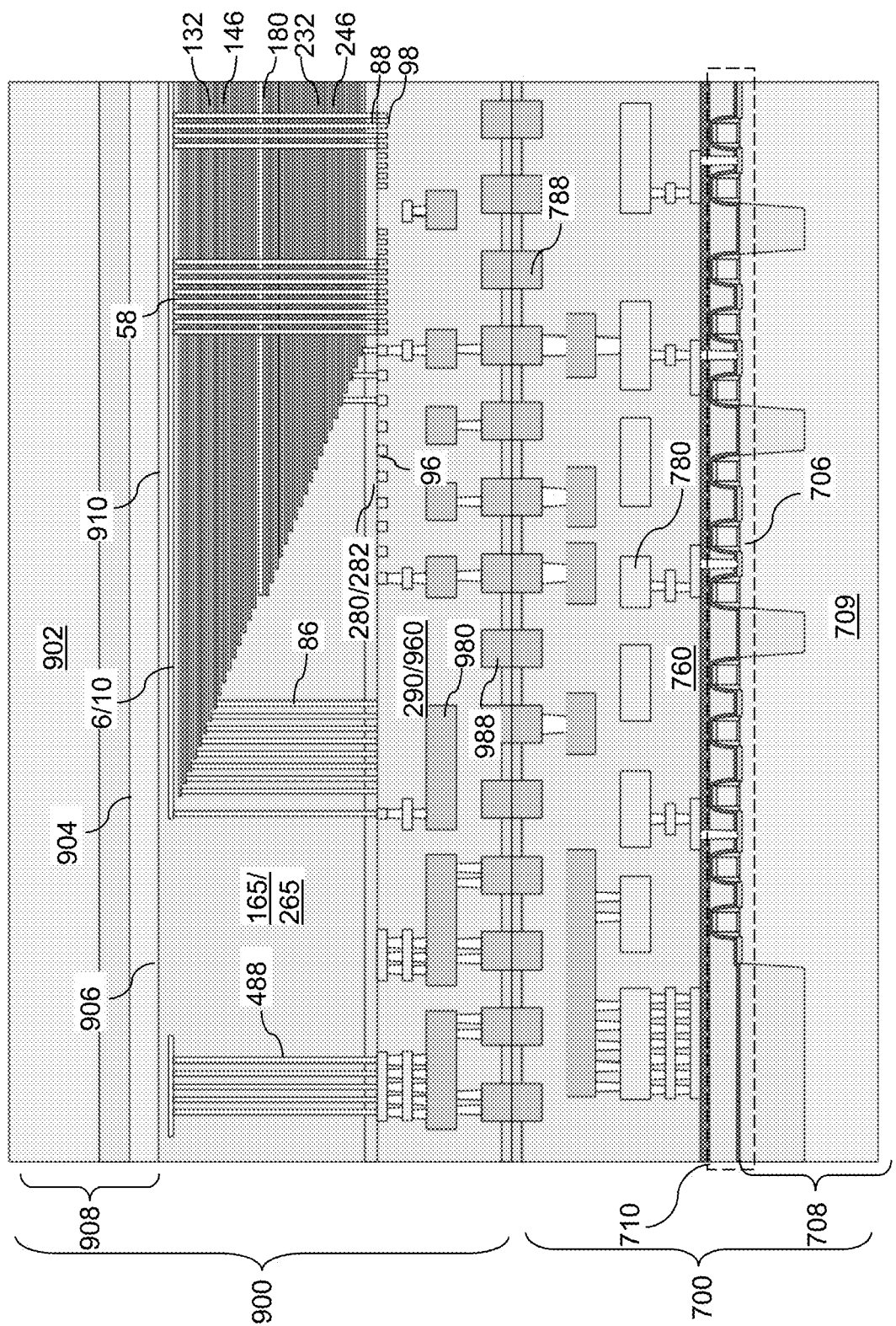
FIG. 30 is a fourth exemplary bonded assembly including the memory die of FIG. 28 and the support die of FIG. 29 according to the fourth embodiment of the present disclosure.

Referring to FIG. 30, the memory die 900 of the FIG. 28 and the logic die 700 of FIG. 29 can be bonded to each other. The first bonding pads 988 of the memory die 900 can be bonded to the second bonding pads 788 of a logic die 700. Metal-to-metal bonding may be used to bond the memory die 900 to the logic die 700. The memory die 900 and the logic die 700 can be disposed such that each of the first bonding pads 988 contacts a respective one of the second binding pads 788, and metal-to-metal bonding can be induced between contacting pairs of the second bonding pads 788 and the first bonding pads 988 by performing an anneal process at an elevated temperature. For example, copper-to-copper bonding may be used in case the first bonding pads 988 and the second bonding pads 788 include copper.

Figure 31:
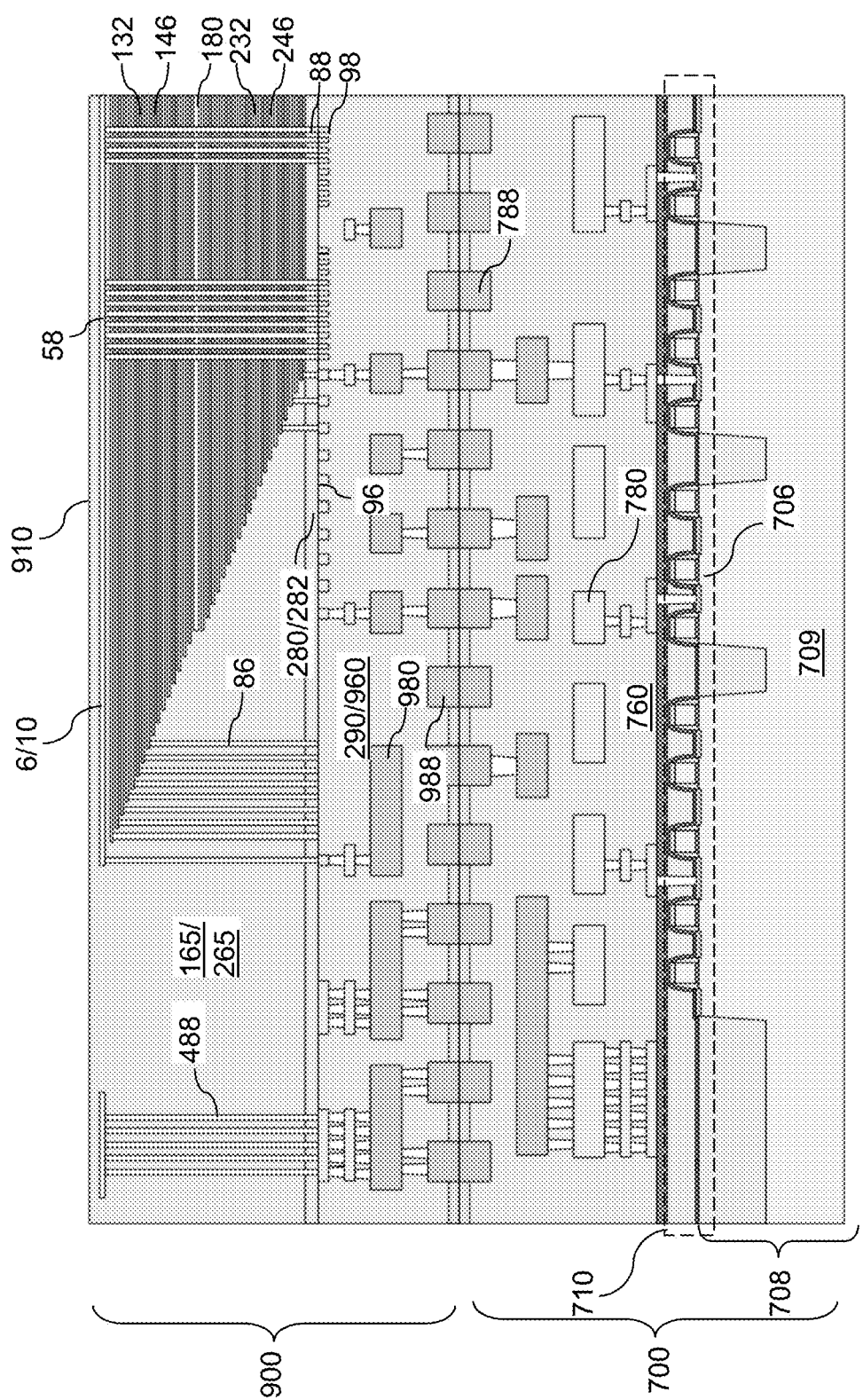
FIG. 31 is the fourth exemplary bonded assembly after removal of the SOI substrate according to the fourth embodiment of the present disclosure.

Referring to FIG. 31, the bulk substrate layer 902 of the SOI substrate 908 may be removed from the fourth exemplary bonded assembly (700, 900). At least one process selected from grinding, chemical mechanical polishing (CMP), anisotropic etch of a material of the bulk substrate layer, or isotropic etch of the material of the bulks substrate layer 902 may be used to remove the bulk substrate layer 902. In an illustrative example, a combination of a grinding process and a touch-up CMP process may be used to remove the bulk substrate layer 902 of the SOI substrate 908. The grinding process may remove a predominant portion of the bulk substrate layer 902, and the touch-up CMP process may remove the remaining material of the bulk substrate layer 902 using the insulating material layer 904 as a polish stop.

Subsequently, the insulating material layer 904 of the SOI substrate 908 can be removed selective to the semiconductor material layer 906. For example, if the semiconductor material layer 906 includes silicon and if the insulating material layer 904 includes silicon oxide, the insulating material layer 904 can be removed by a wet etch employing hydrofluoric acid. The semiconductor material layer 906 can be subsequently removed selective to the source-side dielectric material layer 910. For example, if the semiconductor material layer 906 includes silicon, the semiconductor material layer 906 can be removed by a wet etch employing a KOH solution.

Figure 32:
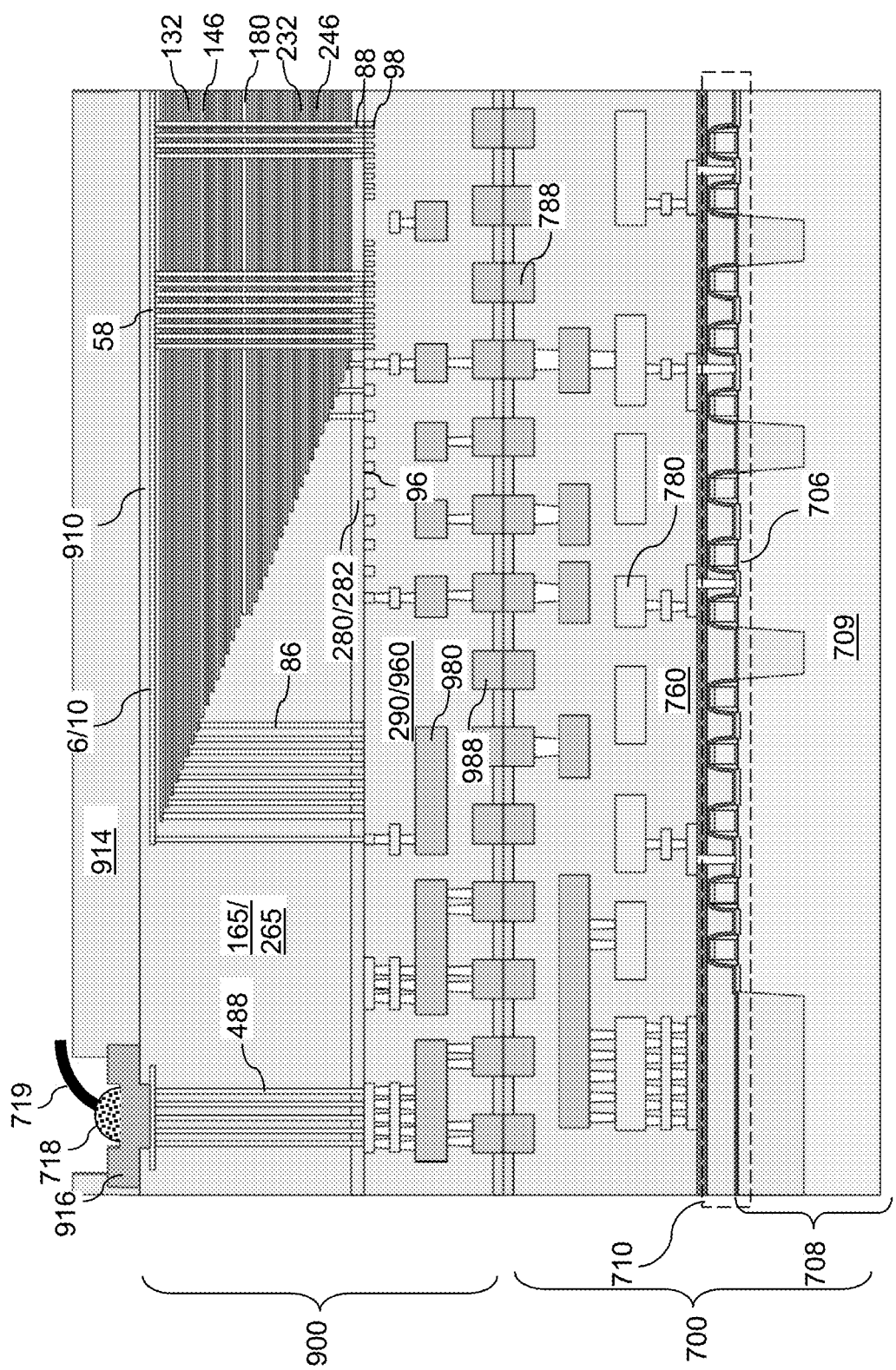
FIG. 32 is the fourth exemplary bonded assembly after formation of external bonding pads according to the fourth embodiment of the present disclosure.

Referring to FIG. 32, an optional dielectric cover material layer 914 can be formed over the source-side dielectric material layer 910. One or more via cavities can be formed through the source-side dielectric material layer 910 and the dielectric cover material layer 914. Surfaces of the through-memory-level via structures 488 and/or surfaces of the optional metallic plate layer 6 and/or the source semiconductor layer 10 can be physically exposed at the bottom of the via cavities. A conductive material is deposited in the via cavities and over the source-side dielectric material layer 910 and the dielectric cover material layer 914, and is patterned to form external bonding pads 916. A solder ball 718 can be attached to each external bonding pad 916. A bonding wire 719 can be attached to each solder ball 718.

Referring to all embodiments of the present disclosure, a first semiconductor die (700, 800, or 900) can be formed on a bulk substrate, and a second semiconductor die (900 or 700) can be formed on an SOI substrate. An external bonding pad (716, 916) can be electrically connected to a node of second semiconductor devices on an insulating surface of a remaining portion of the second semiconductor die (900 or 700) after removal of at least the bulk substrate layer (702 or 902). The external bonding pad (716, 916) is spaced from an interface between the first semiconductor die (700, 800, or 900) and the remaining portion of the second semiconductor die (900 or 700) after removal of at least the bulk substrate layer (702 or 902) by the second semiconductor devices.

In the fourth exemplary structure, the second semiconductor die comprises a memory die 900 including a three-dimensional array of memory elements and the first semiconductor die (i.e., a logic die 700) contains peripheral circuitry configured to control the three-dimensional array of memory elements. The peripheral circuitry contains complementary metal-oxide-semiconductor (CMOS) devices. In this embodiment, the insulating material layer 904 and the semiconductor material layer 906 of the SOI substrate of the second semiconductor die 900 can be removed, and the external bonding pad 916 can be formed on a dielectric material layer (such as the source-side dielectric material layer 910 and/or a dielectric cover material layer 914) that is physically exposed after removal of the semiconductor material layer.

Referring again to all drawings and according to various embodiments of the present disclosure, a bonded assembly is provided, which comprises: a first semiconductor die (900 or 800) including a first substrate (908 or 808), first semiconductor devices, first interconnect-level dielectric material layers (960 or 860), first metal interconnect structures (980 or 880) embedded in the first interconnect-level dielectric material layers (960 or 860), and first bonding pads (988 or 888) located on the first interconnect-level dielectric material layers (960 or 860) and connected to a respective node of the first semiconductor devices through a respective subset of the first metal interconnect structures (980 or 880); a second semiconductor die 700 including second semiconductor devices 710 located on a first side of a semiconductor material layer 706, an insulating material layer 704 located on a second side of the semiconductor material layer 706, second interconnect-level dielectric material layers 760 located on a first side of the second semiconductor devices, second metal interconnect structures 780 embedded in the second interconnect-level dielectric material layers 760, and second bonding pads 788 located on the second interconnect-level dielectric material layers 760, connected to a respective node of the second semiconductor devices through a respective subset of the second metal interconnect structures 780, and bonded to a respective one of the first bonding pads (988 or 888); a conductive connection via structure 712 extending through the insulating material layer 704, the semiconductor material layer 706, and a portion of the second interconnect-level dielectric material layers 760 and contacting an etch-stop metal plate 782 embedded in the second interconnect-level dielectric material layers 760; and an external bonding pad 716 electrically connected to the conductive connection via structure 712 and located over the insulating material layer 704.

In one embodiment, the bonded assembly comprises: at least one backside insulating layer 730 located on a second side of the insulating material layer 704; and backside metal interconnect structures 740 embedded in the at least one backside insulating layer 730, wherein the external bonding pad 716 is connected to the etch-stop metal plate 782 through a subset of the backside metal interconnect structures 740.

In one embodiment, the insulating material layer 704 comprises thermal silicon oxide consisting essentially of silicon atoms and oxygen atoms and free of carbon atoms; and the semiconductor material layer 706 comprises a single crystalline silicon layer having a thickness in a range from 15 nm to 300 nm. As used herein, thermal silicon oxide refers to silicon oxide formed by thermal oxidation of a material consisting essentially of silicon. The at least one backside insulating layer 730 can include silicon oxide deposited by a chemical vapor deposition process in which a silicon oxide precursor such as tetraethylorthosilicate (TEOS) is decomposed. As such, the at least one backside insulating layer 730 can include silicon oxide materials containing carbon at an atomic concentration in a range from 2 parts per million to 500 parts per million, such as from 10 parts per million to 100 parts per million. Further, the silicon oxide materials of the at least one backside insulating layer 730 can include hydrogen at an atomic concentration in a range from 2 parts per million to 500 parts per million, such as from 10 parts per million to 100 parts per million.

In one embodiment, the bonded assembly can comprise contact via structures 722 vertically extending through the insulating material layer 704 and contacting a respective node of the second semiconductor devices located within the semiconductor material layer 706, wherein the contact via structures 722 contact sidewalls of the insulating material layer 704.

In one embodiment, the memory die 900 comprises a memory die including: an alternating stack of insulating layers (132, 232) and electrically conductive layers (146, 246) that extend parallel to an interface between the memory die 900 and the second semiconductor die 700; memory stack structures 55 vertically extending through the alternating stack {(132, 146), (232, 246)}, wherein each of the memory stack structures 55 comprises a respective vertical stack of memory elements and a respective vertical semiconductor channel 60; drain regions 63 connected to a first end of a respective one of the vertical semiconductor channels 60; and a source region (such as a source semiconductor layer 10) connected to a second end of the vertical semiconductor channels 60.

Use of an SOI substrate for a second semiconductor die 700 allows removal of the bulk substrate layer 702 selective to an insulating material layer 704 of the SOI substrate. Further, the insulating material layer 704 functions as an electrical isolation layer for providing electrical isolation for the external bonding pads 716 and the contact via structures 712. Thus, deposition of an insulating material layer on the backside of a thinned substrate is not necessary after thinning of the SOI substrate of the present disclosure. The various methods and structures of the present disclosure provide cost-effective ways for bonding two semiconductor dies.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A bonded assembly, comprising:
a first semiconductor die including a first substrate, first semiconductor devices, first interconnect-level dielectric material layers, first metal interconnect structures embedded in the first interconnect-level dielectric material layers, and first bonding pads located on the first interconnect-level dielectric material layers and connected to a respective node of the first semiconductor devices through a respective subset of the first metal interconnect structures;
a second semiconductor die including second semiconductor devices located on a first side of a semiconductor material layer, an insulating material layer located on a second side of the semiconductor material layer, second interconnect-level dielectric material layers located on a first side of the second semiconductor devices, second metal interconnect structures embedded in the second interconnect-level dielectric material layers, and second bonding pads located on the second interconnect-level dielectric material layers, connected to a respective node of the second semiconductor devices through a respective subset of the second metal interconnect structures, and bonded to a respective one of the first bonding pads;
a conductive connection via structure extending through the insulating material layer, the semiconductor material layer, and a portion of the second interconnect-level dielectric material layers and contacting an etch-stop metal plate embedded in the second interconnect-level dielectric material layers; and
an external bonding pad electrically connected to the conductive connection via structure and located over the insulating material layer.

2. The bonded assembly of claim 1, further comprising:
at least one backside insulating layer located on a second side of the insulating material layer; and
backside metal interconnect structures embedded in the at least one backside insulating layer, wherein the external bonding pad is connected to the etch-stop metal plate through a subset of the backside metal interconnect structures.

3. The bonded assembly of claim 2, wherein:
the insulating material layer comprises thermal silicon oxide consisting essentially of silicon atoms and oxygen atoms and free of carbon atoms; and
the semiconductor material layer comprises a single crystalline silicon layer having a thickness in a range from 15 nm to 300 nm.

4. The bonded assembly of claim 1, further comprising contact via structures vertically extending through the insulating material layer and contacting a respective node of the second semiconductor devices located within the semiconductor material layer, wherein the contact via structures contact sidewalls of the insulating material layer.

5. The bonded assembly of claim 1, wherein the first semiconductor die comprises a memory die including:
an alternating stack of insulating layers and electrically conductive layers that extend parallel to an interface between the first semiconductor die and the second semiconductor die;
memory stack structures vertically extending through the alternating stack, wherein each of the memory stack structures comprises a respective vertical stack of memory elements and a respective vertical semiconductor channel;
drain regions connected to a first end of a respective one of the vertical semiconductor channels; and
a source region connected to a second end of the vertical semiconductor channels.

* * * * *